US012658272B2

(12) United States Patent
Erbagci et al.

(10) Patent No.: US 12,658,272 B2
(45) Date of Patent: Jun. 16, 2026

(54) PARALLEL OPERATIONS IN COMPUTE SYSTEMS

(71) Applicant: OpenAI Opco, LLC, San Francisco, CA (US)

(72) Inventors: Burak Erbagci, San Jose, CA (US); Cagla Cakir, San Francisco, CA (US); Alexander Almela Conklin, San Jose, CA (US); Tracey DellaRova, Wake Forest, NC (US); Jean-Didier Allegrucci, Sunnyvale, CA (US)

(73) Assignee: OpenAI Opco, LLC, San Francisco, CA (US)

( * ) Notice: Subject to any disclaimer, the term of this patent is extended or adjusted under 35 U.S.C. 154(b) by 0 days.

(21) Appl. No.: 19/397,790

(22) Filed: Nov. 21, 2025

(65) Prior Publication Data

US 2026/0148791 A1     May 28, 2026

Related U.S. Application Data

(60) Provisional application No. 63/724,165, filed on Nov. 22, 2024, provisional application No. 63/724,167, filed on Nov. 22, 2024.

(51) Int. Cl.
| | |
|---|---|
| *G11C 29/32* | (2006.01) |
| *G11C 16/32* | (2006.01) |
| *G11C 29/12* | (2006.01) |
| *G11C 29/18* | (2006.01) |

(52) U.S. Cl.
CPC .............. *G11C 29/32* (2013.01); *G11C 16/32* (2013.01); *G11C 29/1201* (2013.01); *G11C 2029/1802* (2013.01)

(58) Field of Classification Search
CPC ..... G11C 29/32; G11C 16/32; G11C 29/1201; G11C 2029/1802
USPC ......................................................... 365/201
See application file for complete search history.

(56) References Cited

U.S. PATENT DOCUMENTS

| | | | |
|---|---|---|---|
| 10,636,481 B1* | 4/2020 | Chang ................... | G11C 11/419 |
| 2019/0102170 A1* | 4/2019 | Chen ........................ | G11C 7/16 |
| 2025/0349349 A1* | 11/2025 | Lin ........................ | G11C 11/412 |

* cited by examiner

*Primary Examiner* — Connie C Yoha
(74) *Attorney, Agent, or Firm* — Finnegan, Henderson, Farabow, Garrett & Dunner, LLP

(57) ABSTRACT

The disclosure is related to systems, apparatuses, devices, and methods for parallel operations in computing systems that may be useful for heavy AI training and inference workloads. The disclosed technology provides arrangements for efficient computation. In some implementations, a compute-in-memory (CIM) device or macro is configured to perform vector matrix multiplication (VMM) operations between a vector of activation values and a matrix of weight values. A column cell in the CIM macro has bitcells are configured to store weight values and other bitcells are configured to store weight values that are different from the first weight valuse. The CIM macro is further configured to perform, in parallel, read/write operations to the first set of bitcells and the VMM operation in the second set of bitcells based on a weight select signal.

20 Claims, 64 Drawing Sheets

100

FP22 Output (32,1)

220

3880

500

Figure 14:
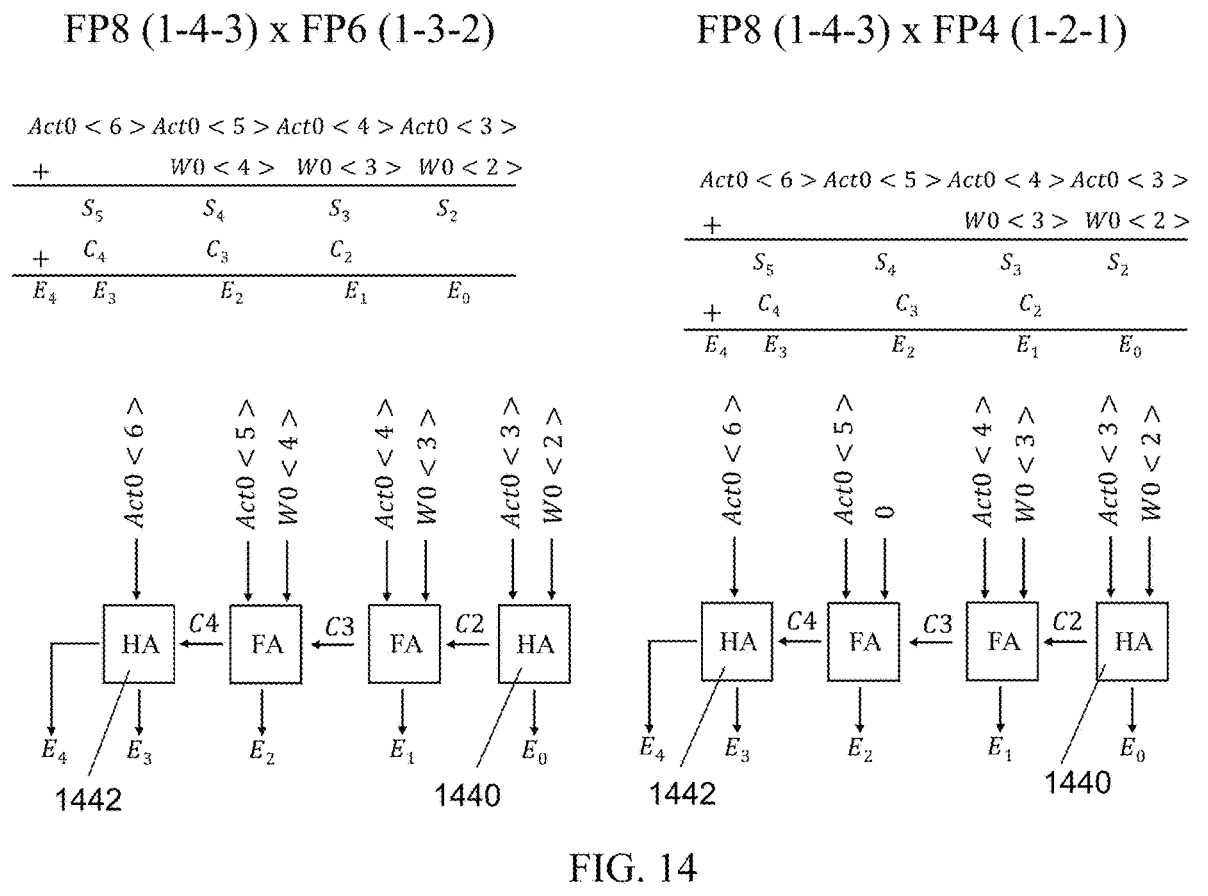

FP8 (1-4-3) x FP6 (1-3-2)          FP8 (1-4-3) x FP4 (1-2-1)

$Act0 < 6 > Act0 < 5 > Act0 < 4 > Act0 < 3 >$ $+$          $W0 < 4 >$   $W0 < 3 >$   $W0 < 2 >$ $S_5$          $S_4$          $S_3$          $S_2$ $+$ $C_4$          $C_3$          $C_2$ $E_4$   $E_3$          $E_2$          $E_1$          $E_0$ $Act0 < 6 > Act0 < 5 > Act0 < 4 > Act0 < 3 >$ $+$          $W0 < 3 >$   $W0 < 2 >$ $S_5$          $S_4$          $S_3$          $S_2$ $+$ $C_4$          $C_3$          $C_2$ $E_4$   $E_3$          $E_2$          $E_1$          $E_0$ 1442    1440    1442    1440

FP8 (1-4-3) x FP4 (1-2-1)
FP8 (1-4-3) x FP6 (1-3-2)
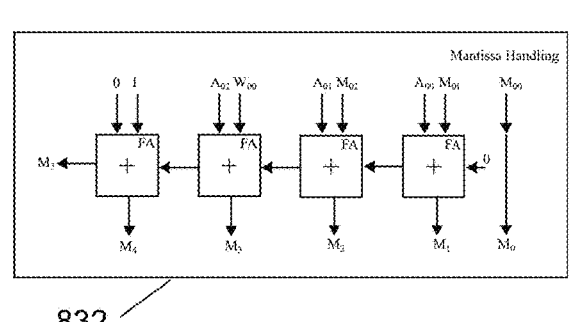
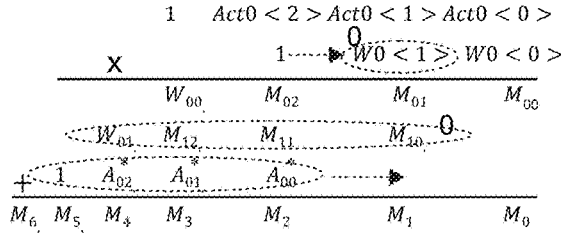
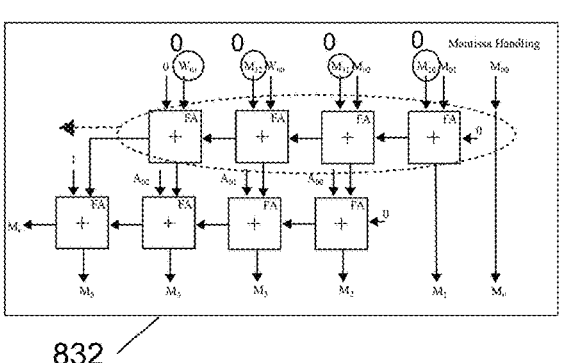
FIG. 18

FP6 (1-3-2) x FP6 (1-3-2)
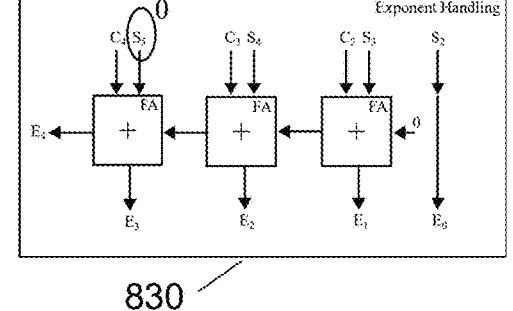
FP6(1-3-2) x FP4 (1-2-1)
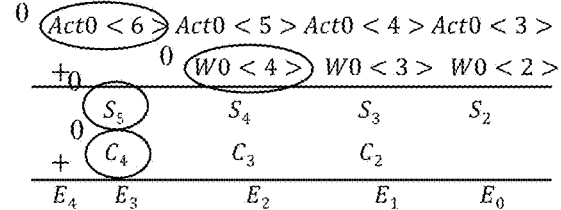
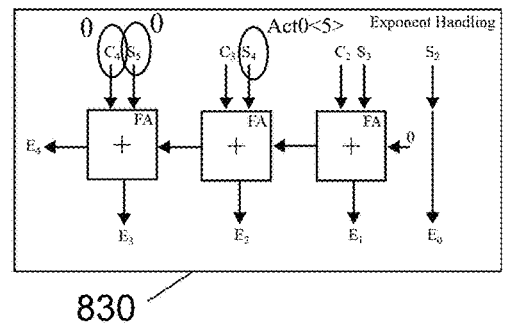
FIG. 20

Figure 21:
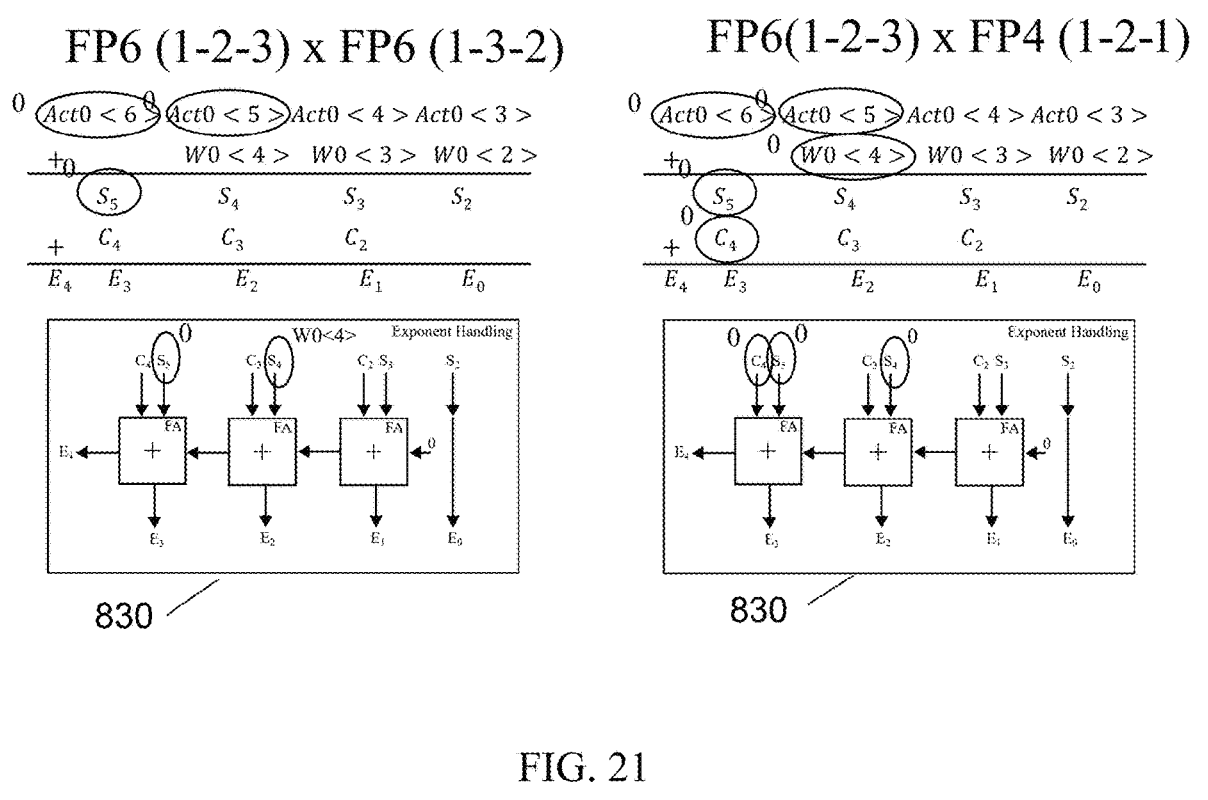

FP6 (1-2-3) x FP6 (1-3-2)

$0$ $Act0 < 6 >$ $0$ $Act0 < 5 >$ $Act0 < 4 >$ $Act0 < 3 >$ $+0$ $W0 < 4 >$ $W0 < 3 >$ $W0 < 2 >$ $+$ $S_5$ $S_4$ $S_3$ $S_2$ $+$ $C_4$ $C_3$ $C_2$ $E_4$ $E_3$ $E_2$ $E_1$ $E_0$

830

FP6(1-2-3) x FP4 (1-2-1)

$0$ $Act0 < 6 >$ $0$ $Act0 < 5 >$ $Act0 < 4 >$ $Act0 < 3 >$ $+0$ $0$ $W0 < 4 >$ $W0 < 3 >$ $W0 < 2 >$ $+$ $0$ $S_5$ $S_4$ $S_3$ $S_2$ $+$ $C_4$ $C_3$ $C_2$ $E_4$ $E_3$ $E_2$ $E_1$ $E_0$

FP4 (1-2-1) x FP6 (1-3-2)
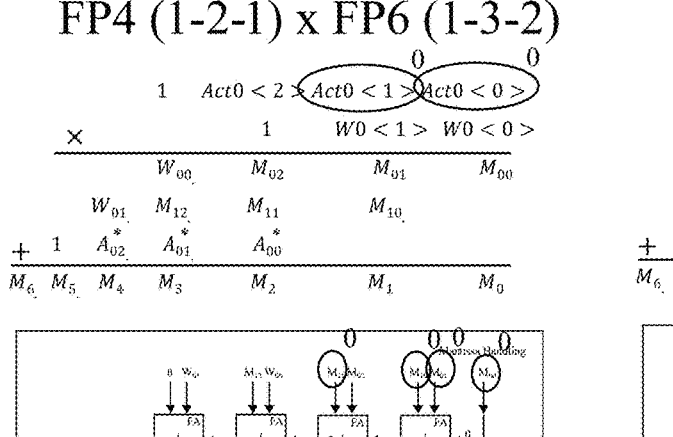
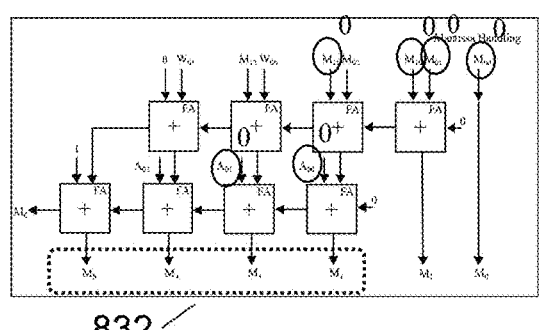
832
FP4(1-2-1) x FP4 (1-2-1)
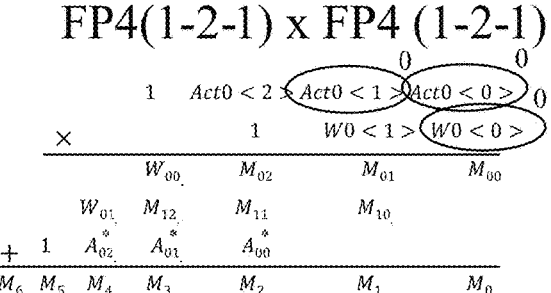
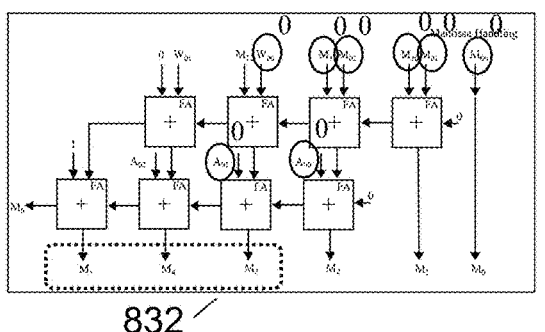
832
FIG. 25

220

220

220

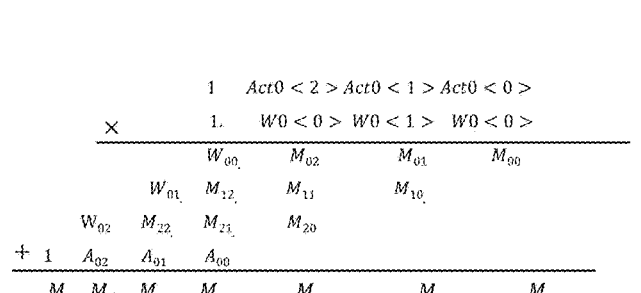
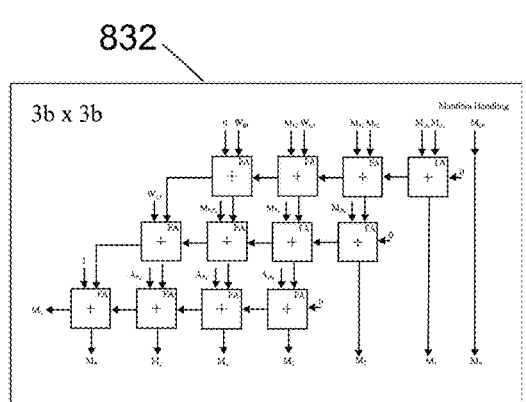
FIG. 30

832
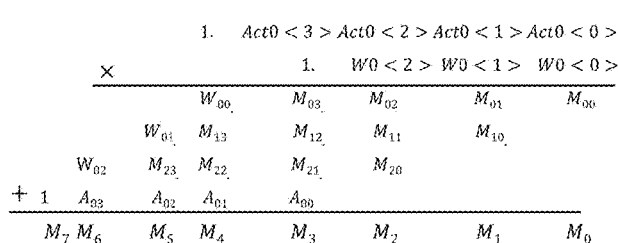
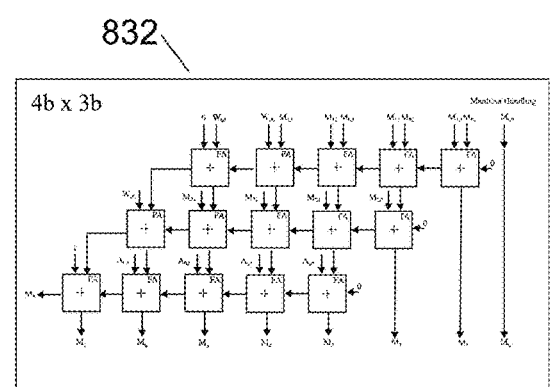
FIG. 31

3200

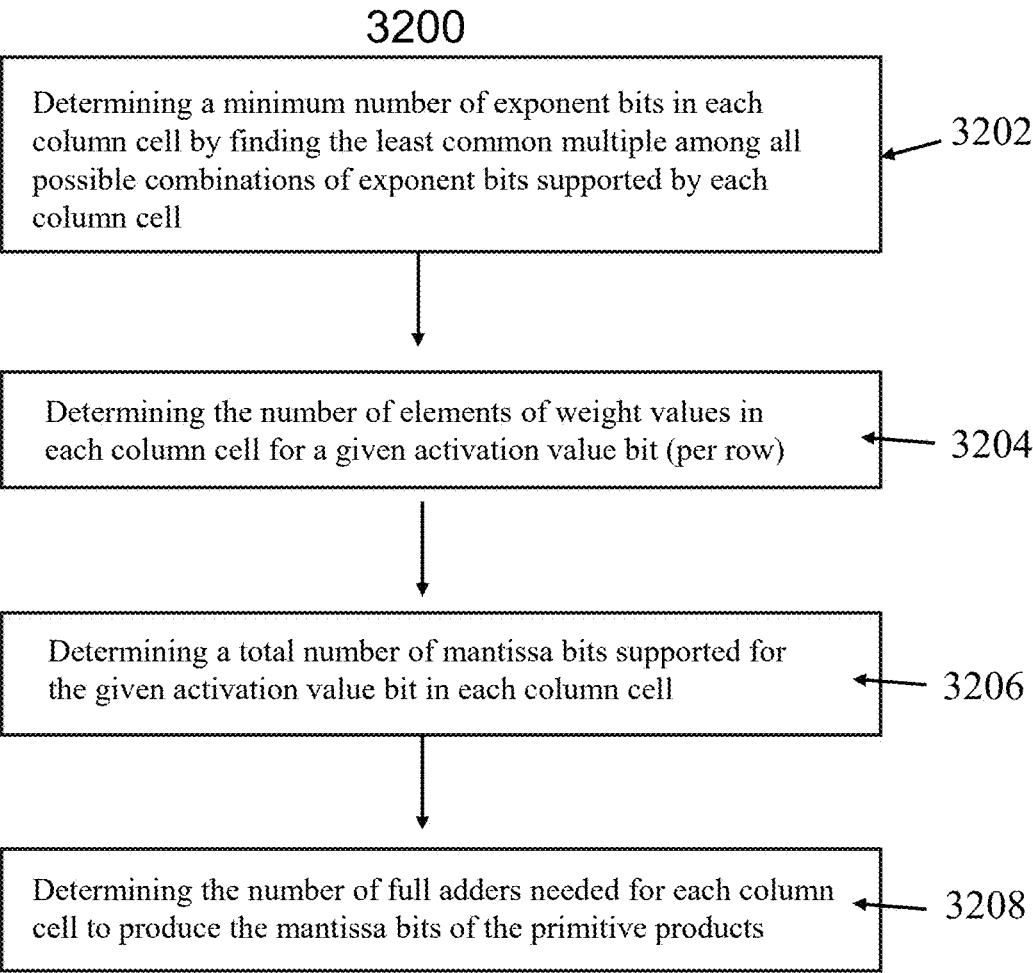

Determining a minimum number of exponent bits in each column cell by finding the least common multiple among all possible combinations of exponent bits supported by each column cell — 3202

Determining the number of elements of weight values in each column cell for a given activation value bit (per row) — 3204

Determining a total number of mantissa bits supported for the given activation value bit in each column cell — 3206

Determining the number of full adders needed for each column cell to produce the mantissa bits of the primitive products — 3208

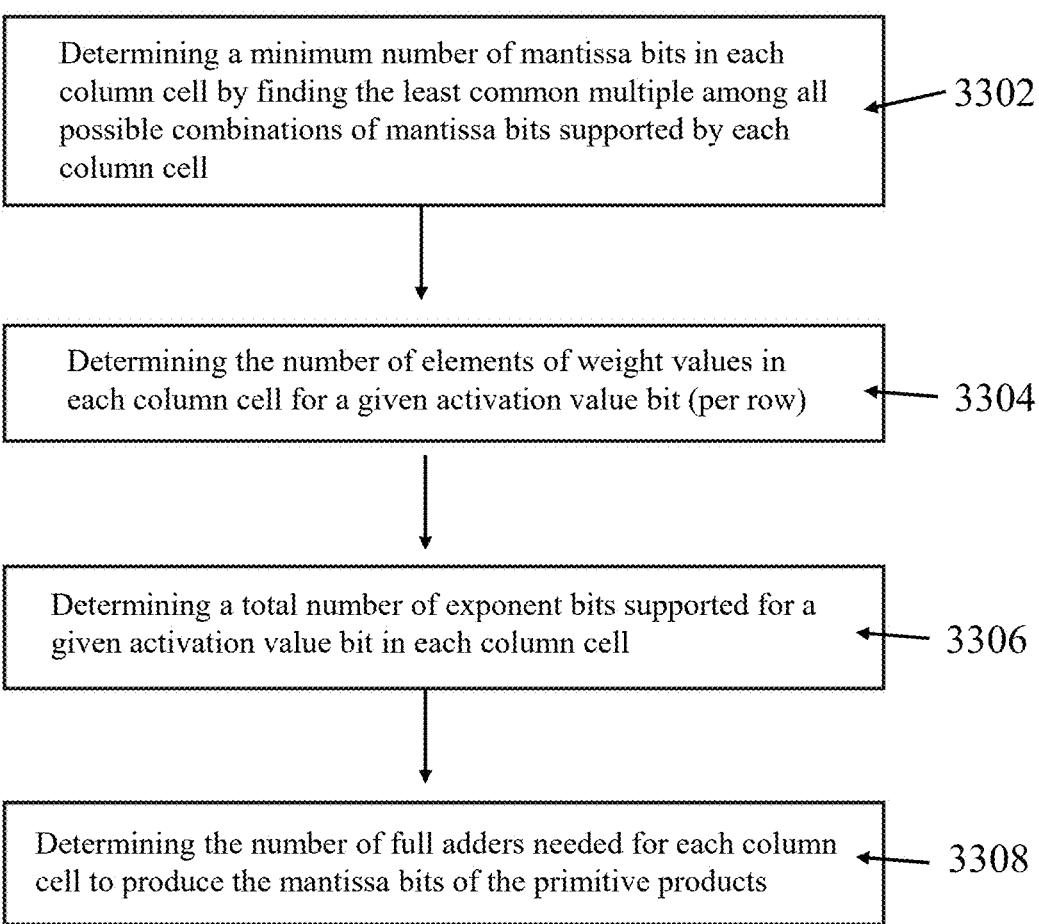

Determining a minimum number of mantissa bits in each column cell by finding the least common multiple among all possible combinations of mantissa bits supported by each column cell ── 3302

Determining the number of elements of weight values in each column cell for a given activation value bit (per row) ── 3304

Determining a total number of exponent bits supported for a given activation value bit in each column cell ── 3306

Determining the number of full adders needed for each column cell to produce the mantissa bits of the primitive products ── 3308

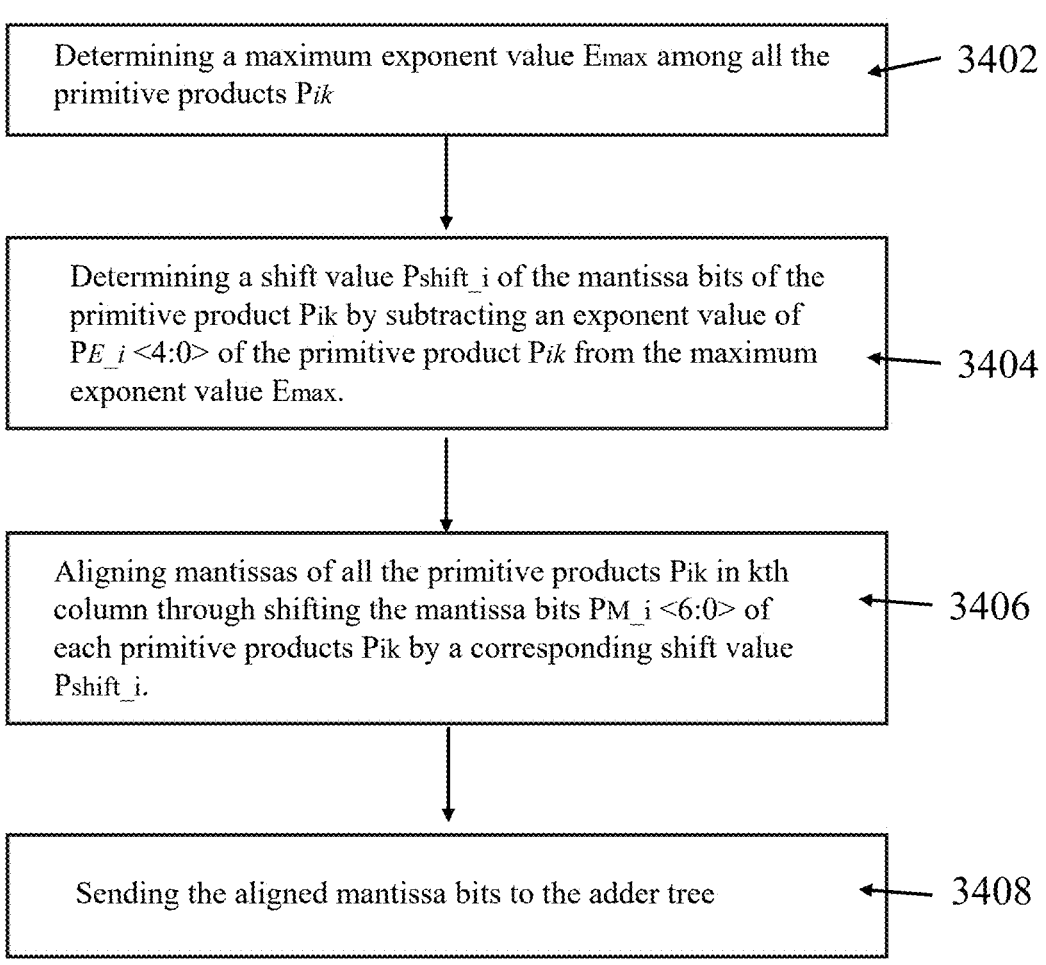

Determining a maximum exponent value Emax among all the primitive products Pik — 3402

Determining a shift value Pshift_i of the mantissa bits of the primitive product Pik by subtracting an exponent value of P$E\_i$ <4:0> of the primitive product Pik from the maximum exponent value Emax. — 3404

Aligning mantissas of all the primitive products Pik in kth column through shifting the mantissa bits PM_i <6:0> of each primitive products Pik by a corresponding shift value Pshift_i. — 3406

Sending the aligned mantissa bits to the adder tree — 3408

```
always_comb begin
  p_shift  = MAX_EXP - bitcell_mul.exp;
     // find exponent max exponent compare exponent difference
  p_m_sint = {bitcell_mul.mant, {(P_M_WIDTH - BITCELL_MUL_MANT_WIDTH){1'b0}}};
     // extend bitcell mantissa by 2^27.
  p_m_s    = $signed({1'b0, (p_m_sint >> p_shift)});
     //right shift mantisa based on p_shift and convert it to sign value
  p_m_tc   = bitcell_mul.s? (-p_m_s) : p_m_s;
     // based on sign bit value, convert to 2's compliment.
end
```

5600B 5700A
5700B
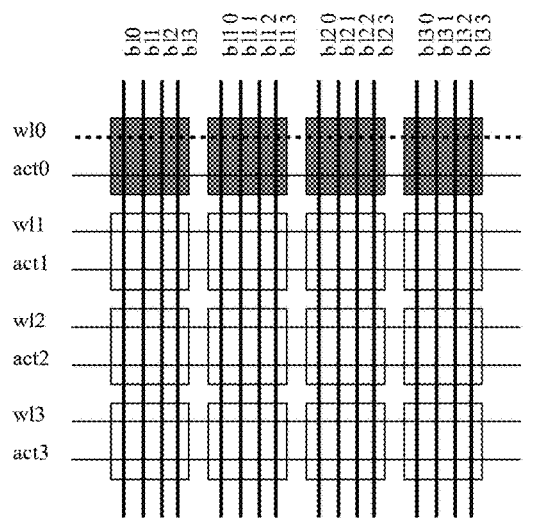
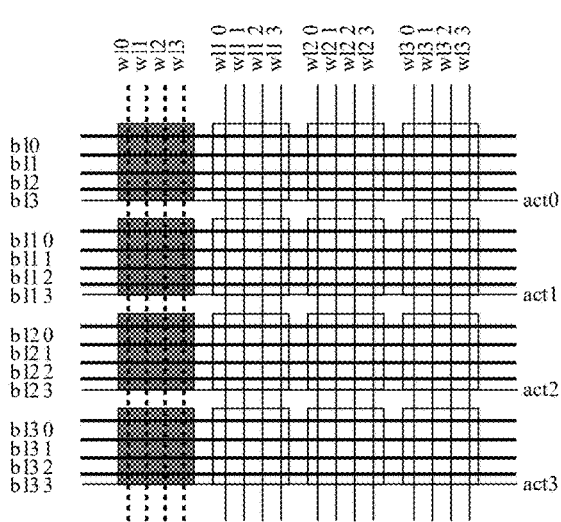
FIG. 57A
FIG. 57B

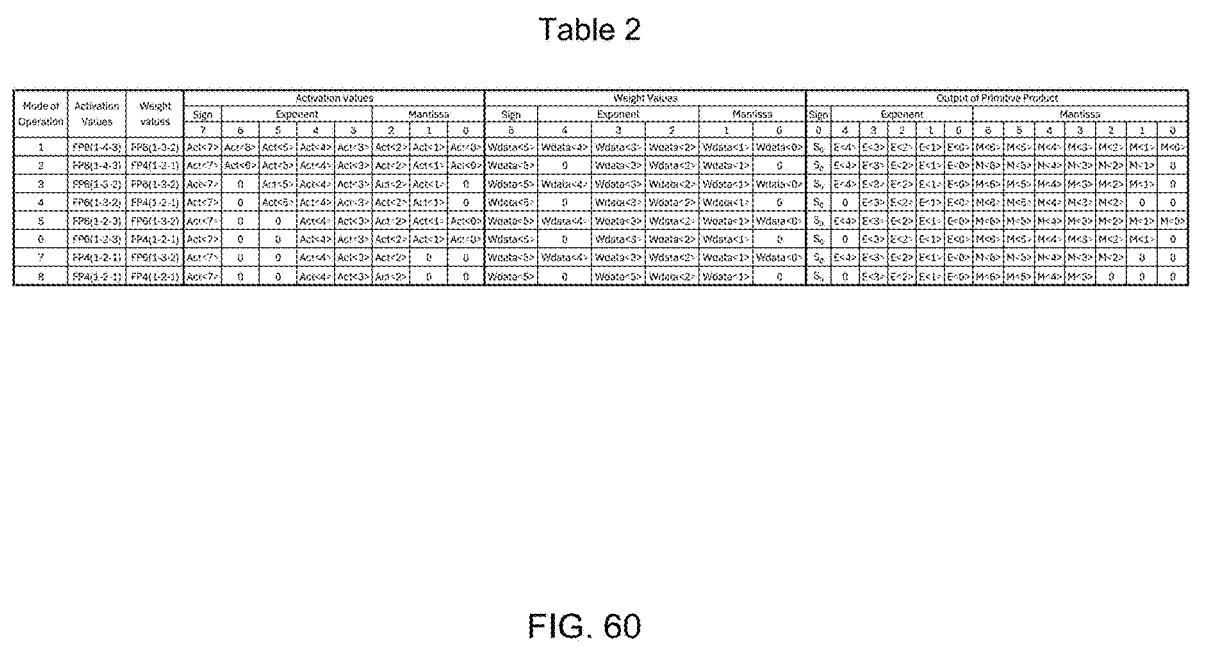

Table 2

| Mode of Operation | Activation Values | Weight values | Activation Values | | | | | | | | | Weight Values | | | | | | | | Output of Primitive Product | | | | | | | | | | | |
|---|---|---|---|---|---|---|---|---|---|---|---|---|---|---|---|---|---|---|---|---|---|---|---|---|---|---|---|---|---|---|---|
| | | | Sign | Exponent | | | | | Mantissa | | | Sign | Exponent | | | | | Mantissa | | | Sign | Exponent | | | | | Mantissa | | | | | |
| | | | 7 | 6 | 5 | 4 | 3 | 2 | 1 | 0 | 5 | 4 | 3 | 2 | 1 | 0 | 0 | 4 | 3 | 2 | 1 | 0 | 6 | 5 | 4 | 3 | 2 | 1 | 0 |
| 1 | FP8(1-4-3) | FP8(1-3-2) | Act<7> | Act<6> | Act<5> | Act<4> | Act<3> | Act<2> | Act<1> | Act<0> | Wdata<5> | Wdata<4> | Wdata<3> | Wdata<2> | Wdata<1> | Wdata<0> | S₀ | E<4> | E<3> | E<2> | E<1> | E<0> | M<6> | M<5> | M<4> | M<3> | M<2> | M<1> | M<0> |
| 2 | FP8(1-4-3) | FP4(1-2-1) | Act<7> | Act<6> | Act<5> | Act<4> | Act<3> | Act<2> | Act<1> | Act<0> | Wdata<5> | 0 | Wdata<3> | Wdata<2> | Wdata<1> | 0 | S₀ | E<4> | E<3> | E<2> | E<1> | E<0> | M<6> | M<5> | M<4> | M<3> | M<2> | M<1> | 0 |
| 3 | FP8(1-3-2) | FP6(1-3-2) | Act<7> | 0 | Act<5> | Act<4> | Act<3> | Act<2> | Act<1> | 0 | Wdata<5> | Wdata<4> | Wdata<3> | Wdata<2> | Wdata<1> | Wdata<0> | S₀ | E<4> | E<3> | E<2> | E<1> | E<0> | M<6> | M<5> | M<4> | M<3> | M<2> | 0 | 0 |
| 4 | FP6(1-3-2) | FP4(1-2-1) | Act<7> | 0 | Act<5> | Act<4> | Act<3> | Act<2> | Act<1> | 0 | Wdata<5> | 0 | Wdata<3> | Wdata<2> | Wdata<1> | 0 | S₀ | 0 | E<3> | E<2> | E<1> | E<0> | M<6> | M<5> | M<4> | M<3> | M<2> | 0 | 0 |
| 5 | FP6(1-2-3) | FP6(1-3-2) | Act<7> | 0 | 0 | Act<4> | Act<3> | Act<2> | Act<1> | Act<0> | Wdata<5> | Wdata<4> | Wdata<3> | Wdata<2> | Wdata<1> | Wdata<0> | S₀ | E<4> | E<3> | E<2> | E<1> | E<0> | M<6> | M<5> | M<4> | M<3> | M<2> | M<1> | M<0> |
| 6 | FP6(1-2-3) | FP4(1-2-1) | Act<7> | 0 | 0 | Act<4> | Act<3> | Act<2> | Act<1> | Act<0> | Wdata<5> | 0 | Wdata<3> | Wdata<2> | Wdata<1> | 0 | S₀ | 0 | E<3> | E<2> | E<1> | E<0> | M<6> | M<5> | M<4> | M<3> | M<2> | M<1> | 0 |
| 7 | FP4(1-2-1) | FP6(1-3-2) | Act<7> | 0 | 0 | Act<4> | Act<3> | Act<2> | 0 | 0 | Wdata<5> | Wdata<4> | Wdata<3> | Wdata<2> | Wdata<1> | Wdata<0> | S₀ | E<4> | E<3> | E<2> | E<1> | E<0> | M<6> | M<5> | M<4> | M<3> | M<2> | 0 | 0 |
| 8 | FP4(1-2-1) | FP4(1-2-1) | Act<7> | 0 | 0 | Act<4> | Act<3> | Act<2> | 0 | 0 | Wdata<5> | 0 | Wdata<3> | Wdata<2> | Wdata<1> | 0 | S₀ | 0 | E<3> | E<2> | E<1> | E<0> | M<6> | M<5> | M<4> | M<3> | 0 | 0 | 0 |

FIG. 60

Table 4

| Mantissa bit size of multiplicand (activation value) | Bit sizes of multipler (weigth value) | | | Per element of the weight value | | | total 60 exponent bits per row | | | total 12 exponent bits per row | | |
|---|---|---|---|---|---|---|---|---|---|---|---|---|
| | sign | Exponent | Mantissa | # of FA per row | # of FA rows | total # of FA | # of elements | # of mantissa bits per row | Total # of FA | # of elements | # of mantissa bits per row | Total # of FA |
| 4 | FP8 | 1 | 5 | 2 | 5 | 2 | 10 | 12 | 24 | 120 | N/A | N/A | N/A |
| 4 | | 1 | 4 | 3 | 5 | 3 | 15 | 15 | 45 | 225 | 3 | 9 | 45 |
| 4 | | 1 | 3 | 4 | 5 | 4 | 20 | 20 | 80 | 400 | 4 | 16 | 80 |
| 4 | FP6 | 1 | 3 | 2 | 5 | 2 | 10 | 20 | 40 | 200 | 4 | 8 | 40 |
| 4 | | 1 | 2 | 3 | 5 | 3 | 15 | 30 | 90 | 450 | 6 | 18 | 90 |
| 4 | FP4 | 1 | 2 | 1 | 5 | 1 | 5 | 30 | 30 | 150 | 6 | 6 | 30 |

FIG. 61

Table 5

| Mantissa bit size of multiplicand (activation value) | Bit sizes of multipler (weigth value) | | | Per element of weight value | | | total 60 exponent bits per row | | | total 12 exponent bits per row | | |
|---|---|---|---|---|---|---|---|---|---|---|---|---|
| | sign | Exponent | Mantissa | # of FA per row | # of FA rows | total # of FA | # of elements | # of mantissa bits per row | Total # of FA | # of elements | # of mantissa bits per row | Total # of FA |
| 3 | | 1 | 5 | 2 | 4 | 2 | 8 | 12 | 24 | 96 | N/A | N/A | N/A |
| 3 | FP8 | 1 | 4 | 3 | 4 | 3 | 12 | 15 | 45 | 180 | 3 | 9 | 36 |
| 3 | | 1 | 3 | 4 | 4 | 4 | 16 | 20 | 80 | 320 | 4 | 16 | 64 |
| 3 | FP6 | 1 | 3 | 2 | 4 | 2 | 8 | 20 | 40 | 160 | 4 | 8 | 32 |
| 3 | | 1 | 2 | 3 | 4 | 3 | 12 | 30 | 90 | 360 | 6 | 18 | 72 |
| 3 | FP4 | 1 | 2 | 1 | 4 | 1 | 4 | 30 | 30 | 120 | 6 | 6 | 24 |

FIG. 62

Table 6

| Mantissa bit size of multiplicand (activation value) | Bit sizes of multipler (weigth value) | | | Per element of weight value | | | total 12 mantissa bits per row | | |
|---|---|---|---|---|---|---|---|---|---|
| | sign | Exponent | Mantissa | # of FA per row | # of FA rows | total # of FA | # of elements | # of exponent bits per row | Total # of FA |
| 4 | | 1 | 5 | 2 | 5 | 2 | 10 | 6 | 30 | 120 |
| 4 | FP8 | 1 | 4 | 3 | 5 | 3 | 15 | 4 | 16 | 180 |
| 4 | | 1 | 3 | 4 | 5 | 4 | 20 | 3 | 9 | 240 |
| 4 | FP6 | 1 | 3 | 2 | 5 | 2 | 10 | 6 | 18 | 120 |
| 4 | | 1 | 2 | 3 | 5 | 3 | 15 | 4 | 8 | 180 |
| 4 | FP4 | 1 | 2 | 1 | 5 | 1 | 5 | 12 | 24 | 60 |

FIG. 63

Table 7

| Mantissa bit size of multiplicand (activation value) | Bit sizes of multipler (weigth value) | | | Per element of weight value | | | total 12 mantissa bits per row | | |
|---|---|---|---|---|---|---|---|---|---|
| | | sign | Exponent | Mantissa | # of FA per row | # of FA rows | total # of FA | # of elements | # of exponent bits per row | Total # of FA |
| 3 | FP8 | 1 | 5 | 2 | 4 | 2 | 8 | 6 | 30 | 96 |
| 3 | | 1 | 4 | 3 | 4 | 3 | 12 | 4 | 16 | 144 |
| 3 | | 1 | 3 | 4 | 4 | 4 | 16 | 3 | 9 | 192 |
| 3 | FP6 | 1 | 3 | 2 | 4 | 2 | 8 | 6 | 18 | 96 |
| 3 | | 1 | 2 | 3 | 4 | 3 | 12 | 4 | 8 | 144 |
| 3 | FP4 | 1 | 2 | 1 | 4 | 1 | 4 | 12 | 24 | 48 |

FIG. 64

PARALLEL OPERATIONS IN COMPUTE SYSTEMS

FIELD OF DISCLOSURE

The present disclosure relates to the field of hardware accelerators for artificial intelligence and other high-performance computing workloads, and, more specifically, to digital compute-in-memory architectures and neural network accelerators that perform vector-matrix operations. In particular, and without limitation, the disclosure pertains to flexible compute-in-memory macros and associated handling parameters (e.g., sign, exponent, and mantissa) more efficiently using, for example, format-agile vector-matrix multiplication and accumulation with dequantization to higher-precision outputs in machine-learning and signal-processing systems.

BACKGROUND

Matrix-vector multiplication is a fundamental computational operation in many areas of science and engineering, including linear algebra, signal processing, and machine learning. In a typical matrix-vector multiplication, each element of an output vector is obtained by computing the dot product between a corresponding row of a matrix and an input vector. This operation can be applied to large matrices and high-dimensional vectors and can be composed into sequences of vector-matrix or matrix-matrix multiplications to implement neural network layers, filtering operations, and numerical solvers in a wide variety of computing applications.

Hardware accelerators are specialized processing architectures designed to execute particular classes of computations more efficiently than general-purpose processors. Such accelerators can include application-specific integrated circuits (ASICs), system-on-chip (SoC) devices, field-programmable gate arrays (FPGAs), and other dedicated processing units that provide tailored datapaths, memory structures, and interconnects for high-throughput arithmetic operations such as vector-matrix and matrix-matrix multiplication. In many systems, hardware accelerators are integrated alongside CPUs and other processing elements to offload compute-intensive workloads, using parallel processing structures and localized memory organizations to increase arithmetic throughput, improve energy efficiency, and enhance overall system utilization.

Artificial intelligence (AI) and machine learning (ML) techniques frequently rely on multilayer neural networks and other statistical models that are naturally expressed in terms of linear algebra operations. In such models, inference and training often involve repeated application of matrix-vector and matrix-matrix multiplications to transform input feature vectors, propagate activations through network layers, and update parameters according to optimization algorithms. These workloads commonly process large batches of data in parallel and employ compact numerical formats to increase computational density, making them well suited for execution on specialized hardware accelerators that provide high-throughput support for vector-matrix arithmetic and associated data movement.

SUMMARY

Modern AI and high-performance computing workloads increasingly rely on hardware accelerators to execute vast numbers of matrix-vector and matrix-matrix multiplications using compact numeric formats. For example, matrix-vector and matrix-matrix multiplications are used to determine activations and weights of models during training of AI models or to prepare inferences or responses with pre-trained models. These operations can involve transforming activations and weights back and forth between different numeric domains (for example, higher-precision floating point used in training and software, and lower-precision integer formats used in the datapath). Each conversion step requires additional scaling, rounding, and saturation logic, which adds area, power, and latency to already dense compute fabrics, and can introduce cumulative quantization errors that degrade numerical behavior over many layers. As new low-bit formats and variants are introduced to improve efficiency (such as different 8-bit or sub-8-bit floating-point encodings), fixed conversion pipelines and format-specific data paths become increasingly difficult to adapt, limiting the flexibility of the hardware to support evolving models and deployment scenarios.

The techniques described herein disclose accelerators, systems, methods, apparatus, and/or devices that perform operations natively supporting multiple, flexible numeric formats for activations and weights under the control of a mode decoding unit. For example, a compute engine such as a compute-in-memory macro, a matrix-multiplication array, or another specialized accelerator block can be provisioned with arithmetic and control logic that can interpret different low-precision floating-point-style formats for input data and stored parameters, and can select among these formats dynamically based on configuration information associated with a layer, an operation type, or a deployment scenario. By using control signals generated by the mode decoding unit to govern exponent handling, mantissa alignment, scaling, and accumulation behavior, optimized hardware can execute vector-matrix and matrix-matrix operations more efficiently, across a range of compact numeric formats without requiring separate conversion pipelines or dedicated cores for each format. Additionally, this flexible support allows, for example, different combinations of formats for activations and weights to be employed to balance accuracy, memory bandwidth, and power consumption, while preserving a consistent external programming model and avoiding significant redesign of underlying storage arrays, arithmetic structures, or dataflow for new or evolving numeric schemes.

For example, one aspect of the disclosed technology provides a hardware accelerator that has a compute-in-memory (CIM) macro configured that allows performing improved vector matrix multiplication (VMM) operations between a vector of activation values and a matrix of weight values. The hardware accelerator can also have a mode decoding unit configured to provide an arithmetic mode of the VMM operation according to a first floating point format of the activation values and a second floating point format of the weight values, where the first floating point format and the second floating point format are flexible. The CIM macro can include a plurality of column cells. A column cell can be configured to output a primitive product between an activation value and a weight value. The column cell can include a half adder configured to add an exponent bit of the activation value and an exponent bit of the weight value and output a carry-out bit and a sum bit. The column cell can also include a first multiplexer configured to select zero or a prior stage carry-out bit from a prior stage half adder and output a first selection to a full adder. The column cell can further include a second multiplexer configured to select zero or the sum bit and output a second selection to the full adder, and a third multiplexer configured to select zero or a carry-in bit from a prior stage full adder and output a third selection to the full adder. The first multiplexer, the second multiplexer and the third multiplex perform respective selections based on control signals according to the arithmetic mode.

In another aspect, the disclosed technology is directed to an apparatus having a compute-in-memory (CIM) macro configured to perform a vector matrix multiplication (VMM) operation. The apparatus also has a mode decoding unit configured to provide an arithmetic mode of the VMM operation according to floating point formats of an activation value and a weight value. The CIM macro has a column cell configured to produce a primitive product between the activation value and the weight value. The column cell has logic gates configured to output partial products between mantissa bits of the activation value and mantissa bits of the weight value. The column cell also has an array of full adders configured to output mantissa bits of the primitive product. The column cell includes a plurality of multiplexers configured to select zero or a corresponding partial product and output a selection to a corresponding full adder based on a control signal according to the arithmetic mode.

Additional aspects of the disclosed technology are directed to a computing device that can have the compute-in-memory (CIM) macro with a column cell configured for improved product operations. For example, the column cell can be configured to produce a primitive product between an activation value and a weight value. The column cell can include a first half adder configured to perform addition between a least significant exponent bit of the activation value and a least significant exponent bit of the weight value. The column cell can also include a second half adder configured to perform addition for a most significant exponent bit of the activation value or a most significant exponent bit of the weight value. The column cell can also include a plurality of full adders configured to add a further exponent bit of the activation value and a further exponent bit of the weight value. The further exponent bit of the activation value and the further exponent bit of the weight value are not provided to the first half adder or the second half adder.

Yet another aspect of the disclosed technology provides a hardware accelerator having a compute-in-memory (CIM) macro for improved product calculations. The CIM macro has a column cell that is configured to produce a primitive product between an activation value and a weight value. The column cell has a first logic gate configured to provide a first output bit based on inputs from exponent bits of the activation value, and a second logic gate configured to provide a second output bit based on inputs from exponent bits of the weight value. The column cell also has a plurality of third logic gates configured to output partial products between mantissa bits of the activation value and mantissa bits of the weight value. The partial products are generated after the first output bit is added before a most significant bit (MSB) of the mantissa of the activation value and the second output bit is added before the MSB of the mantissa of the weight value.

According to some aspects of the disclosed technology, a computing system can include a compute-in-memory (CIM) macro having columns of computing units. The columns of computing units have a column cell configured to generate a primitive product of an activation value and a weight value in a floating point format. The columns of computing units also have a functional block configured to align mantissa bits of primitive products generated by column cells in the computing unit by shifting the mantissa bits. The columns of computing units also include an adder tree configured to output an accumulation value of the primitive products in an integer format by adding the shifted mantissa bits.

According to another aspect of the disclosed technology, an apparatus having a compute-in-memory (CIM) macro can be configured to store an array of weight values and perform a vector matrix multiplication (VMM) operation using the array of weight values. The CIM macro includes a column cell having a first set of bitcells configured to store a first weight value and a second set of bitcells configured to store a second weight value that is different from the first weight value. The CIM macro also has a first set of wordlines and a second set of wordlines configured to address the first set of bitcells and the second set of bitcells, respectively. The CIM macro is further configured to perform, in parallel, a write operation to the first set of bitcells and the VMM operation in the second set of bitcells based on a weight select signal.

Furthermore, the disclosed technology discloses an apparatus having a compute-in-memory (CIM) macro configured to store an array of weight values and perform a tensor operation using the array of weight values. The CIM macro includes a first bitcell configured to store a first bit of a first weight value and a second bitcell configured to store a second bit of a second weight value different from the first weight value, wherein an output of the first bitcell is an input of the second bitcell. The CIM macro also includes a first multiplexer configured to output a first control signal to the first bitcell according to a wordline signal and a scan clock signal and a second multiplexer configured to output a second control signal to the second bitcell according to the scan clock signal and a weight update signal.

Additionally, some aspects of the disclosed technology are directed to methods for improved operation of hardware accelerators and related computing systems. In various implementations, such methods can include configuring a compute-in-memory (CIM) macro and an associated mode decoding unit to select arithmetic modes and numeric formats for activations and weights, loading bits of multiple weight values into column cells and bitcells that generate primitive products, and operating exponent and mantissa datapaths (e.g., including half adders, full adders, logic gates, and multiplexers) to produce and accumulate primitive products in accordance with the selected modes. The methods can further include aligning mantissa bits via shifting, accumulating shifted mantissa bits in an integer domain, dequantizing accumulated results into a higher-precision format, and performing tensor or vector-matrix operations based on these results. In some embodiments, the methods also encompass operating the CIM macro in different functional and scan modes, performing parallel write and compute operations on different sets of bitcells, and using scan control signals to test or diagnose the weight-storage and compute paths while preserving normal performance characteristics during heavy training and inference workloads.

For example, in the disclosed technology certain techniques can write weight values into a compute-in-memory (CIM) macro that includes two independently addressable sets of bitcells within a column. A control mechanism, such as a weight address decoder, may generate separate wordline signals for each bitcell set based on a selection indicator that determines which bank is targeted for the write. The weight data itself can be driven onto bitlines shared by both sets of bitcells, enabling compact routing and reduced array complexity. A complementary version of the selection indicator may also be delivered to output-selection circuitry so that the bank being written is isolated from ongoing compute operations, while the other bank continues to supply stable weight outputs for vector-matrix multiplication. This arrangement can support efficient double-buffering of weights, minimize compute stalls during updates, and allow seamless switching between weight sets in high-throughput processing scenarios.

Yet additional aspects of the disclosed technology are directed to systems for improved computation. In some embodiments, such systems can include a computing device having one or more hardware accelerators, including multiple compute-in-memory (CIM) macros and other specialized processing blocks, that are configurable to perform calculations and tensor operations more efficiently. The computing device can further include one or more processors, on-chip or off-chip memory devices, and interconnect circuitry that coordinate data movement of activations and weight values to and from the CIM macros. In various implementations, the CIM macros and associated control logic can be configured to support flexible numeric formats, selectable arithmetic modes, and scan or test modes as described herein, enabling the systems to execute matrix-vector and matrix-matrix operations for training and inference workloads while reducing conversion overhead, improving energy efficiency, and maintaining a consistent programming and control model across different accelerator instances within the same device or across multiple devices in a larger system.

For example, in the disclosed technology a system may include a computing device that stores weight values directly within a compute-in-memory structure and can perform vector-matrix multiplication while updating weights in parallel. The device can organize its weight storage into two independently addressable sets of bitcells, each controlled by its own set of wordlines. By using a selection signal to designate which set is active for computation and which is targeted for a write, the device can update one bank of weights while the other bank continues supplying data for ongoing VMM operations. This dual-bank structure supports parallelism between memory updates and computation, reduces downtime associated with loading new parameters, and can enable double-buffering or rapid reconfiguration of weight values in workloads that require frequent or continuous updates.

BRIEF DESCRIPTION OF THE DRAWINGS

Details of one or more aspects of the subject matter described in this disclosure are set forth in the accompanying drawings and the description below. However, the accompanying drawings illustrate only some typical aspects of this disclosure and are therefore not to be considered limiting of its scope. Other features, aspects, and advantages will become apparent from the description, the drawings, and the claims.

FIGS. 13-14 illustrate schemes for handling exponent of data with a lower FP precision in a column cell in the CIM macro, in accordance with some aspects of the present disclosure.

FIGS. 15, 16, 17, 18 illustrate schemes for handling mantissa of data with a lower FP point precision in a column cell in the CIM macro, in accordance with some aspects of the present disclosure.

FIGS. 20, 21, 22 illustrate schemes for handling exponents of data with various FP formats in a column cell in the CIM macro, in accordance with some aspects of the present disclosure.

FIGS. 23, 24, 25 illustrate schemes for handling mantissas of data with various FP formats in a column cell in the CIM macro, in accordance with some aspects of the present disclosure.

FIGS. 30-31 illustrate schemes for handling mantissa bits for various FP data, in accordance with some aspects of the present disclosure.

FIGS. 32-33 illustrate methods for utilizing resources of a hardware accelerator, in accordance with some aspects of the present disclosure.

FIGS. 34, 35, 36, and 37 illustrate schemes for aligning the mantissas, in accordance with some aspects of the present disclosure.

FIG. 40 illustrates an exemplary register-transfer level script for mantissa alignment, in accordance with some aspects of the present disclosure.

FIGS. 56A, 56B, 57A, 57B, 58A, 58B, 58C, 59A, and 59B illustrate schemes for parallel row or column writing, in accordance with some aspects of the present disclosure.

FIG. 60 illustrates a table describing schemes for handling weight values and activation values in various FP formats, in accordance with some aspects of the present disclosure.

FIGS. 61, 62, 63, and 64 illustrate various schemes to optimize resources in the CIM macro, in accordance with some aspects of the present disclosure.

DETAILED DESCRIPTION

Figure 1:
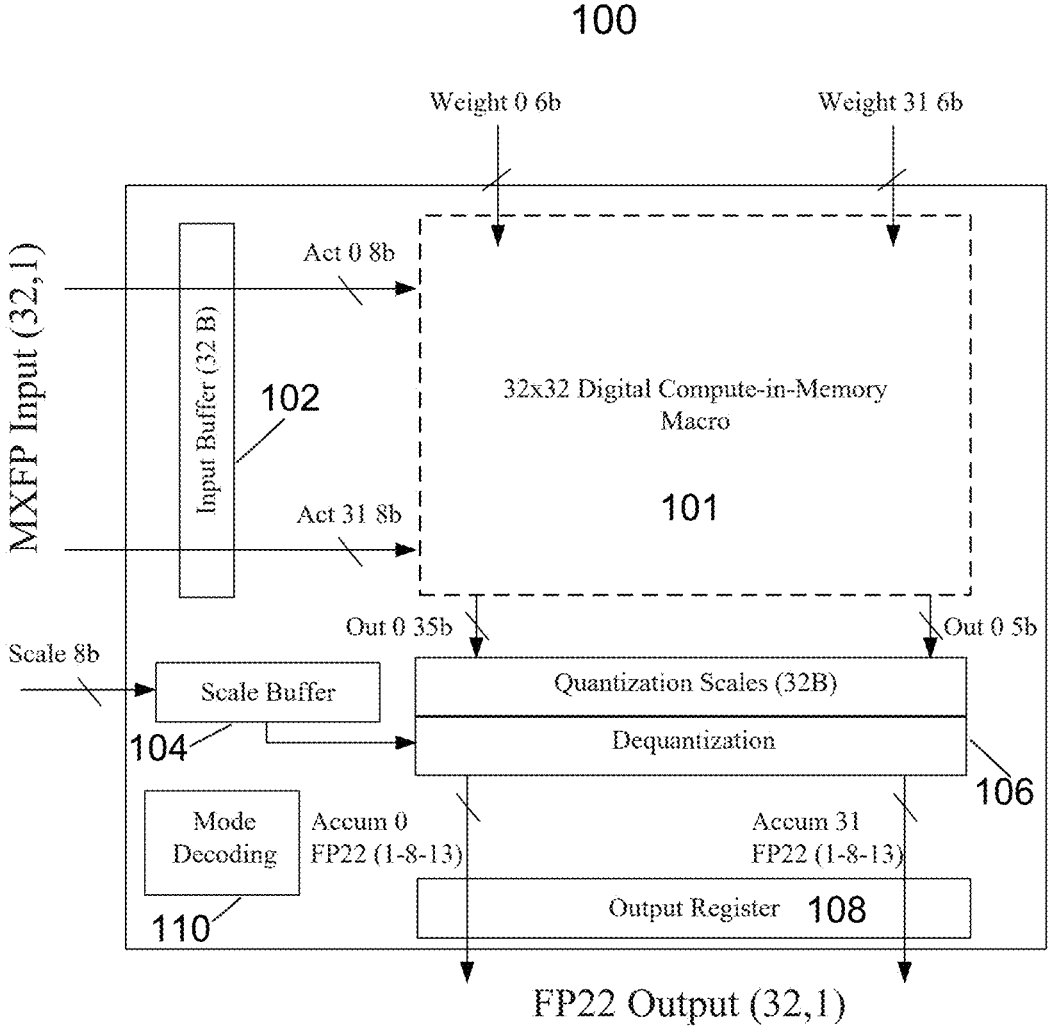
FIG. 1 illustrates a block diagram of an exemplary hardware accelerator, in accordance with some aspects of the present disclosure.

The disclosure can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the disclosure may take, may be referred to as techniques. In general, the order of the steps of disclosed processes may be altered within the scope of the disclosure. Unless stated otherwise, a component such as a processor or a memory described as being configured to perform a task may be implemented as a general component that is temporarily configured to perform the task at a given time or a specific component that is manufactured to perform the task. As used herein, the term "processor" refers to one or more devices, circuits, and/or processing cores configured to process data, such as computer program instructions. As used in this application the singular forms "a," "an," and "the" include the plural forms unless the context clearly dictates otherwise.

A detailed description of one or more embodiments of the disclosure is provided below along with accompanying figures that illustrate the principles of the disclosure. The disclosure is described in connection with such embodiments, but the disclosure is not limited to any embodiment. The scope of the disclosure is limited only by the claims and the disclosure encompasses numerous alternatives, modifications and equivalents. Numerous specific details are set forth in the following description in order to provide a thorough understanding of the disclosure. These details are provided for the purpose of example and the disclosure may be practiced according to the claims without some or all of these specific details. For the purpose of clarity, technical material that is known in the technical fields related to the disclosure has not been described in detail so that the disclosure is not unnecessarily obscured.

Although the embodiments are described in some detail for purposes of clarity of understanding, the disclosure is not limited to the details provided. There are many alternative ways of implementing the disclosure. The disclosed embodiments are illustrative and not restrictive.

A neural network is a machine learning model inspired by the human brain that uses interconnected nodes to recognize patterns in data, and can be applied to artificial intelligence (AI) and machine learning, including image recognition, speech recognition, natural language processing, search engines, etc. Each connection between the nodes has a weight, and each node has an activation function that determines its output based on the inputs it receives. A neural network can be continuously improved over time by adjusting the weight during a learning process. The machine learning process can be performed in various environments, including smartphones, IoT sensors, personal computers, laptops, servers, data centers and cloud platforms, depending on the complexity of the task and the size of the data. Hardware accelerators can be deployed to accelerate the machine learning process. Hardware accelerators, including GPU (graphics processing unit), TPU (tensor processing unit), FPGA (field-programmable gate array) and ASIC (application-specific integrated circuit), can process large amounts of data in parallel, faster and more efficiently than a general-purpose CPU (central processing unit). Advances in AI scales up the size of deep learning models, leading to a significant increase in the computing power and storage capacity necessary to train such models. The disclosed technology improves hardware accelerator and the methods of computation and operation performed by the hardware accelerator.

For example, some aspects of the present technology may be directed to a hardware accelerator that can include a compute-in-memory (CIM) macro that may directly perform vector matrix multiplication (VMM) between activation values and weight values stored in memory, rather than shuttling data back and forth to a separate arithmetic core. A mode decoding unit can supply an arithmetic mode that may reflect the floating-point formats chosen for activations and weights, allowing the accelerator to support multiple "flexible" low-precision formats without redesigning the datapath. Within each column cell, a half adder may add selected exponent bits from the activation and weight, and a set of multiplexers can steer carry bits and sum bits into a full adder based on mode-dependent control signals. This structure can allow the column cell to produce a primitive product that already accounts for exponent behavior in a compact, programmable way, potentially improving throughput and format flexibility while helping avoid large shared exponent trees and conversion logic.

Further, in certain implementations, the column cell may include an additional multiplexer that can choose which signal represents the exponent bit of the primitive product:

the output of the full adder, the sum output of the half adder, or a carry-in from an upstream stage. By selecting among these sources, the design may tailor the effective exponent output to different floating-point formats and exponent ranges, potentially helping maintain accuracy across configurations without duplicating hardware or adding deeper trees of adders.

In some implementations, the column cell or a group of memory cells may store the weight value locally so that exponent and mantissa bits can be available directly next to the compute logic. By co-locating storage and compute in this way, the accelerator may reduce data movement and latency, and could stream activations from outside while the weights remain resident in the CIM macro, which may be beneficial for repeated use of the same parameters across many activations. Further, one of these memory cells may serve as a bitcell dedicated to holding the exponent bit of the weight value and feeding this bit directly to the half adder. Localizing exponent storage and wiring in this manner can help keep routing short and predictable, potentially improving timing closure and reducing power lost to long interconnects, while also making it easier to support different exponent widths across the array.

The disclosed technology may also improve memory operation. For example, in some designs, a memory cell can be realized as a pair of bitcells, where each bitcell may be addressed by its own wordline, enabling independent selection of two stored bits. Further, paired bitcells may share a common bitline while still being controlled by different wordlines. Sharing the bitline can save routing resources and reduce area, while separate wordlines may preserve the ability to selectively access or update each bitcell. This arrangement can help keep the memory dense, which may be especially important when storing many low-precision weights for large neural-network layers.

In some aspects of the disclosed technology, a first bitcell may hold a first bit of one weight value, and a second bitcell may hold a second bit of a different weight value. By interleaving bits of different weight values along the same bitline, the design may improve packing efficiency and support parallel access patterns where one weight is being used for computation while another is being updated or prepared for a different phase of operation. The first bitcell can provide its stored bit as the exponent bit of the weight to the half adder. This tight coupling between the exponent bitcell and the exponent adder may reduce the need for separate exponent memory regions or wider buses. Further, while the first bitcell is driving the exponent bit into the half adder, the second bitcell can be updated with a new bit of another weight value. This concurrency could allow the hardware to refresh or modify stored weights in the background while exponent calculations are ongoing, potentially increasing utilization and enabling rapid reconfiguration of model parameters without stalling compute.

Moreover, disclosed accelerator designs may support activation values with different counts of exponent bits, such as 2, 3, 4, or 5, by sizing and controlling the exponent logic accordingly. Supporting a range of exponent widths can make it easier to adopt new floating-point formats and to trade off dynamic range against area and power, allowing different layers or models to choose the exponent precision best suited to their numerical behavior. Similarly, the design may support weight values with multiple possible exponent widths, including 2, 3, 4, or 5 bits.

The disclosed technology can also improve computational methods. For example, a method may describe how a CIM macro carries out VMM computation by operating directly on exponent bits. A half adder in each column cell may first combine exponent bits of an activation and a weight, producing a sum bit and a carry-out. Multiplexers can then choose which carry and sum signals to feed into a full adder so that the column cell may build the exponent of a primitive product. This step-by-step control of exponent addition can allow the hardware to generate a product exponent efficiently while keeping the logic close to stored weights. In some embodiments, the selection behavior of the multiplexers may be driven by control signals tied to an arithmetic mode. Thus, by varying these control signals, the same physical adders and multiplexers can implement different exponent-handling schemes, for example to support different bias conventions or exponent ranges. In some implementations, an arithmetic mode may be determined from the floating-point formats used for the activation and the weight. A control unit may interpret the format configuration (such as exponent width and bias) and choose a corresponding mode that guides how exponent bits are aligned and added.

Further, the method may describe using a fourth multiplexer to choose between different exponent results produced inside the column cell. For example, the hardware may choose between the full-adder output, the half-adder sum, or a carry-in from a previous stage, and present that as the exponent bit of the primitive product. This flexible selection can provide a mechanism to tune precision and rounding behavior without changing the physical adder network.

Methods disclosed herein may also include sourcing the exponent bit of the weight value directly from a dedicated bitcell inside the column, which can feed that bit to the half adder. This local sourcing may reduce latency and avoid global routing of exponent data, which can be especially useful when many columns are active in parallel. At the same time that the first bitcell is supplying a weight exponent bit to the half adder, the method may allow writing a new exponent bit for a different weight into a second bitcell. This concurrent data path can support overlapping weight updates with ongoing computation, potentially speeding up model reconfiguration, training updates, or multi-tenant usage where different weight sets must be serviced rapidly. Further, some implementations may improve operational speed. For example, a second exponent bit may be written through a bitline shared with the first bitcell, simplifying the array wiring. Sharing the bitline while using different wordlines can reduce global wires and sense amplifiers, saving area and power while still permitting independent operations on the two bitcells. The method may also size the number of bitcells in the column based on the least common multiple of supported exponent bit widths for activations and weights, which can help avoid under-utilized cells and may make the layout scalable as more numeric formats are added.

At the system level, the disclosed technology may be implemented in a compute device that can house the exponent-processing hardware described above, while a mode device provides the control mode based on the selected floating-point formats for activations and weights. This split can allow the compute device to focus on dense, fast arithmetic and the mode device to handle configuration and format-aware control. As a result, the system may perform VMM operations across a range of floating-point formats without per-format hardware duplication, which can be valuable for AI workloads that frequently change precision to optimize speed and power.

Additional aspects of the present technology may be directed to an apparatus that can include a CIM macro with a column cell that may focus on mantissa calculation: logic gates in the column can generate partial products between mantissa bits of an activation and a weight, while an array of full adders may accumulate these partial products into mantissa bits of a primitive product. A mode decoding unit can select an arithmetic mode based on the floating-point formats, and multiplexers may choose which partial products to feed into which full adders. This fine-grained control can allow the same column-cell structure to implement mantissa multiplication for different bit widths and formats without redesigning the underlying logic.

The logic gates that create the partial products may be simple AND gates, which can detect coincident "1" bits in the mantissas of the activation and weight. Using a bank of AND gates can provide a compact way to realize the bit-level multiplication step, and when these gates are driven directly from local bitcells, the design may minimize delay and routing overhead. Before the partial products are generated, the hardware can conceptually add a leading "1" before the most significant mantissa bit of both the activation and the weight. This may effectively implement the implicit leading-one convention of normalized floating-point numbers and allow the mantissa multiplier to operate on a uniform fixed-point representation. Handling the implicit bit inside the CIM macro can reduce the burden on external logic and may keep the multiplications consistent across formats.

The column cell may store all mantissa bits of the weight value in a bank of memory cells local to the column. Keeping mantissas local can ensure that the partial-product logic has constant, low-latency access to weight bits, which may be particularly beneficial in workloads where weights are reused across many incoming activations. Further, each mantissa bit may be stored in its own bitcell, which can directly drive the input of the AND gates or other partial-product logic. This one-to-one mapping can simplify timing and verification, and may allow bit-by-bit updates of weight mantissas without disturbing neighboring bits, improving update granularity. Additionally, the mantissa memory bank may include a further bitcell addressed by a different word-line than a primary bitcell, even though the two can share routing. Using different wordlines may provide flexibility in how and when each bitcell is accessed or updated, supporting pipelined reads/writes or more advanced buffering schemes.

Some implementations may use a plurality of bitcells. A bitcell and a further bitcell can share a bitline, allowing the design to keep the number of bitlines low while still supporting independent access control via different wordlines. This may reduce area and bitline capacitance, thereby helping reduce dynamic power each time mantissa bits are driven or sensed. The further bitcell may store a mantissa bit of a different weight value, enabling interleaving of mantissa bits from multiple weights along the same bitline. This arrangement can be especially useful when the CIM macro supports multiple weight banks, model variants, or time-multiplexed workloads, as it allows the same physical array to host several logical weight sets.

While the first bitcell is providing its mantissa bit to the logic gates for a current computation, the further bitcell may be updated with a new mantissa bit for another weight value. This concurrent access can improve bandwidth for weight updates and help keep the CIM macro busy with computation instead of stalling for writes, which may be important for training or fine-tuning workloads. The number of mantissa bits for activations and weights may be chosen from small sets such as {1, 2, 3, 4}, and the column cell can be sized and controlled to support these possibilities. This may make it easy to deploy different low-precision floating-point formats on the same hardware, letting users trade accuracy for performance and energy efficiency depending on model behavior, without building separate accelerators for each format.

Aspects of the disclosed technology may also be directed to methods for improved VMM calculations. For example, a method may describe how the CIM macro uses logic gates to form partial products between activation and weight mantissas, and then passes those partial products through multiplexers into full adders that can accumulate them into mantissa bits of a primitive product. A mode decoding unit may set the arithmetic mode based on selected floating-point formats and drive multiplexer controls, allowing the same logic structure to support different mantissa widths and rounding schemes. This approach can provide a structured, scalable way to implement mantissa multiplication directly within the memory array.

In one realization of the method, mantissa bits may be fed into AND gates to produce partial products. AND gates can be simple, fast, and small, making them well-suited for dense CIM layouts where many gates must be placed close to bitcells. Additionally or alternatively, the method can account for the implicit leading one by adding a "1" before the most significant mantissa bit of the activation and the weight before generating partial products. This can ensure that normalized floating-point values are represented properly in the fixed-point mantissa space, improving numerical fidelity without requiring extra software-level handling. Mantissa bits of the weight may be stored in local memory cells, and these cells can serve as the source for the partial-product logic. In this way, the CIM macro may reuse stored weights many times while streaming activations, which is beneficial for matrix multiplication where the weight matrix stays constant over many input vectors.

Some of the disclosed methods may store a mantissa bit in one bitcell and then feed that bit directly into logic gates. This direct connection can minimize delay and parasitics, making partial-product timing more predictable and potentially supporting higher operational frequencies. A further bitcell may hold a mantissa bit for another weight value, and the paired bitcells can be controlled by different wordlines while sharing a bitline. The method may use this arrangement to support independent reads and writes, which can be helpful when swapping between weight sets or updating weights during training while other weights are used for inference.

While one bitcell is delivering its mantissa bit to the logic gates, the further bitcell may be updated concurrently with a new mantissa bit. This overlap of update and compute can reduce idle time and help keep the CIM macro fully utilized, which may be especially important for throughput-oriented accelerators. For example, the method may recognize that activations and weights can each have between 1 and 4 mantissa bits, affecting layout and control of the mantissa datapath. Supporting multiple options can allow the hardware to adapt to different numeric schemes—for example, using very low precision for less sensitive layers and higher precision for more sensitive layers. Additionally or alternatively, to support multiple exponent or mantissa widths efficiently, the method may choose the number of bitcells in the column based on the least common multiple across supported configurations. This can simplify layout while ensuring that each format fits cleanly into the same structural pattern.

Moreover, at the system level, a compute device may integrate the mantissa logic gates, full adder array, and multiplexers, while a mode device can provide configuration signals appropriate to the selected floating-point formats. This arrangement may allow the system to treat different mantissa widths and formats as software- or firmware-driven options rather than requiring new silicon, potentially lowering development and deployment costs for future numeric schemes.

Additional aspects of the disclosed technology may be directed to a computing device that can include a CIM macro whose column cell may break exponent processing into specialized blocks: a first half adder may combine the least significant exponent bits of the activation and weight, a second half adder may process one of the most significant exponent bits with carry, and a chain of full adders may handle intermediate exponent bits. By excluding intermediate exponent bits from the half adders, the design can keep the half-adder logic small and focused on boundary cases (LSB and MSB), while using full adders where more complex carry propagation may be needed. This approach may balance hardware cost with the need for accurate exponent sums.

In some implementations, a first half adder may output both an exponent bit of the primitive product and a carry-in for the next full-adder stage. Handling the least significant exponent position in this way can allow the design to tightly control how initial carries are generated, helping keep rounding behavior predictable and reducing the risk of timing issues at the base of the exponent addition chain. Moreover, the second half adder may be configured so that its outputs represent two exponent bits of the primitive product. By dedicating a small, focused block of logic to the most significant exponent position, the hardware may handle overflow scenarios and upper-end rounding precisely, which can be important for maintaining numerical stability across large exponent ranges. The full-adder chain can process intermediate exponent bits and produce exponent bits and carry signals for subsequent stages. This linear chain may scale with exponent width, allowing the same pattern to be reused for different numeric formats and making physical design more regular.

Moreover, the column cell may include multiple memory cells storing exponent bits of the weight value adjacent to the exponent adders. Localizing exponent storage can reduce wiring complexity and allow exponent bits to be fed to the adders in parallel across many columns, which may be particularly beneficial when an entire row or block of weight exponents must be accessed simultaneously. For example, each exponent bit may be stored in a bitcell wired directly to the appropriate adder stage (whether the first half adder, second half adder, or a full adder) depending on its bit position. This direct connection may simplify control and improve signal integrity.

Further, some aspects may improve hardware flexibility by introducing an exponent memory bank that includes a further bitcell addressed by a different wordline than a primary bitcell, thereby allowing independent access. This supports scenarios where different weight sets or exponent patterns may need to be used at different times, while still leveraging shared bitline routing to keep the array compact. For example, even though the bitcell and the further bitcell may be addressed independently, they can share a bitline, reducing vertical routing and associated capacitance. Additionally, the further bitcell may store an exponent bit for another weight value, meaning the same physical column can host exponents for multiple weights. This feature may be useful for multi-model or multi-tenant scenarios, or for double-buffering weight values so that one set may be updated while another is used for active computation.

The disclosed technology may also improve calculation efficiency. For example, while one bitcell is feeding its exponent bit into the adder chain, the further bitcell may be updated with a new exponent bit of a different weight. This concurrent behavior can allow maintenance or training operations to proceed on one set of weights while another set is used for inference, potentially increasing throughput and reducing downtime. The method for producing a product may describe how the least significant and most significant exponent bits are handled using half adders, while intermediate exponent bits are processed by full adders. By keeping intermediate bits out of the half adders, the method may focus the half adders on positions where carry and overflow behavior are most critical, simplifying design and verification of the exponent path.

In some aspects, the disclosed technology may permit implementation of exponent-calculation methods that are more efficient or less computationally intensive. For example, a disclosed method may use half adders to generate two exponent bits at the upper end of the exponent range, capturing behavior at the top end of the dynamic range. Handling this case with a half adder rather than a full adder may reduce gate count and potentially reduce critical-path delay. Similarly, intermediate full adders may output exponent bits and carry signals feeding subsequent full adders or the second half adder. By storing exponent bits of the weight value in column-local memory cells, making them immediately available, the design may improve performance during heavy AI workloads that require exponent operations across wide arrays.

For example, one exponent bit may be stored in a bitcell and delivered to the first half adder, second half adder, or a full adder depending on its exponent position. A further exponent bit may be stored in a second bitcell that can share a bitline with the first bitcell while being addressed by a different wordline, enabling independent access. This arrangement may support efficient packing of multiple exponent streams. In some embodiments, while the first bitcell drives its exponent bit into the exponent path, the further bitcell may update its stored bit concurrently, which may be useful for preparing future weights while current computation is underway. This concurrency can help keep the exponent datapath fully utilized, supporting high-throughput training and inference.

Some devices in the disclosed technology may include a mode decoding unit that can determine how many full adders are needed based on the number of exponent bits in an activation or weight. This makes the exponent chain adaptable: smaller exponent widths may use shorter chains to save area and power, whereas larger exponent widths may enable longer chains to support greater dynamic range.

Further, a processor may be coupled to a compute device containing the exponent chain and CIM column cells. The processor can orchestrate high-level scheduling and control tasks while the compute device handles dense, low-precision exponent arithmetic. This separation may allow systems to run AI workloads more efficiently by offloading fine-grained numeric operations to specialized hardware.

Additional aspects of the disclosed technology may be directed to a hardware accelerator that can include a CIM macro whose column cell uses logic gates to generate exponent-dependent bits that are inserted just before the mantissa of the activation and weight. A first logic gate may operate on exponent bits of the activation, and a second logic gate may operate on exponent bits of the weight, producing output bits that can be prepended to mantissas. Additional logic gates may then form partial products between these "extended" mantissa bit vectors. This arrangement can encode some exponent behavior into the mantissa path, potentially simplifying downstream exponent handling and enabling more compact floating-point operations.

The logic gates may be simple AND gates, which can directly compute the bitwise products of the extended mantissas. Alternatively, the logic gates may be OR gates, combining exponent bits to generate a single output bit for each operand. For example, the OR of exponent bits might indicate whether the value is nonzero or whether it lies within a particular range, and this signal can be used to adjust the effective mantissa magnitude, potentially reducing complexity in the exponent-range logic. An array of full adders arranged in rows and columns may collect the partial products generated by the third logic gates and sum them into mantissa bits of the primitive product. This structure may resemble a classical multiplier array and can take advantage of the regularity created by the extended-mantissa representation, thereby improving layout and timing. The number of full adders in each row can scale with the mantissa width of the activation, ensuring that the array may grow appropriately as more mantissa bits are supported. This proportional scaling can allow designers to trade precision against area. Similarly, the number of rows of full adders may scale with the mantissa width of the weight.

In some implementations, in a first or primary row of an array, each full adder may receive two partial products and a carry-in from a previous full adder in the same row. This pattern can support efficient horizontal propagation of carries, potentially reducing critical-path length through the array. Further, full adders may receive a partial product, a carry-in from the same row, and an output bit from an upper row. This combination of vertical and horizontal contributions can allow the array to combine partial products effectively into a mantissa result while preserving layout regularity.

Additionally, in some systems of the disclosed technology, a mode decoding unit may be included to set an arithmetic mode for the CIM macro based on floating-point formats of the activation and weight. This can allow logic for generating exponent-related bits and selecting partial products to be tuned to different numeric schemes, making the accelerator more versatile. For example, a column cell may use a memory structure with two bitcells sharing a bitline but addressed by different wordlines, where the first bitcell may provide a mantissa bit for one weight and the second may store and update a mantissa bit for another weight. This can allow the same physical storage to support both active computation and background updates, improving memory efficiency and enabling rapid switching between weight sets.

Some aspects of the disclosed technology may be directed to methods for producing a product using this scheme. The method may begin by generating exponent-derived bits for both activation and weight, then insert these bits before the mantissa, and generate partial products between the extended mantissas. This process can encode some exponent information into the mantissa multiplication itself, potentially reducing the amount of separate exponent processing required and leading to faster or more compact implementations. In the method, the partial products may be generated by AND gates acting on the extended mantissas. This simplicity can help when scaling across many columns or when operating at high frequencies. The method may also use OR gates for the first and second logic gates, which combine exponent bits into single signals that are prepended to the mantissas.

In some of the disclosed methods, partial products may be summed by an array of full adders to produce the mantissa bits of the final product. This structured reduction can be highly pipeline-friendly, which may support high throughput in AI workloads. Further, the number of full adders per row can be configured to be proportional to the number of mantissa bits in the activation, ensuring scalable support for wider mantissas. Likewise, the number of rows may grow with the mantissa width of the weight, offering a clean trade-off between precision and hardware cost. The method may have full adders in the first row receive two partial products and a carry-in from a prior full adder, mirroring classical row-adder designs. This arrangement can help keep the combinational depth manageable while still collecting partial products in a structured fashion.

In some implementations, full adders may combine a partial product, a carry-in, and an output from an upper row, finishing the summation of all partial products into the final mantissa. This can allow the full array to compress the partial-product space into a single result vector while maintaining high utilization of each adder. Methods may also involve a mode decoding unit that sets the arithmetic mode based on floating-point formats, and may use dual bitcells sharing a bitline to store mantissa bits for different weights.

The described apparatus and method may also be included in systems with improved computation capability. For example, a compute device may incorporate the logic-gate structure for exponent-derived bits and for mantissa multiplication. By inserting exponent-related bits before the mantissa and using compact logic and full-adder arrays, the system may perform many low-precision multiplies in parallel with good numerical behavior and modest area, making it well-suited for large AI workloads.

Some aspects of the disclosed technology may also be directed to a computing system that can employ a CIM macro with columns of computing units, where each column cell generates a primitive product in floating-point form and a functional block aligns the mantissa bits of these products before they enter an adder tree. By aligning mantissas based on their exponents and then converting the accumulation path to an integer format, the design may allow many floating-point products to be summed efficiently using standard integer adders while still preserving exponent relationships. This can improve throughput and may simplify the adder-tree design.

The disclosed functional block may include a unit that computes a shift value for each primitive product by comparing its exponent to a maximum exponent for the column. Using a centralized shift calculation can simplify control logic needed to align mantissas and may ensure that each product is shifted correctly relative to the largest exponent. Further, a shift register within the functional block may hold a number of bits equal to the maximum exponent plus the mantissa width, providing sufficient space to encode aligned mantissas. Storing mantissas in such a register can separate alignment from accumulation, making it easier to pipeline and schedule computation. Additionally, a multiplexer may feed either mantissa bits or zeros into the shift register, effectively shifting the mantissa according to the expected position.

In the disclosed systems and apparatuses, the shift-calculation and select-decoding unit may decode the shift value into explicit control signals for the multiplexer. This decoding can support a wide range of shift values while keeping individual multiplexers simple. Further, functional blocks may use a tree of multiplexers arranged in a logarithmic structure to perform shifting, where outputs from an upper row feed into a lower row and reduce the number of stages needed compared to linear structures. In each row of the tree, multiplexers may choose between the output of an upper multiplexer and zero, allowing blanking of certain bit ranges. Other multiplexers may select between outputs of two upper multiplexers, permitting construction of larger shifts from smaller ones.

In some implementations, multiplexers in the same row may be controlled by a particular bit of the shift value, so that each row handles one binary digit of the shift. This binary shift control can make it straightforward to support arbitrary shifts within a defined range using only $\log_2(N)$ rows, where N is the maximum shift extent, thereby keeping the hardware compact. Further, the functional block may include logic that computes the two's complement and sign of the shifted mantissa bits before they enter the adder tree. Handling sign and negation locally can allow the adder tree to operate on a unified integer representation, simplifying the design of the reduction network and enabling support for both positive and negative contributions.

Some aspects of the disclosed technology may also be directed to a method for aligning mantissa bits. The method may outline how a maximum exponent is determined, how each product's shift value is computed, and how mantissas are shifted before entering the adder tree. This alignment can ensure that all contributions are represented on a consistent scale, which may be crucial for maintaining accuracy when summing many floating-point products. For example, before applying the computed shift, the method may move the mantissa bits to the most significant positions of a first shift register sized to the maximum exponent plus the mantissa width. This initial placement can form the basis for later shifting toward the least significant bits and may ensure that sufficient headroom exists for all alignment operations.

Additionally, in some disclosed methods, mantissas may be shifted toward the least significant bit side of the register by the shift value, effectively normalizing their positions. Shifting can be implemented by a multiplexer that chooses whether to insert mantissa bits or zeros at different positions, depending on the shift value. A decoding step may interpret the shift value into specific multiplexer control signals, translating the numeric exponent differences into particular wiring choices for the mantissa bits.

Disclosed methods may also use a logarithmic multiplexer tree, where each row handles a power-of-two component of the shift. For example, multiplexers in each row may optionally select zeros or upper-row outputs, enabling large shifts to be constructed through a small number of stages. Multiplexers may also combine outputs from different upper-row multiplexers to compose more complex shift patterns. Further, multiplexers in each row can receive control from the corresponding bit of the shift value, allowing the shifting operation to directly reflect the binary representation of the desired shift.

At the system level, a computing device may deploy multiple columns of computing units with a shared functional block and adder tree. The functional block handles exponent-based alignment and sign computation, while the adder tree accumulates the aligned mantissas into integer results. This architecture can provide scalable, high-throughput accumulation of many floating-point products while keeping the hardware complexity relatively low.

Additional aspects of the present disclosure may be directed to an apparatus that includes a CIM macro in which each column cell has two sets of bitcells and wordlines: one set storing a first weight value and the other storing a second weight value. A weight-select signal can allow the macro to perform a write operation into one set of bitcells while simultaneously using the other set for VMM computation. This form of parallelism may allow the system to update or preload weight values without pausing the primary compute operation, thereby improving utilization.

For example, a bitcell in the first set may share a bitline with its counterpart in the second set, reducing the number of horizontal wires and drivers. Alternatively or additionally, the column cell can include a weight-output multiplexer that selects whether the VMM computation sees output from a bitcell in the first set or from a bitcell in the second set. The weight-output multiplexer may be driven by the complement of the weight-select signal, ensuring that the set being written is not used for computation.

Further, the arrangement of multiplexers may be configured to improve operations. For example, a first weight-select multiplexer may be controlled by a scan-enable signal to choose between a normal bitline input and a scan input for the first bitcell. A second weight-select multiplexer, also controlled by the scan-enable signal, may select either the bitline signal or the output of the first bitcell as the input to the second bitcell. This arrangement can enable propagation of scanned-in data or cloned weight values from one bitcell to another along a scan chain, thereby improving DFT coverage.

Further, a first set of bitcells may implement their storage using a first latch, while the second set uses a second latch, providing separate storage elements for each weight bank. Different latch sets may be optimized for write timing versus read timing, or may support double-buffering of weights, improving throughput for time-varying models. For example, a weight-address decoder may generate separate wordline signals for the first and second sets based on both a weight address and the weight-select signal.

The apparatus may be arranged so that write operations go to the first set of bitcells when the weight-select signal is low, and to the second set when the signal is high. This simple two-phase scheme can allow software or hardware pipelines to schedule writes and compute phases with minimal control complexity. The CIM macro may adjust the setup time of the weight-select signal so that both writing and VMM operations can occur within the same clock cycle, taking advantage of different timing phases.

In some embodiments, write methods for the disclosed structure may include using a weight-address decoder to produce wordline signals for both sets of bitcells based on a weight-select signal, and placing the weight value on the shared bitlines. An inverted weight-select signal may drive weight-output multiplexers so they present either the first or second bitcell outputs as needed. Alternatively, an inverter may generate the inverted weight-select from the original input, simplifying control logic. This small logic element can help ensure a tight relationship between which bank is being written and which bank is being read, making it easier to reason about active weights.

Further, disclosed methods may use a set of first weight-select multiplexers, controlled by a scan-enable signal, to feed either weight bits or scan-chain data into the first set of bitcells. Similarly, a set of second weight-select multiplexers may route either weight values or outputs of the first set of bitcells into the second set. This can enable operations such as copying an entire bank from one set to another, or shifting scan data across both banks during test routines.

In some implementations, the method may include operations indicating that the first and second sets of bitcells can be implemented with separate latches, providing isolation and flexibility between the banks. For example, generation of wordline signals may involve decoding a weight address via the weight-address decoder to help ensure that a single address can drive appropriate lines in both banks.

The method may write the weight value to the first set of bitcells when the weight-select signal is low and to the second set when the signal is high. This pattern can enable simple time-multiplexing between banks, making it straightforward to schedule writes while avoiding conflicts. Further, the weight-output multiplexers may choose outputs from the first set of bitcells when the weight-select signal is high and from the second set when it is low, ensuring the compute side sees a stable bank opposite the one being updated. Additionally or alternatively, outputs selected by these multiplexers may be used by the CIM macro to perform VMM operations while a write operation occurs in the other bank. Adjusting the setup time of the weight-select signal can align these activities within a single clock cycle, potentially improving throughput without sacrificing correctness.

Moreover, in some implementations a computing device may implement this two-bank column-cell scheme and perform parallel write and VMM operations based on the weight-select signal. This can provide system designers with a powerful mechanism to hide weight-update latency behind ongoing computation, supporting dynamic model updates, weight streaming, or multi-phase compute schedules.

Some aspects of the disclosed technology may be directed to an apparatus that includes a CIM macro that performs tensor operations while storing weight bits in a structure also amenable to scan-based testing. A first bitcell may store a bit of one weight, and a second bitcell may store a bit of a different weight, with the first's output feeding the second's input to form part of a scan chain. Multiplexers may select whether each bitcell's enable signals derive from normal wordline/weight-update signals or from a dedicated scan clock. This dual-purpose design can allow the same memory cells to serve both compute storage and scan-test roles, improving test coverage and reusing circuitry. A mode signal may drive both multiplexers, placing the bitcells into either functional or scan mode. In scan mode, the bitcells can form a chain that shifts data using the scan clock, enabling observability of internal states and facilitating defect detection in dense CIM arrays.

In some implementations, the multiplexers may be wired so their inputs are selected based on the mode signal, switching between functional signals (wordline, weight update) and scan signals (scan clock) as needed. This selective routing may provide precise control over when bitcells respond to normal versus test operations, preventing interference and ensuring clean test behavior. Additionally, when the mode signal indicates functional operation, the first multiplexer may pass the wordline signal to the first bitcell, and the second multiplexer may pass the weight-update signal to the second bitcell. This can preserve the functional timing needed for normal reads and writes, so that test structures do not degrade weight-access performance.

Further, disclosed systems and apparatuses may control multiplexers to improve read/write operations. For example, when the mode signal indicates scan mode, both multiplexers may route the scan clock signal to the control inputs of their respective bitcells. This enables the bitcells to advance their contents in lockstep with the scan clock, forming a shift-register chain usable for loading, observing, or diagnosing internal states. In some embodiments, each bitcell may include a latch with an enable input, and the multiplexer outputs may connect directly to these enables. Driving latch enables through multiplexed sources may allow shared latch architectures for both compute and scan-shift operations.

For example, in scan mode, the first and second bitcells can form a segment of a longer scan chain traversing many bitcells down a column. The wordline signal may be an inverted wordline that enables writing when asserted, ensuring that the scan and normal-write functions share the same physical latch but operate under different control conditions. The scan clock signal can remain physically and logically separate from wordline and weight-update signals to avoid unintended interactions and simplify timing closure. Because the scan clock is active only in scan mode, its routing may be optimized for test, while performance-critical signals remain optimized for compute.

In certain implementations, a column of memory may include many first and second bitcells whose outputs and inputs form a scan path traversing the column. This arrangement may allow designers to observe or control every stored bit through a single scan chain, improving test coverage without disrupting dense bitcell packing. In such embodiments, a third multiplexer may select between a normal bitline signal and a serial scan input as the data source for the first bitcell based on the mode signal. This enables scan data to be shifted directly into bitcells, bypassing normal bitline drivers when entering scan mode for improved controllability.

Some disclosed embodiments may also be directed to a system that includes a processor and memory that implement scan-enabled bitcells and multiplexers. The processor may interact with the memory for both normal tensor operations and test sequences, using the mode signal and scan clock to place the memory into a test state when needed, simplifying manufacturing diagnostics and field service. Further, memory multiplexers may be tied to a mode signal that, when asserted, connects bitcells as a scan chain. This can allow test features to activate only when necessary, keeping power overhead minimal during typical operation. Multiplexers may further be configured to select between functional and scan inputs, providing strong separation between computation and test phases and helping prevent unintended interaction between scan wiring and compute logic.

Moreover, the mode signal may distinguish functional versus scan operation, simplifying control logic. A single control bit per block may suffice to switch the memory between high-throughput compute and deep scan-test modes. For example, in functional mode, the first multiplexer can deliver the wordline signal to the first bitcell, and the second multiplexer can deliver the weight-update signal to the second bitcell. This arrangement preserves weight read/write performance with no penalty for including scan structures. Alternatively or additionally, in scan mode, both multiplexers may pass the scan clock to their respective bitcells, enabling synchronized shifting. This can make it straightforward to propagate data through long chains for systematic reading or writing of internal states.

In some implementations, each cell may include a latch driven by the multiplexer outputs, ensuring that both functional and scan operations use the same storage elements. The system may be arranged so that the first and second cells form a portion of a scan chain whenever the scan clock toggles in scan mode. Additionally, scan clock signals may be routed separately from wordline and weight-update lines so that the scan clock does not share the load or fan-out associated with performance-critical signals. This separation can simplify signal-integrity and timing closure for both compute and test paths.

Some of the disclosed methods may improve system computations by writing different weight bits into first and second cells, using a mode signal to switch between functional and scan modes, and controlling multiplexers so that either functional signals (wordline, weight update) or scan-clock signals drive the cells. While in functional mode, the device may perform tensor operations using stored data; when scan mode is selected, the same cells may serve as scan-chain elements for test and debug. This dual-use design can yield high compute density and robust testability with minimal overhead.

FIG. 1 illustrates a block diagram of an example of a compute engine 100, in accordance with some aspects of the present technology. Compute engine 100 can be an apparatus, a system, a computing system or a computing device, which includes a hardware accelerator such as a GPU (graphics processing unit), a TPU (tensor processing unit), an FPGA (field-programmable gate array) and an ASIC (application-specific integrated circuit). The compute engine 100 can be used to perform operations using data in floating point formats such as a single-precision floating point format with 32-bit (FP32), or using data in integer formats such as an unsigned 5-bit integer (uINT5) or a 35-bit integer with positive or negative sign (INT35). The compute engine 100 can also be a low bit width (i.e., lower precision) floating point compute engine, configured to handle floating point data with 4 bits (FP4), 6 bits (FP6), 8 bits (FP8), 22 bits (FP22), etc.

In some embodiments, compute engine 100 can include a compute-in-memory (CIM) macro 101 configured to perform operations for tensors. A tensor refers to a multidimensional data array, which includes a scalar, a vector, or a matrix in two or more number of dimensions. In a neural network, a tensor can be used as the primary data structure to present and manipulate data for inputs, outputs, weights, biases, activation functions, etc. An operation for tensors can include multiply and accumulate (MAC) operations. For example, CIM macro 101 can support a Vector Matrix Multiplication (VMM) operation between a vector of activation values and a matrix of weight values.

In some examples, the activation values arranged in a format of a vector can present an activation function used in the neural network, while weight values are arranged in a format of a matrix and each weight value can present a weight used in the neural network. In the example shown in FIG. 1, a plurality of activation values can be represented by a vector, e.g., 1×32 vector having 32 elements labeled as Act 0 to Act 31, and an array of weight values can be represented by a matrix, e.g., a 32×32 matrix having 32×32 elements labeled as Weight 0 to Weight 31 for each row.

In some embodiments, CIM macro 101 can perform tensor operations for data in microscale floating point (MXFP) format, where streaming operand (e.g., activation values) and stationary operand (e.g., weight values) can have low-bit widths. An example of data formats used in the compute engine 100 is outlined in Table 1 below. The streaming operand provided to CIM macro 101 can be represented in FP8, FP6 or FP4 format and the stationary operand stored in CIM macro 101 can be represented in FP6 or FP4 format.

In the example of FIG. 1, activation values are in FP8 format and weight values are in FP6 format. Reduced precision formats (i.e., reduced bit widths) can greatly increase computation speed and lower memory usage with minimal loss in accuracy, and thereby greatly improve the latency and throughput of a deep learning process in a neural network.

TABLE 1

| Mode of opera-tion | Streaming Operand Datatype to the CIM | Stationary Operand Datatype in the CIM | Shifted mantissa output from the CIM | Exponent output (Emax) from the CIM | Output Datatype from the compute engine |
|---|---|---|---|---|---|
| 1 | FP8 (1-4-3) | FP6 (1-3-2) | INT35 | INT5 | FP22 (1-8-13) |
| 2 | FP8 (1-4-3) | FP4 (1-2-1) | INT35 | INT5 | FP22 (1-8-13) |
| 3 | FP6 (1-3-2) | FP6 (1-3-2) | INT35 | INT5 | FP22 (1-8-13) |
| 4 | FP6 (1-3-2) | FP4 (1-2-1) | INT35 | INT5 | FP22 (1-8-13) |
| 5 | FP6 (1-2-3) | FP6 (1-3-2) | INT35 | INT5 | FP22 (1-8-13) |
| 6 | FP6 (1-2-3) | FP4 (1-2-1) | INT35 | INT5 | FP22 (1-8-13) |
| 7 | FP4 (1-2-1) | FP6 (1-3-2) | INT35 | INT5 | FP22 (1-8-13) |
| 8 | FP4 (1-2-1) | FP4 (1-2-1) | INT35 | INT5 | FP22 (1-8-13) |

Data in a floating point format can include three parts: sign(s), exponent (e), and mantissa (m), where the sign indicates if the data is positive or negative, and the exponent and mantissa determine the value of the data in a scientific notation of $s \times m \times 2^e$ in the binary data system. Floating point data may be labeled as FPn $(n_s - n_m - n_e)$, where n represents a total number of bits of the floating point data, $n_s$ represents the number of bits used for the sign, $n_m$ represents the number of bits used for the mantissa and $n_e$ represents the number of bits used for the exponent. For example, FP8 (1-4-3) can represent an 8-bit floating point having 1 bit in sign, 4 bits in mantissa and 3 bits in exponent.

CIM macro 101 can be a hardware component of compute engine 100, where computations (e.g., VMM operations) can be directly performed within a memory array to minimize data movement. This architecture is beneficial for accelerating AI workloads like deep learning by reducing the von Neumann bottleneck. CIM macro 101 can be any suitable compute device or computing device having a memory array, which may include any suitable non-volatile memory such as static random-access memory (SRAM), NAND flash memory, NOR flash memory, or resistive random-access memory (ReRAM), to store stationary operand (e.g., weight values). CIM macro 101 also includes various circuits and devices to perform computations within CIM macro 101. In some embodiments, CIM macro 101 can be a digital CIM macro configured to perform calculations using digital logic (like bit-wise operations). The digital CIM macro can provide higher precision and reliability. In some embodiments, CIM macro 101 can be an analog CIM macros configured to perform calculations in the analog domain, which can be more energy-efficient but more susceptible to noise and process variations.

FIG. 1 depicts an exemplary block diagram of CIM macro 101, showing interfaces (dashed lines) for receiving stream-ing operand (e.g., activation values) and stationary operand (e.g., weight values) across the boundaries of the compute engine 100 and outputting computation results to other electronic components in the compute engine 100.

Figure 2:
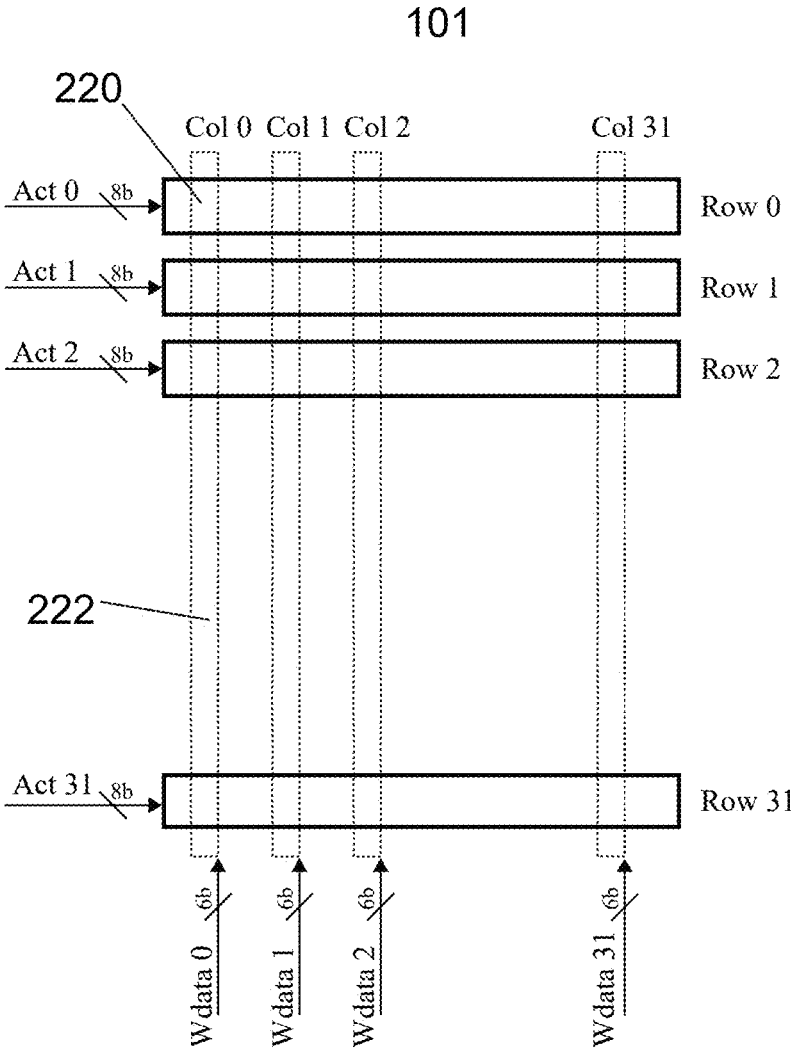
FIG. 2 illustrates a representation of a block diagram of an example compute-in memory (CIM) macro, in accordance with some aspects of the present disclosure.

To show an example, FIG. 2 illustrates a possible imple-mentation of CIM macro 101. As shown in FIG. 2, the CIM macro 101 includes columns of computing units 222, where each column of computing unit 222 includes rows of column cells 220. The number of columns of the computing units 222 and the number of rows of the column cells 220 correspond to the number of elements $N_E$ in the vector of activation values. In the example of FIGS. 1 and 2, the activation values have 32 elements (Act 0, Act 1, Act 2, . . . . Act 31) and are represented by an 1×32 vector. In this example, there can be 32 columns (Col 0, Col 1, Col 2, . . . . Col 31) of computing units 222, where each column of computing unit 222 has 32 rows (Row 0, Row 1, Row 2, . . . . Row 31) of column cells 220.

Each column of computing unit 222 in the CIM macro 101 drives a dot product operation during an VMM operation. To produce a dot product Dot_P$_k$ between a row vector of activation values (a$_i$, i=0, 1, 2, . . . 31) and a kth column of weight values (w$_{ik}$, k=0, 1, 2, . . . 31), the activation values are multiplied by the weight values in an element-by-element way, followed by a sum of primitive products P$_{ik}$=a$_i$w$_{ik}$, i.e., Dot_P$_k$=$\Sigma_i$ P$_{ik}$=$\Sigma_i$ a$_i$w$_{ik}$=a$_0$×w$_{0,k}$+a$_1$×w$_{1,k}$+a$_2$× w$_{2,k}$+ . . . +a$_{31}$×w$_{31,k}$. Here, the vector of activation values has 32 element (i.e., N$_E$=32). In this example, a kth column of computing unit 222 in the CIM macro 101 performs the dot product operation to output the dot product Dot_P$_k$. In the kth column of computing unit 222, a column cell 220 of ith row is configured to perform the multiplication operation between the activation value a$_i$ and the weight value w$_{ik}$ to output the primitive product P$_{ik}$=a$_i$×w$_{ik}$.

Figure 3:
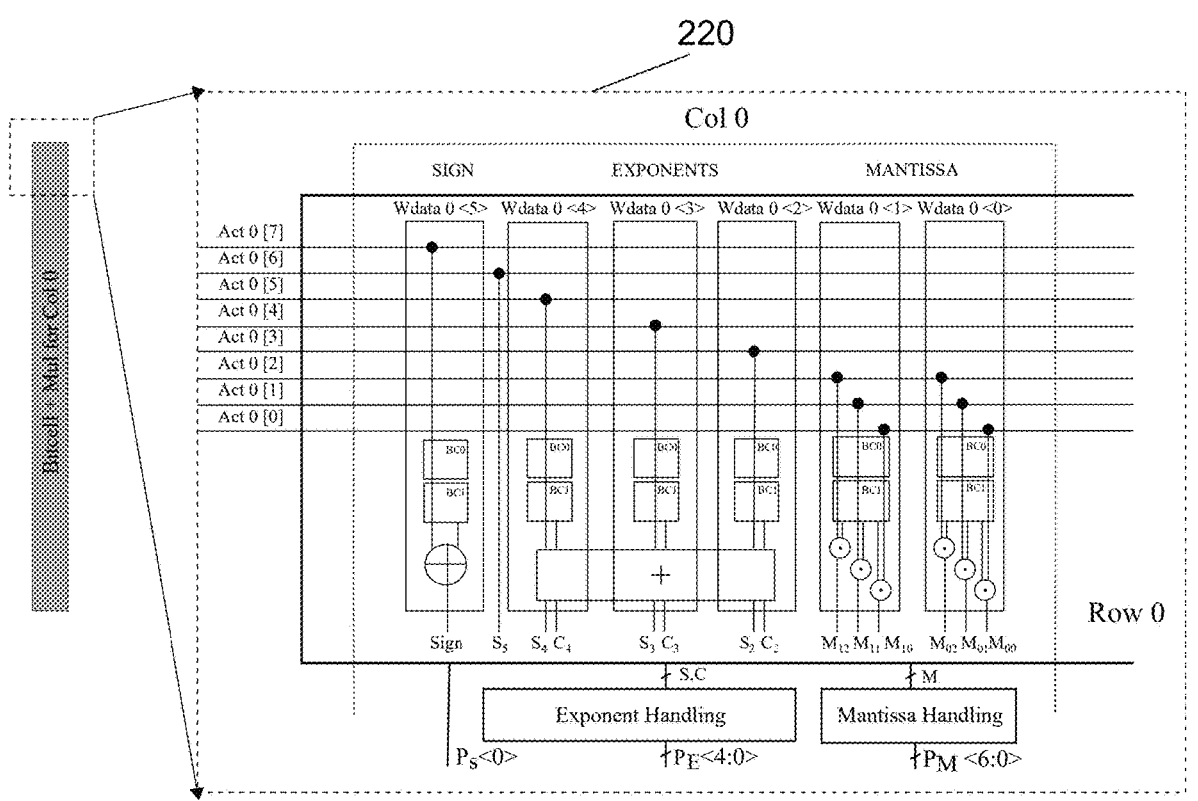
FIG. 3 illustrates an exemplary column cell in the CIM macro, in accordance with some aspects of the present disclosure.

FIG. 3 illustrates a block diagram of an exemplary column cell 220 configured to produce a primitive product between an activation value and a weight value. The exemplary column cell 220 in FIG. 3 is in Row 0 and Col 0 of the CIM macro. Besides column cells 220, each column of the computing unit in the CIM macro 101 includes circuits and devices configured to align up mantissas of the primitive products P$_{ik}$ and an adder tree 426 configured to perform the addition of the primitive products P$_{ik}$ to produce the dot product Dot_P$_k$. For computation between 1×32 activation values and 32×32 weight values, the adder tree 426 can include 32 rows to add the primitive products.

Figure 4:
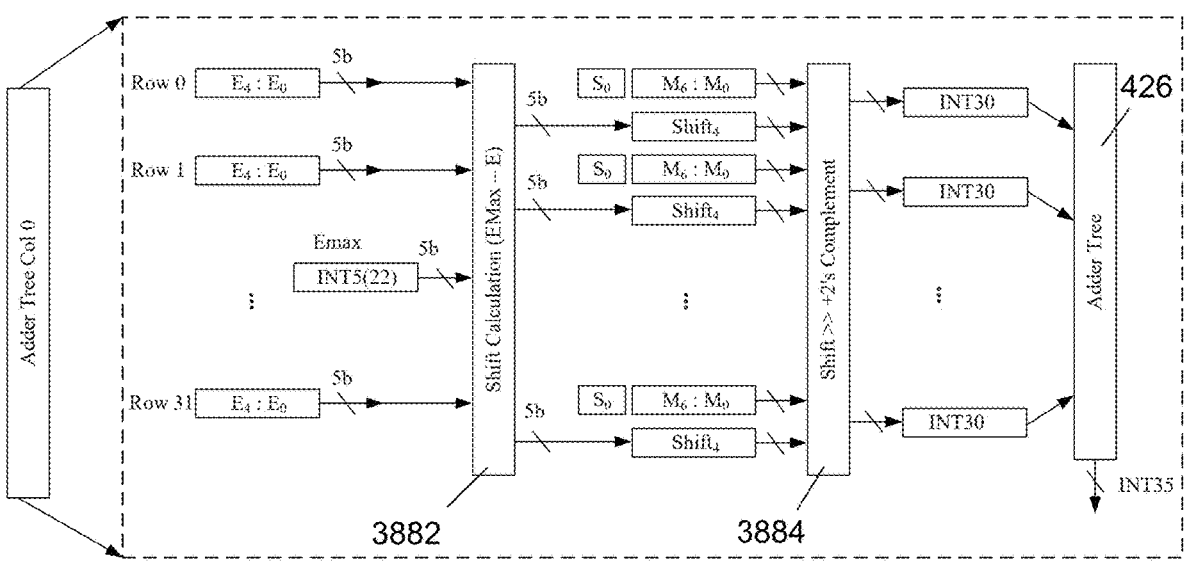
FIG. 4 illustrates a functional block for mantissa alignment in a computing unit for mantissa align-ups and accumulation of primitive products, in accordance with some aspects of the present disclosure.

FIG. 4 illustrates an exemplary functional block for mantissa alignment 3880 in a computing unit that is configured to perform mantissa alignments and accumulations after primitive products have been produced by the column cells. The functional block for mantissa alignment 3880 includes a shift calculation and select decoding unit 3882 and a unit for computing 2s complement and sign 3884. An example of process flow and data flow for mantissa align-ups and accumulation of primitive products is also depicted in FIG. 4.

CIM macro 101 can be organized in rows and columns, where a column direction is the direction of accumulation (i.e. adding the sum of the products). The CIM macro 101 can be grouped into columns (i.e., computing units 222), each column having a width of n bits to hold data of n bits (represented by FPn) and a length of N$_E$ (number of elements) to produce the dot product between a 1×N$_E$ vector and a N$_E$×N$_E$ matrix during the VMM operation. Each column is further organized into two parts: a first part having rows of column cells (including bitcells along with appended logic circuits) that execute an element-wise product in floating point formats (e.g., FP8, FP6, FP4 as shown in Table 1); and a second part having a synthesizable (or custom) adder tree 426 (see FIG. 4) that accumulates the element-wise product in the integer domain (e.g., INT 35 and INT5 in Table 1).

As shown in FIG. 3, a column cell 340, e.g., in Row 0 and Col 0 of the CIM macro 101, includes a plurality of memory cells, each memory cell having two bitcells (BC0 and BC1) to allow performing a write operation and a tensor (e.g., VMM) operation in one memory cell simultaneously. The number of memory cells in the column cell 340 is determined by the number of bits used by the weight value. Each memory cell stores one bit of the weight value. In the example of FIG. 2, the activation value (e.g., Act 0) is in an FP8 format, i.e., having 8 bits labeled as Act 0 <0>, Act 0 <1>, . . . . Act 0 <7> (also referred to as Act 0 <0:7>). The weight value (e.g., Wdata 0) is in an FP6 format, i.e., having 6 bits labelled as Wdata 0 <0>, Wdata 0 <1>, . . . . Wdata 0 <5> (also referred to as Wdata 0 <0:5>). In this example, the column cell 340 in FIG. 3 has 6 memory cells and 12 bitcells to store the 6-bit weight value. For a 1×32 vector of activation values, the CIM macro 101 includes a memory array having 32×192 memory cells to store 32×32 weight values of 6-bits. Namely, the CIM macro 101 includes N$_E$×N$_E$×n number of memory cells for n bits of weight values and a vector of 1×N$_E$ activation values.

Referring to FIG. 1, the CIM macro 101 supports microscale floating point (MXFP) format. A microscale (MX) format is a type of Block Floating Point (BFP) data format specifically designed for AI and machine learning workloads. The MX format may include a block of N$_E$ (e.g., 32) elements, each being d bits long. These elements share a scaling factor of b bits, so that the entire block is b+N$_E$×d bits in size. Unlike traditional floating-point representations that allocate a dedicated scaling factor for each element, MX format employs a shared scaling factor across a block of elements. In the example shown in FIGS. 1 and 2, a length of 32 may be considered as a block size of the CIM macro 101. Each block of weight values and activation values is associated with one scaling factor, which reduces the length of the 32 primitive products and hence the size of the compute engine 100.

The compute engine 100 may be delineated into two parts: the digital CIM macro 101 outlined in red in FIG. 1, and the rest of the computing elements handling control and dequantization of the data. As shown in FIG. 1, the compute engine 100 also includes an input buffer 102. The input buffer 102 receives and stores streaming operand (e.g., the 1×32 vector of activation values) for the CIM macro 101. The streaming operand can be provided from the input buffer 102 to the CIM macro 101 in parallel. In the example of FIG. 1, the 1×32 vector of activation values (Act 0, Act 1, . . . . Act 31) can be provided in parallel to the CIM macro 101.

In some embodiments, the compute engine 100 includes a scale buffer 104, which stores the scaling factor used for quantization of the streaming operand from higher precision FP formats to lower precision FP formats. In some embodiments, quantization of the activation values can be done outside the compute engine 100, where one scaling factor is shared among a block of streaming operand that is operated in the MXFP format. In the example of FIG. 1, activation values in FP8 formats can be output from the input buffer 102 to the CIM macro 101.

As discussed above, weight values are stored in the memory cells of the CIM macro 101. In some embodiments, a second scaling factor can be provided for the weight values by a second scale buffer (not shown in FIG. 1), where quantization of the weigh values can be performed before writing the quantized weight values to the CIM macro 101. In the example in FIG. 1, an array of 32×32 weight values in FP6 formats are stored in the CIM macro 101.

After the dot products of all elements of activation values and weight values are computed, the scaling factor stored in the scale buffer 104 can be fused in a dequantization unit 106 to perform a dequantization process, which reconstructs the dot products from the CIM macro 101 to a higher precision floating point value. In the example of FIG. 1, 1×32 dot products in INT35 and INT5 formats can be provided by the CIM macro 101 to the dequantization unit 106, and can be converted to FP22 format by the dequantization unit 106.

The compute engine 100 also includes an output register 108 to store and output the dequantized dot products (e.g., Accum 0, Accum 1, . . . , Accum 31) for the compute engine 100.

In some embodiments, the compute engine 100 includes a mode decoding unit 110 (also referred to as a mode device) to provide a mode of operation to the CIM macro 101 for the tensor operation between the streaming operand and the stationary operand. Exemplary arithmetic modes supported by the compute engine 100 are listed in Table 1. The arithmetic mode describes the data formats in the streaming operand, the stationary operand, the dot products (including exponents and shifted mantissas) output from the CIM macro 101 and the dequantized dot products output by the output register 108. Mode bits can be passed to the mode decoder unit 110 to provide attributes that delineate which mode arithmetic mode of operation the CIM macro 101 is in. An example of such an attribute is a constant, which is used during the dequantization operation.

The operations performed by the compute engine 100 starts with write operations, where the weight values and the scaling factors are written into the CIM macro 101 and the scale buffer 104, respectively. An interface signal to the CIM macro 101 latches the weight values to the bitcells in the column cells 220. The VMM operation begins by writing the vector of activation values (e.g., having 1×32 elements in MXFP format) into the input buffer 102, kicking off a pipelined and fixed cycle compute sequence. For each block of activation values input to the input buffer 102, one scaling factor (e.g., in uINT8 format) is stored in the scale buffer 104. Activation values in MXFP format (each having, e.g., 8 bits) are fed into the CIM macro 101 in parallel via an interface having, e.g., 32×8=256 bits. Details of the VMM operations performed by the CIM macro is described in the following sections. The CIM macro 101 may return one dot product in a INT35 and an uINT5 formats by each column (of the computing unit) of the CIM macro. Like the compute engine 100, the CIM macro 101 operates in a pipelined fashion, returning a VMM product (i.e., a vector of dot products) every cycle. These integer values of the VMM product along with the activation values and the scaling factors are inputs to the dequantization unit 106 that is responsible for normalizing the VMM product to FP22 format, where results are output by the output register 108. The mode decoding unit 110 can be used to delineate operational modes of the CIM macro 101 and provide mode-dependent bias information to the dequantization unit 106.

Figure 5:
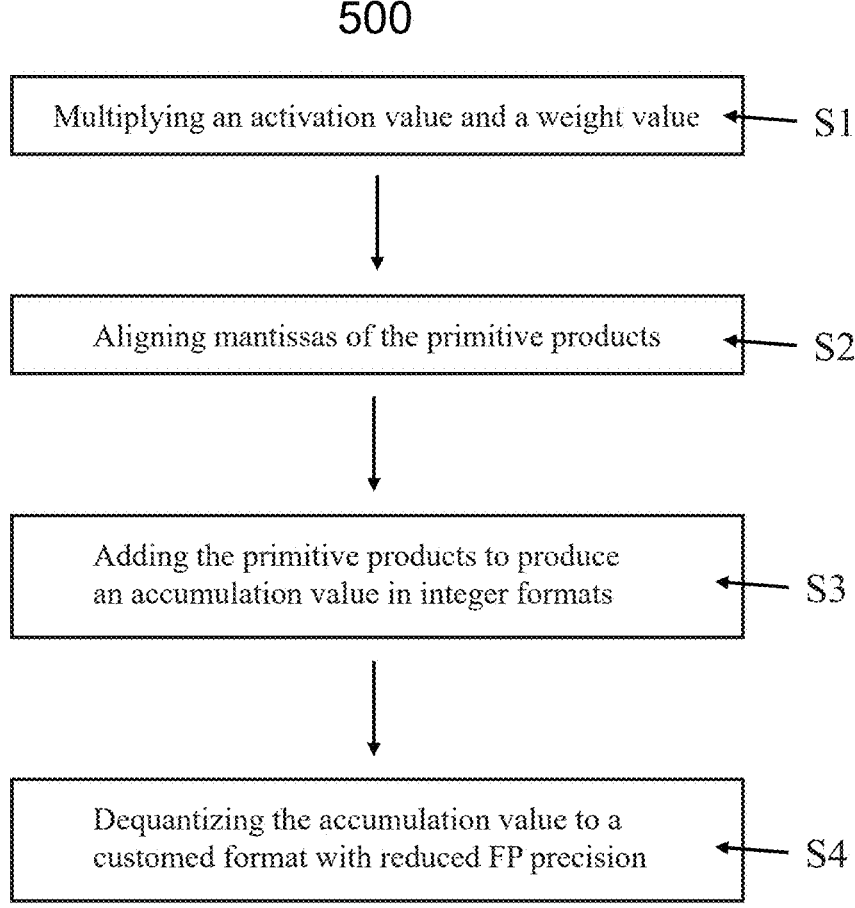
FIG. 5 illustrates a flow of the operations performed by the hardware accelerator, in accordance with some aspects of the present disclosure.

FIG. 5 describes an exemplary process flow 500 of the operations performed by the compute engine 100, which may be carried out as follows:

Step S1: multiplying, by each column cell 220 of the CIM macro 101, a corresponding activation value $a_i$ and a corresponding weight value $w_{ik}$ to produce an element-wise primitive product $P_{ik} = a_i \times w_{ik}$, with specific handling method for the signs, exponents and mantissas of the activation value $a_i$ and the weight value $w_{ik}$.

Step S2: aligning mantissas of all primitive products $P_{ik} = a_i \times w_{ik}$ (i=0, 1, 2, . . . . $N_E$−1) for $N_E$ number of elements of the activation values and weight values in the kth column by shifting of the mantissa bits to convert the primitive products to an integer format.

Step S3: adding, by the adder tree 426 of the kth column in the CIM macro 101, all primitive products $P_{ik}$ (i=0, 1, 2, . . . . $N_E$−1) to produce an accumulation value in integer formats.

Step S4: dequantizing, by the dequantization unit 106, the integer accumulation value to the customed format with reduced FP precision (e.g., FP22).

Table 1 describes data formats used at various stages and supported within an embodiment of the compute engine 100. Table 1 provides datatypes and widths of intermediate values (e.g., shifted mantissa outputs and exponent outputs) used during the translation of the primitive products to integer formats and the integer accumulation in some embodiments. Table 1 describes an example of low bit-width FP arithmetic precisions supported by the compute engine 100 and intermediate values formed/used in the compute engine 100.

In summary, the compute engine 100 admits data in the MXFP format and performs a VMM operation, returning data (dequantized dot products) in a custom precision format (e.g., FP22). While the custom format (e.g., FP22) may have lower precision than standard format (e.g., FP32), the use of reduced precision formats (like FP22) as part of a large computation pipeline allows for faster computation and lower memory usage, which is crucial for accelerating deep learning tasks, often with an acceptable loss of accuracy compared to full precision (e.g., FP32). Additionally, the compute engine 100 can leverage a bit-parallel, fully pipelined design to produce outputs every cycle. Furthermore, the CIM macro 101 can support for a double-buffer scheme (e.g., each memory cell having double bitcells) allowing concurrent loading of the next matrix of weight values while the previous weight values are still in use for the VMM computation. In some embodiments, the compute engine 100 may be tied into a General Matrix Multiply (GEMM) Engine and integrated into a larger SoC (system on a chip). During a steady state operation, the compute engine 100 can execute large GEMM operations with high arithmetic intensities. For example, a single set of weight values may be used for 256 VMM operations before a new set of weight values is needed. In some embodiments, 100% utilization of the compute engine 100 may be possible.

The following sections describe components and operations of CIM macro 101, as well as features facilitated by CIM macro 101. For clarity, components and operations of CIM macro 101 are described in the context of an exemplary column cell (e.g. row 0 and column 0). However, the discussion may be generalized to any column cell in the CIM macro 101.

In the following descriptions, unless noted otherwise, data formats according to mode 1 in Table 1 are used as an example to illustrate how floating point data are managed by the CIM macro 101 during the VMM operation. In mode 1, streaming operand (e.g., activation values) are in FP8 (1-4-3) format and stationary operand (e.g., weight values) are in FP6 (1-3-2) format. In the FP8 (1-4-3) format, the sign is represented by 1 bit, the mantissa is represented by 4 bits and the exponent is represented by 3 bits. Accordingly, the activation value in FP8 (1-4-3) format can be expressed as:

$$(-1)^{Act<7>} \times 2^{Act<6:3>} \times 1. (Act<2:0>).$$

In the above expression, Act<7> is the $7^{th}$ bit or the most significant bit (MSB) of the activation value, determining the sign. Act<6:3> are the $3^{rd}$ to $6^{th}$ bits of the activation value, determining the exponent. Act<2:0> are the $0^{th}$ to $2^{nd}$ bits of the activation value, determining the mantissa. The $0^{th}$ bit is also referred to as the least significant bit (LSB). In a normal FP format, the mantissa is expressed by number 1 followed by the decimal point, where the mantissa bits determine the value after the decimal point.

Similarly, in the FP6 (1-3-2) format, the sign, mantissa and exponent of floating point data are represented by 1 bit, 3 bits and 2 bits, respectively. And the weight value in FP6 (1-3-2) format can be expressed as:

$$(-1)^{Wdata<5>} \times 2^{Wdata<4:2>} \times 1. (Wdata<1:0>).$$

In the above expression, Wdata<5> is the $5^{th}$ bit of the weight value, determining the sign. Wdata<4:2> are the $2^{nd}$ to $4^{th}$ bits of the weight value, determining the exponent. Wdata<1:0> are the $0^{th}$ and $1^{st}$ bits of the weight value, determining the mantissa.

When the FP8 (1-4-3) activation value is multiplied by the FP6 (1-3-2) weight value, the primitive product can be in FP11 (1-5-5) format and can be expressed as:

$$(-1)^{Act<7>\oplus Wdata<5>} \times 2^{Act[6:3]+Wdata<4:2>} \times 1. (Act[2:0]) \times 1. (Wdata<1:0>),$$

where the sign of the primitive product is produced by an XOR operation between the sign bits of the activation value and the weight value and is represented by Act <7>⊕Wdata <5>, the exponent of the primitive product is produced by an addition operation between the exponent bits of the activation value and the weight value and is represented by Act <6:3>+Wdata <4:2>, and the mantissa of the primitive product is produced by an multiplication operation between the mantissa bits of the activation value and the weight value and is represented by 1. (Act <2:0>)×1. (Wdata <1:0>). As a result, the primitive product can have 11 bits, among which there are 1 sign bit, 5 exponent bits and 5 mantissa bits.

Figure 6:
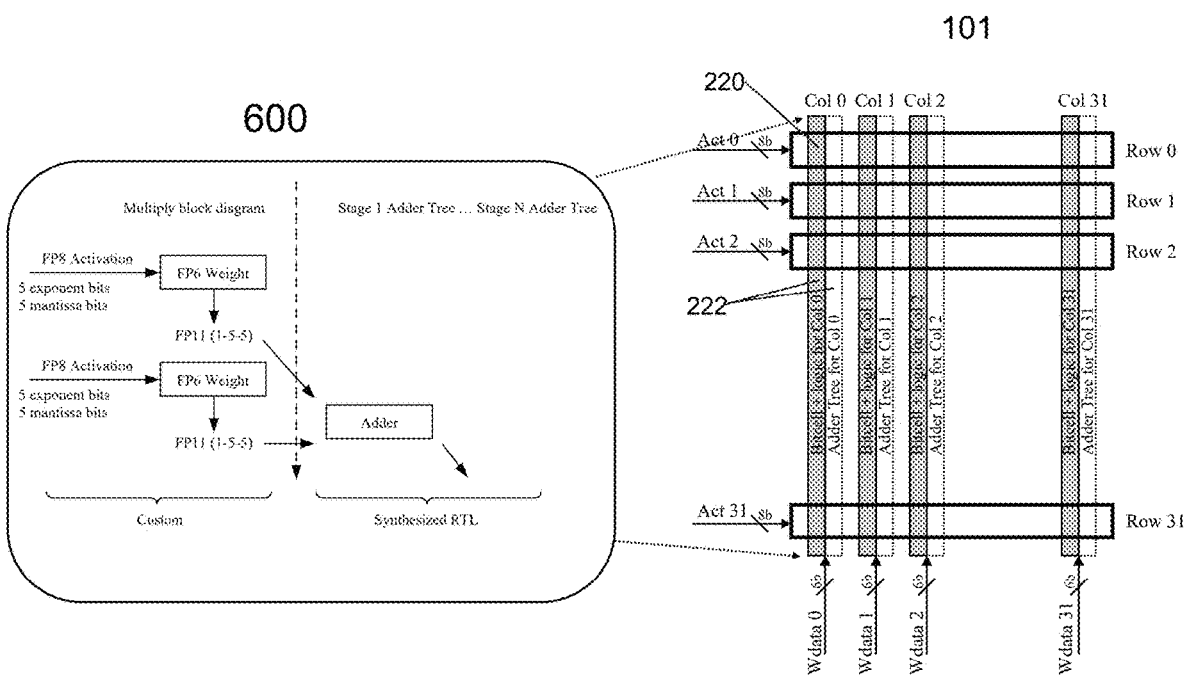
FIG. 6 illustrates a flow of data through one of the columns in the CIM macro, in accordance with some aspects of the present disclosure.

FIG. 6 illustrates an exemplary flow of data 600 through one of the columns in the CIM macro 101. First, each activation value (in FP8 (1-4-3) format) is multiplied by a corresponding weight value (in FP6 (1-3-2) format) in a corresponding column cell 220 to produce a corresponding primitive product (in FP11 (1-5-5) format). These floating formats (FP6, FP8 and FP11) are custom FP formats designed for the CIM macro 101 for fast computation. The primitive products in FP11 (1-5-5) formats are then added up by the adder tree of the column. Data through the adder tree are integers synthesized at a register transfer level (RTL), where the primitive products in floating point format are converted to integers through mantissa alignment using a plurality of shift registers (see below). The adder tree in each column of the CIM macro 101 can have multiple stages. FIG. 6 provides an abstract view of dot product engine (i.e., the column of computing unit 222) delineated separation between custom implementation of data formats and synthesized data formats through the adder tree.

Figure 7:
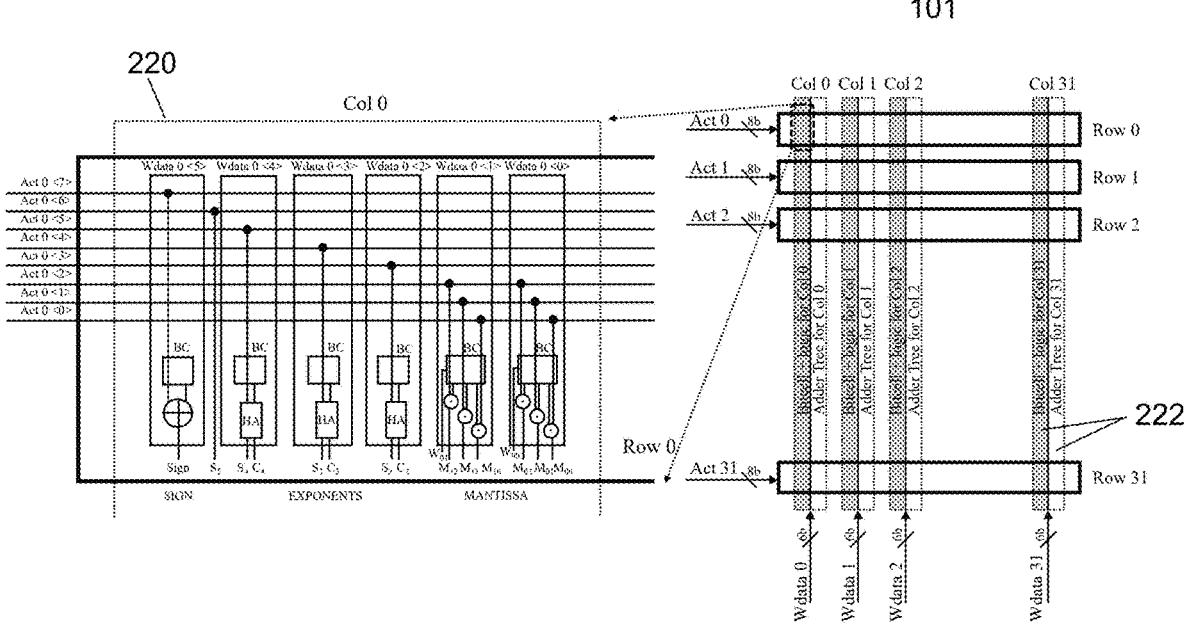
FIGS. 7-8 illustrate an enlarged view of the column cell in the CIM macro, in accordance with some aspects of the present disclosure.
Figure 8:
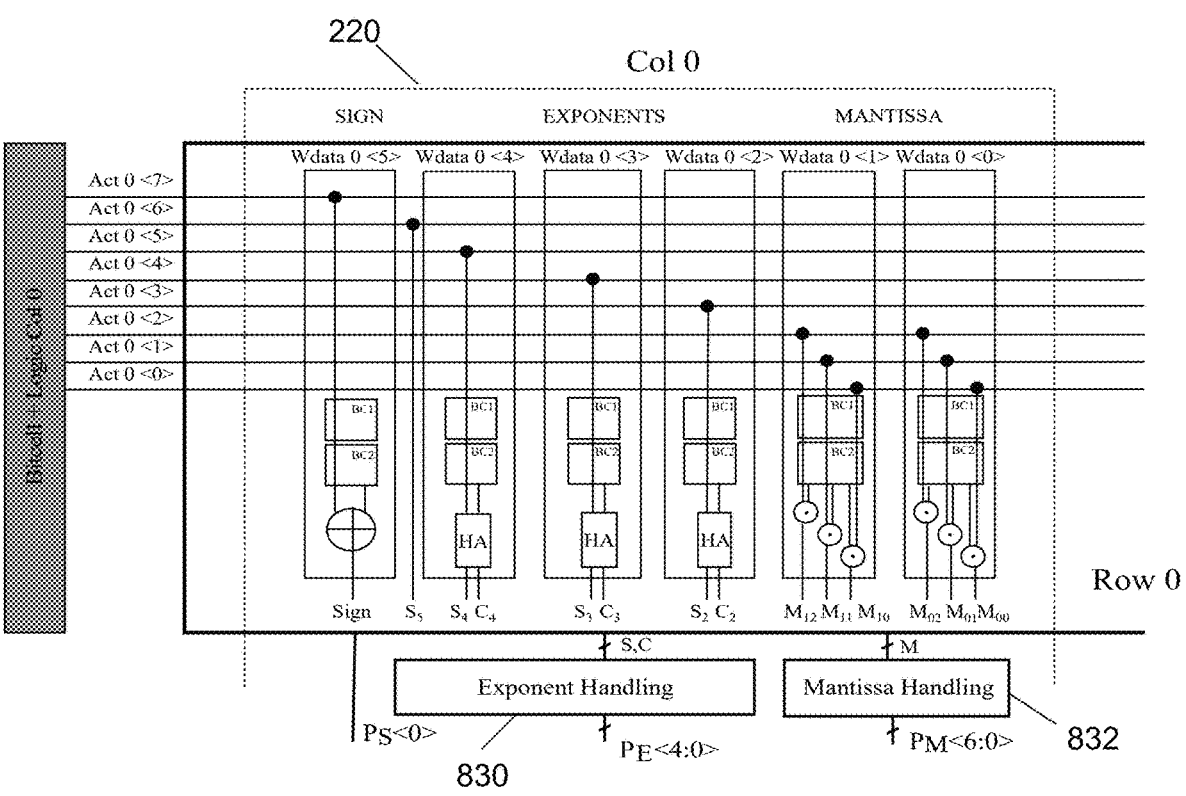

FIGS. 7 and 8 depict enlarged views of exemplary column cell 220 in the CIM macro 101. In CIM macro 101, column cells 220 are arranged in rows and columns. In this example, the enlarged column cell 220 is in row 0 and column 0 of the CIM macro 101, contained in the computing unit 222 in column 0. As discussed above, each column of computing unit 222 includes $N_E$ (e.g., 32) number of column cells, where $N_E$ is the number of elements in the vector of activation values (e.g., Act 0, Act 1, Act 2, . . . , Act 31). In this example, the column cell 220 performs multiplication operation between the activation value Act 0 in the format of FP8 (1-4-3) and the weight value Wdata 0 in the format of FP6 (1-3-2) to produce the primitive product (Act 0×Wdata 0). In column cell 220, the 8 bits of the activation value Act 0 are arranged in rows and represented by Act 0 <7>, Act<6>, . . . , Act 0 <0>, where the 6 bits of the weight values Wdata 0 are arranged in columns and represented by Wdata 0 <5>, Wdata 0 <4>, . . . , Wdata 0 <0>.

The column cell 220 includes memory cells for storing the bits of the weight value, one bit of the weight value corresponding to one memory cell. Each memory cell may include one, two or more bitcells. In the example in FIG. 7, each memory cell includes one bitcell (labelled as BC) and each bitcell stores one bit of the weight value. In the example in FIG. 8, each memory cell includes two bitcells (labelled as BC1 and BC2), where one of the two bitcells stores the weight value concurrently used for the VMM operation. The design of memory cell having two or more bitcells allows for storing more weight values, where one weight value can be used for the VMM operation and other weight values can be updated in a parallel operation. For the purpose of describing the functions of a column cell during the VMM operation, memory cell and bitcell are used exchangeable for providing the relevant bit of the weight value.

The column cell 220 also includes logic circuits, for example, logic gates such as XNOR, XOR, OR and AND gates and digital circuits such as half adders and full adders. Each memory cell can be coupled to a plurality of logic circuits to perform various operations for the corresponding bit of the weight value stored in the memory cell and the corresponding bit of the activation value provided to the column cell 220. The logic circuits in the column cell 220 include components associated with a specific memory cell. For example, an XOR gate can be associated with the memory cell storing the sign bit of the weight value. A half adder can be associated with the memory cell storing one of the exponent bits of the weight value. An AND gate can be associated with the memory cell storing one of the mantissa bits of the weight value. The logic circuits in the column cell 220 also include components associated with a group of memory cells. For example, an exponent handling block 830 in the column cell 220 can be associated with multiple memory cells storing the exponent bits of the weight value. An mantissa handling block 832 in the column cell 220 can be associated with multiple memory cells storing the mantissa bits of the weight value.

In the example shown in FIGS. 7 and 8, the primitive product between the activation value Act 0 and the weight value Wdata 0 is in FP11 (1-5-5) format, having 1 sign bit, 5 exponent bits and 5 mantissa bits. The sign bit $P_S$ of the primitive product between Act 0 and Wdata 0 can be obtained through an XOR logic gate using inputs from the sign bit of Act 0 and the sign bit of Wdata 0 to perform the operation of, e.g., Act 0 <7>⊕Wdata 0 <5>, which is illustrated in the left column of the column cell 220 in FIGS. 7 and 8. Sign bit $P_S$ can also be obtained through an XNOR logic gate for a reversed sign representation.

Figure 9:
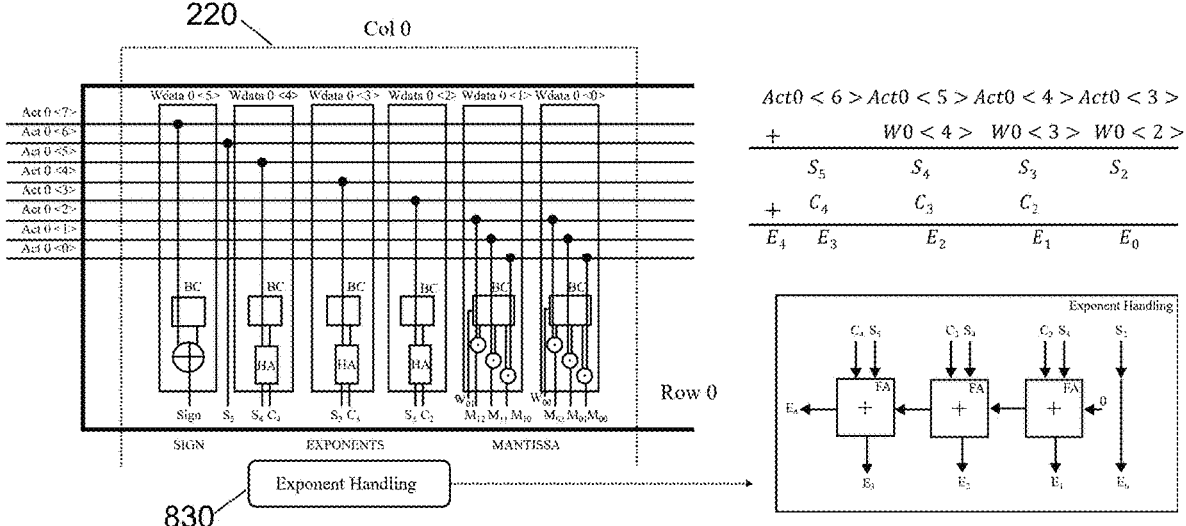
FIG. 9 illustrates a scheme for handling exponent bits in a column cell in the CIM macro, in accordance with some aspects of the present disclosure.

FIG. 9 illustrates an exemplary scheme for handling exponent bits in a column cell in the CIM macro during a VMM operation. As shown in FIG. 9, the exponent bits of the primitive product between Act 0 and Wdata 0 can be produced through digital circuits, e.g., half adders and full adders, using inputs from the exponent bits of Act 0 and the exponent bits of Wdata 0 to perform the operation of, e.g., Act 0 <6:3>+Wdata 0 <4:2>, which is illustrated in the middle columns of the column cell 220 in FIGS. 7 and 8. Mathematic equations for the exponent bits calculation are shown on the top right of FIG. 9.

First, half adders (labeled as HA) can be used to add the exponent bits of the activation value Act 0 <6:3> to corresponding exponent bits of the weight value Wdata 0 <4:2> (simplified as W0 <4:2>). Each half adder can output a sum bit and a carry-out bit. The half adder can include any suitable digital circuits to add two binary bits to produce the sum bit and the carry-out bit, e.g., using an XOR logic gate for the sum bit and an AND logic gate for the carry-out bit. Half adders can perform the addition operations in parallel for the exponent bits of the activation value and corresponding exponent bits of the weight value. In the example in FIGS. 7-9, 3 half adders can be used to respectively add the 3 exponent bits of the activation value Act 0 <5:3> and the corresponding 3 bits of the weight value W0 <4:2> to produce sum bits $S_4$, $S_3$, $S_2$ and carry-out bits $C_4$, $C_3$, $C_2$, respectively, where the exponent bit Act 0 <6> can be directly passed on as the sum bit $S_5$ because there is no corresponding exponent bit in the weight value W0.

Next, the sum bits and carry-out bits produced by the half adders can be fed through the exponent handing block 830 in the column cell 220. The exponent handing block 830 includes full adders (labeled as FA) to generate the exponent bits of the primitive product. An exemplary arrangement for the full adders in the exponent handling block 830 is illustrated at the bottom right of FIG. 9. The full adders can be connected in series, where each full adder can output an exponent bit of the primitive product and a carry-in bit for the next stage full adder. The full adder can include any suitable logic circuits that add three binary bits (two operands bits and one carry-in bit). For example, the full adder can include XOR, AND and OR logic gates. In the example shown in FIGS. 7-9, 3 full adders connected in series can be used to produce the exponent bits $E_1$, $E_2$, $E_3$ and $E_4$ of the primitive product, where $S_2$ can be directly passed on to as the exponent bit $E_0$. Each full adder has three inputs: the sum bit from a corresponding half adder, the carry-out bit from a prior stage half adder, and the carry-in bit from a prior stage full adder. For example, the sum bit $S_4$ from the addition of Act 0 <5> and W0 <4> is added to the carry-out bit $C_3$ from the addition of Act 0 <4> and W0 <3>, along with the carry-in bit from the output of the prior stage full adder for the sum bit $S_3$ and the carry-out bit $C_2$. Number zero can be added when there is no carry-in bit or carry-out bit.

The above design for exponent handling block 830 and methods for exponent computation are only exemplary and not so limited. For example, improvements can be made as shown in FIG. 14 and discussed in detail below.

Figure 10:
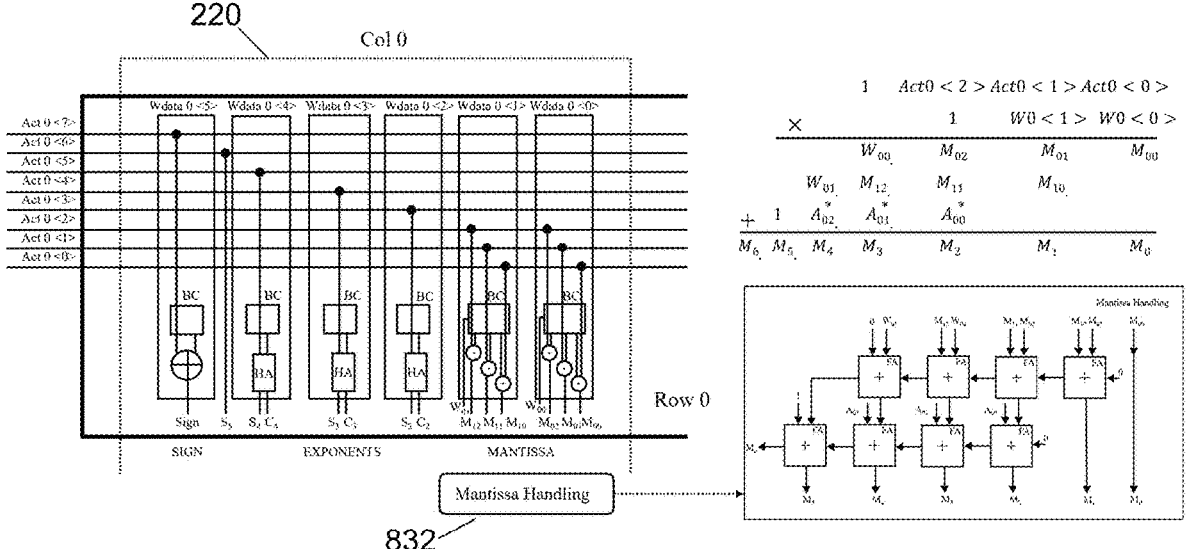
FIGS. 10-11 illustrate schemes for handling mantissa bits in a column cell in the CIM macro, in accordance with some aspects of the present disclosure.

FIG. 10 illustrates an exemplary scheme for handling mantissa bits in a column cell in the CIM macro during a VMM operation. As shown in FIG. 10, the mantissa bits of the primitive product between Act 0 and Wdata 0 can be produced through digital circuits, e.g., AND gate, NOR gates, and full adders, using inputs from the mantissa bits of Act 0 and the mantissa bits of Wdata 0 to perform the operation of, e.g., by 1. (Act <2:0>)×1. (Wdata <1:0>), which is illustrated in the right columns of the column cell 220 in FIGS. 7 and 8. Mathematic equations for the computation of the mantissa bits are shown on the top right of FIG. 10.

Referring to FIGS. 8 and 10, to obtain the mantissa bits of the primitive product, partial products between the mantissa bits of activation value Act 0 and weight value W0 can be generated first through, e.g., logic gates such as AND gates and NOR gates. Then, all the partial products of the mantissa bits can be added up by the mantissa handling block 832. Each memory cell can be coupled to a group of logic gates to produce the partial products between a corresponding mantissa bit of the weight value and the mantissa bits of the activation value. The number of logic gates coupled with each memory cell for partial product operation can be determined by the number of mantissa bits of the activation value. In the example of FIGS. 8 and 10, each memory cell can include 3 AND gates (or NOR gates) to generate partial products (e.g., $M_{02}$, $M_{01}$ and $M_{00}$) between a corresponding bit of the weight value (e.g., Wdata 0 <0> or W0<0>) and the 3 bits of the activation value (Act 0 <2>, Act 0 <1> and Act 0 <0>).

The mantissa handling block 832 includes a plurality of full adders to perform the addition (accumulation) operation for the partial products. An exemplary arrangement of the full adders in the mantissa handling block 832 is illustrated at the bottom right of FIG. 10. The full adders in the mantissa handling block 832 can be arranged as an array. In some embodiments, the number of the mantissa bits in the weight value can determine the number of rows of full adders in the mantissa handling block 832, while the number of the mantissa bits in the activation value can determine the number of columns of full adders. In some embodiments, the array of the full adder in the mantissa handling block 832 can be staggered row-by-row.

In the example of FIG. 10, mantissas of the activation value and the weight value are represented in a normal FP format, where the significand is derived by appending mantissa bits after a number 1 and a decimal point (i.e., "1.M"). In this representation, any subnormal number used as an input operand to the floating-point operation is treated as zero and is referred to as Denormals-Are-Zero (DAZ) method. Using DAZ method to handle subnormals can improve the performance of the compute engine 100 and thereby improve the speed of deep learning of the neural network. In the DAZ method, number "1" is added to the mantissa bits of the activation value and the weight value during the VMM operation to generate the partial products (see FIG. 10). In this example, the primitive product has 7 mantissa bits $M_{<6:0>}$ after counting the partial products generated by the numbers "1" in the weight value and the activation value.

Unlike normal numbers which have an implicit leading bit "1" in their significand, subnormal FP numbers have an implicit leading bit "0," which allows the representation of values closer to zero.

Figure 11:
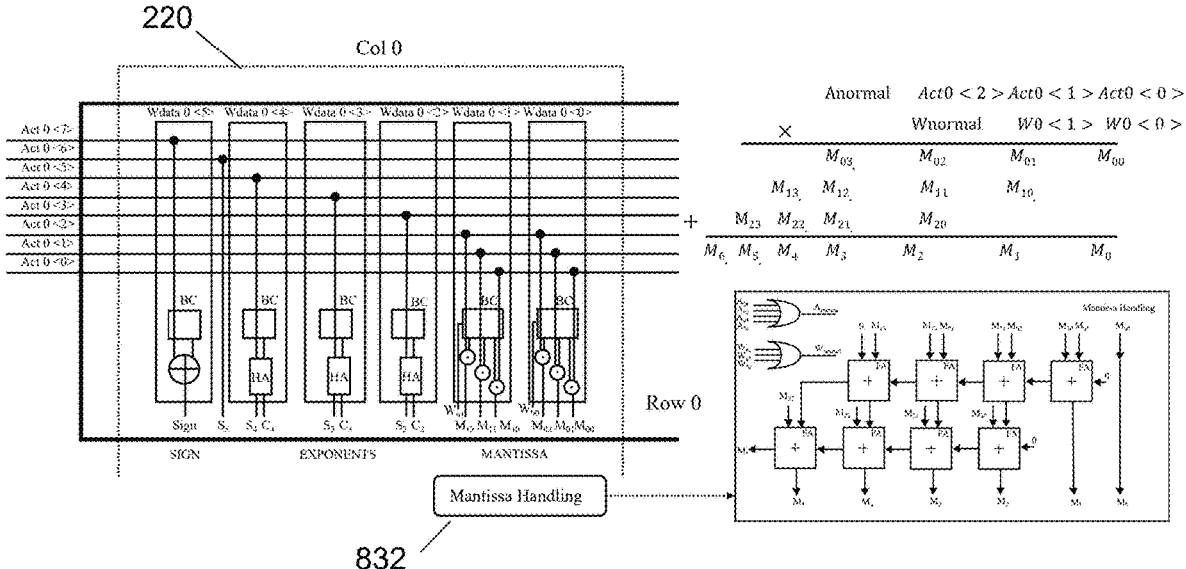

FIG. 11 illustrates an exemplary method and circuits to handle subnormal FP numbers. In this example, the mantissa handling block 832 can include a first OR logic gate configured to provide a first output bit (labelled as $A_{normal}$) based on inputs from exponent bits of the activation value (e.g., Act 0 <6:3>) and a second OR logic gate configured to provide a second output bit (labelled as $W_{normal}$) based on inputs from exponent bits of the weight value (e.g., W0 <4:2>). To generate the partial products, instead of adding a leading bit "1" before the MSBs of the mantissas of the activation value and the weight value, the first output bit $A_{normal}$ can be added before the MSB of the mantissa of the activation value (e.g., before Act 0 <2>), and the second output bit $W_{normal}$ can be added before the MSB of the mantissa of the weight value (e.g., before W0 <1>). The logic circuits used to generate the partial products can be similar to those discussed with respect to FIG. 10 above for normal FP numbers. When the activation value Act 0 is a subnormal FP number, the first output bit $A_{normal}$ is zero. When the weight value Wdata 0 is a subnormal FP number, the second output bit $W_{normal}$ is zero. Without leading bit "1", the number of mantissa bits of the primitive products for the activation value Act 0 FP 8 (1-4-3) and the weight value Wdata 0 FP6 (1-3-2) can be reduced to 5 bits. As such, the same logic circuits of the column cell 220 can handle both normal and subnormal FP numbers.

The following are descriptions of multiplication operation for an activation value (e.g., Act 0) in FP8 (1-4-3) format and a weight value (e.g., Wdata 0) in FP4 (1-2-1) format, i.e., in mode 2 listed in Table 1. Column cell 220 in row 0 and column 0 of the CIM macro 101 is also used as an example. For simplicity, discussions below are focused on differences between the weight value in FP4 (1-2-1) format and in FP6 (1-3-2) format in the multiplication operation to generate the primitive product, and similar features are not repeated.

In FP4 (1-2-1) format, the sign, exponent and mantissa are represented by 1 bit, 2 bits and 1 bit, respectively. Compared with FP6 (1-3-2) format, the weight value in FP4 (1-2-1) format has 1 less bit for exponent and 1 less bit for mantissa. To use the same design of column cell 220 as those in FIGS. 7-11 to perform element-wise multiplication between FP8 (1-4-3) and FP4 (1-2-1), 2 bits of the weight value in FP6 (1-3-2) format can be ignored by e.g., writing zero to the associated memory cell or using multiplexers.

Figure 12:
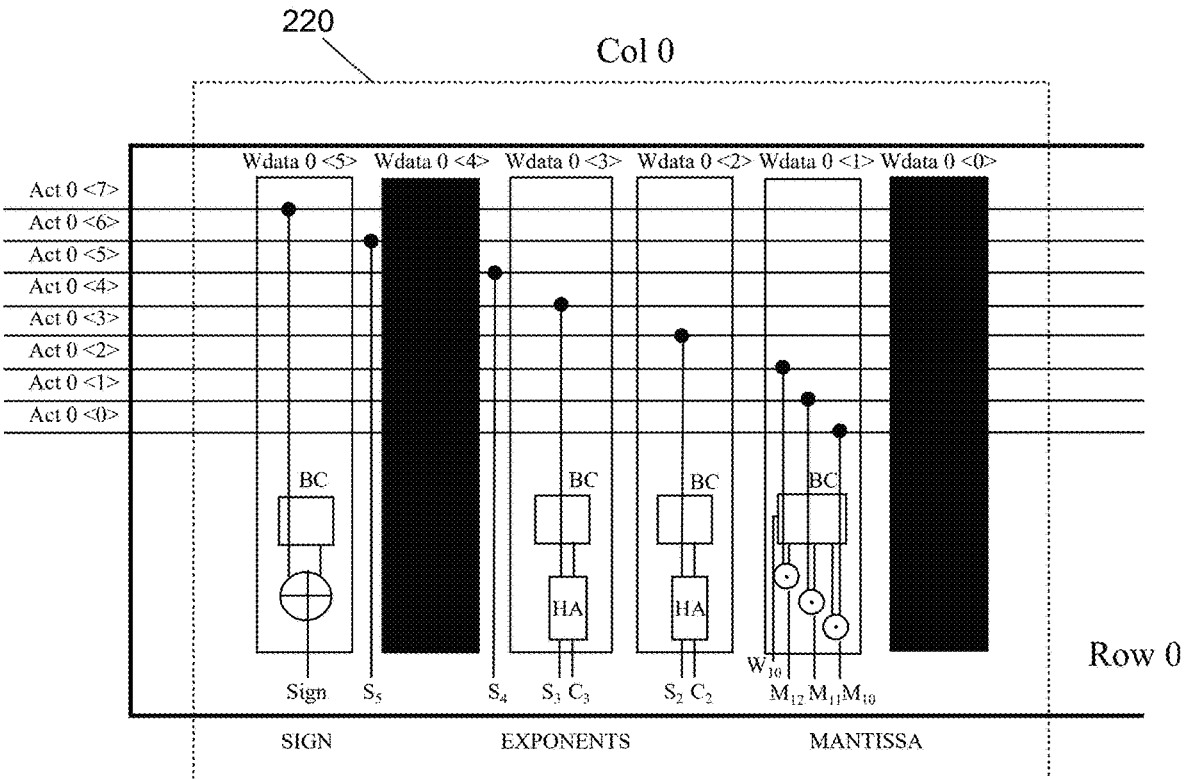
FIG. 12 illustrates a scheme for handling data with lower floating point (FP) precision in a column cell in the CIM macro, in accordance with some aspects of the present disclosure.

FIG. 12 illustrates an exemplary scheme for handling data with lower floating point (FP) precisions in a column cell in the CIM macro. As shown in FIG. 12, the activation value remains in FP8 (1-4-3) format, and the weight value is represented in FP4 (1-2-1) format. To maximize the reuse of the exponent handling block 830 and the mantissa handling block 832, in this example, the MSB of the exponent and the LSB of the mantissa for the weight value in FP6 (1-3-2) format can be ignored (or made invalid), i.e., Wdata 0 <4> and Wdata 0 <0> of FP8 (1-4-3) format can be ignored. In this example, the sign of the primitive product between Act 0 and Wdata 0 remains the same, i.e., Act 0 <7 >⊕Wdata 0 <5>.

Figure 13:
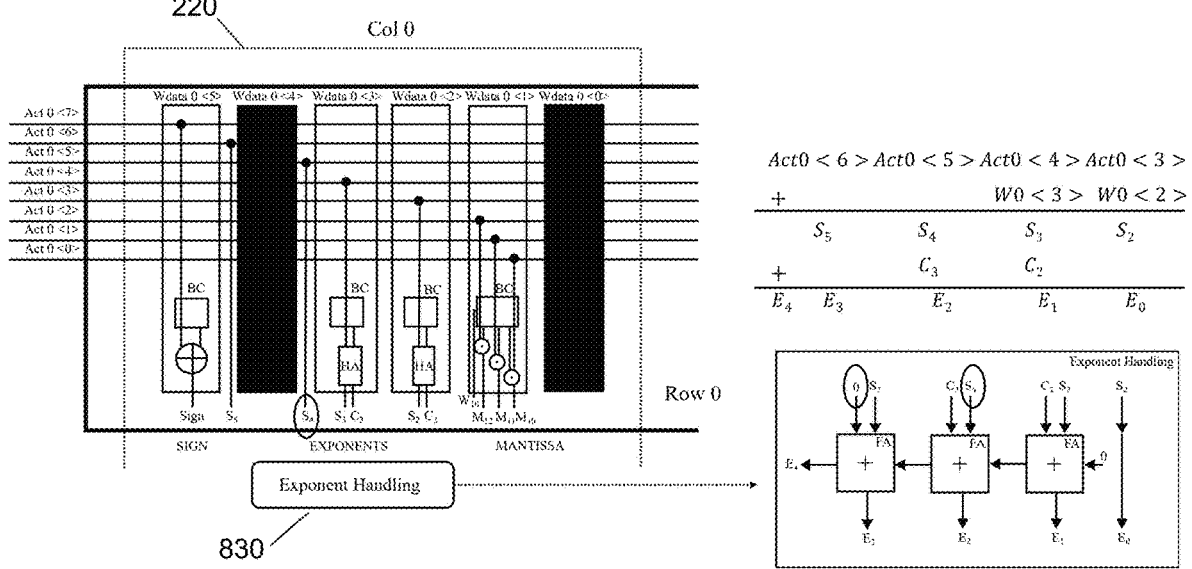

FIG. 13 shows an exemplary computation for the exponent bits of the primitive product between the activation value in FP8 (1-4-3) format and the weight value in FP4 (1-2-1) format. Compared with the situation when the weight value is in FP6 (1-3-2) format, here the sum bit $S_4$ is Act 0 <5> rather than Act 0 <5>+W0 <4>, and the carry-out bit $C_4$ is zero. In one embodiment, the bitcell associated with W0 <4> bit can be written as zero when the weight value is in FP4 (1-2-1) format. In another embodiment, a multiplexer can be used to select zero or the bit stored in the bitcell associated with W0<4>, based on the FP format of weight value according to a control signal from the mode decoding unit 110 (in FIG. 1). It is noted that instead of ignoring the MSB of the exponent of the weight value in FP6 (1-3-2) format (Wdata 0 <4>), the LSB of exponent of the weight value in FP6 (1-3-2) format (Wdata 0 <2>) can be ignored to compute the exponent bits of the weight value in FP4 (1-2-1) format.

Figure 15:
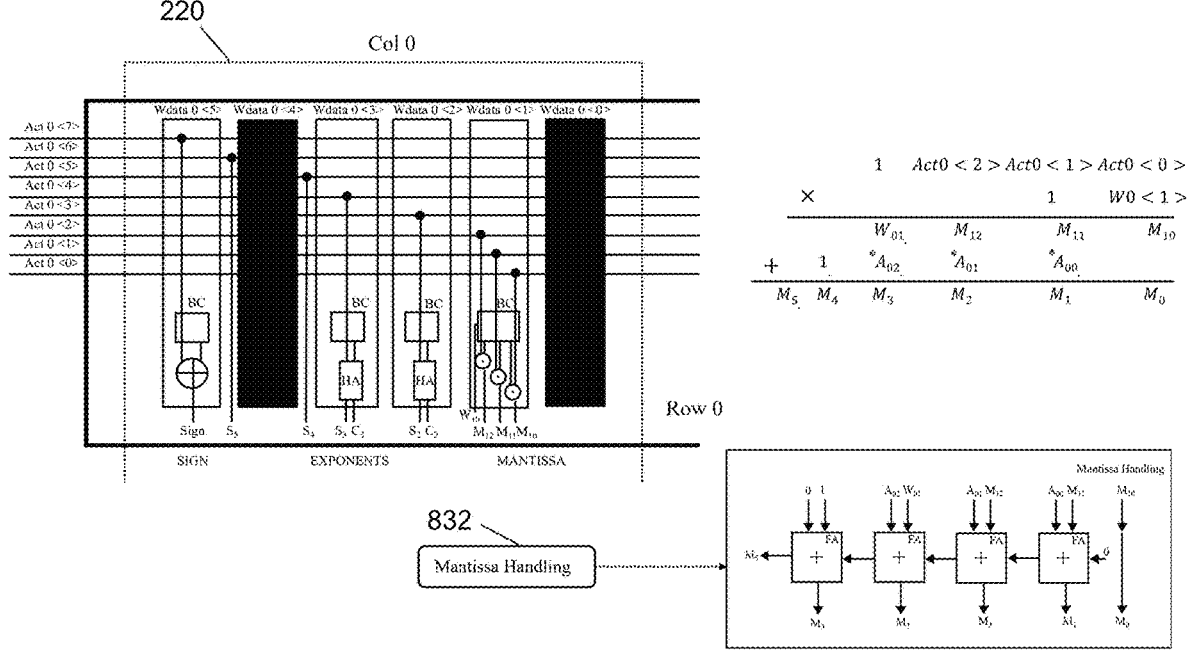

FIG. 15 shows an exemplary computation for the mantissa bits of the primitive product between the activation value in FP8 (1-4-3) format and the weight value in FP4 (1-2-1) format. In this example, the LSB of the mantissa for the weight value in FP6 (1-3-2) format (Wdata 0 <0> or W0 <0>) can be ignored. For normal FP representations with the leading "1" bit, the mantissa handling block 832 includes one row of full adders (corresponding to the one mantissa bit W0<1> of the weight value in FP4 (1-2-1) format) to compute the accumulations of the partial products.

Figure 16:
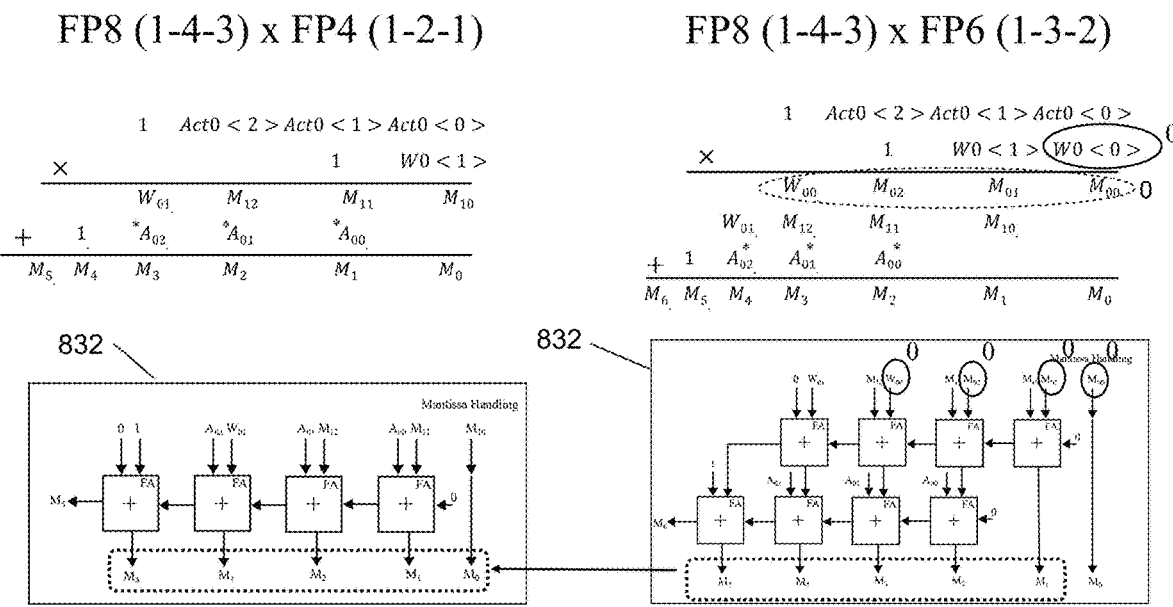

FIG. 16 illustrates a comparison of mantissa multiplications in different floating point formats. On the left of FIG. 16, mantissas multiplication of FP8 (1-4-3)×FP4 (1-2-1) is illustrated. On the right of FIG. 16, mantissas multiplication of FP8 (1-4-3)×FT6 (1-3-2) is illustrated, where the weight value is in different FP formats, i.e., FP4 (1-2-1) and FP6 (1-3-2) formats. Because W0 <0> is set to zero, the first row of partial products $W_{00}$, $M_{02}$, $M_{01}$ and $M_{00}$ can be set to zero and the output mantissa bits for the primitive product can be reduced by 1 bit, where bits M [5:1] can be shifted to M [4:0]. To utilize the column cell 220 with the same configuration and design to compute in both mode 1 (weight value in FP6 (1-3-2) format) and mode 2 (weight value in FP4 (1-2-1) format) as listed in Table 1, multiplexers can be used to select zero or W0 <0> bit in the FP6 (1-3-2) and select zero or the partial products generated from the W0 <0> bit, depending on which mode and data formats are used in the computation.

Figure 17:
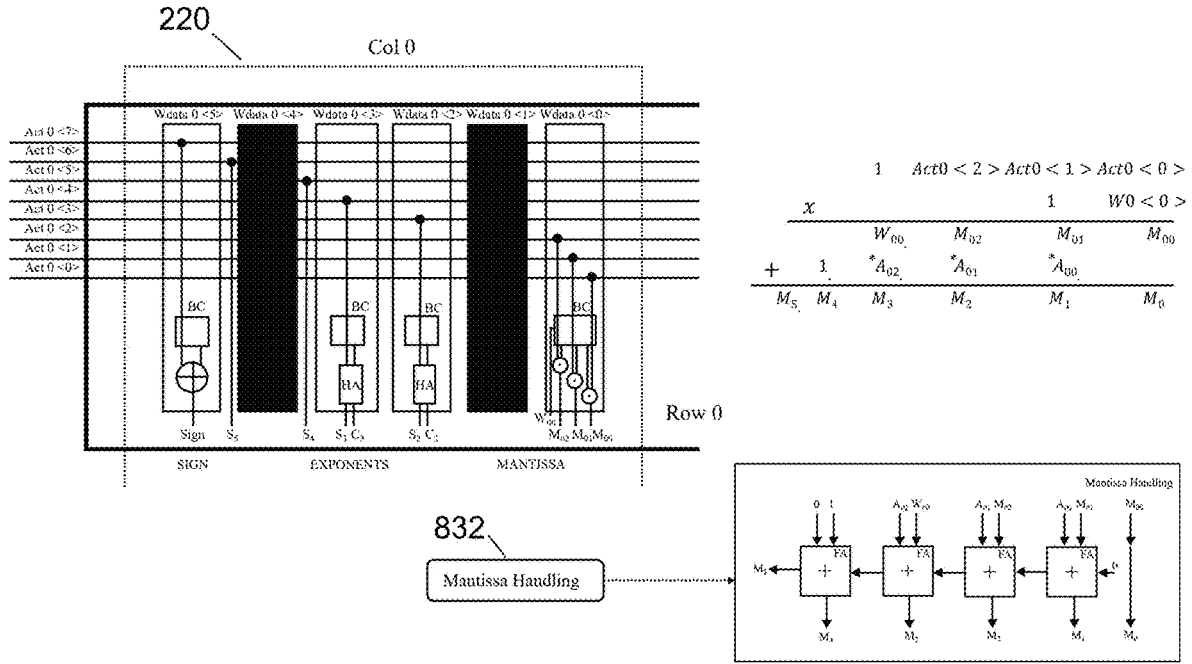

FIGS. 17 and 18 illustrates examples of mantissa computation between the activation value in FP8 (1-4-3) format and the weight value in FP4 (1-2-1) format. In this example, the MSB of the mantissa of the weight value in FP6 (1-3-2) format (Wdata 0 <1>) can be ignored. The mantissa handling block 832 also includes one row of full adders to compute the accumulation of the partial products between the mantissa bit of the weight value W0 <0> and the mantissa bits of the activation value Act 0 <2:0>. FIG. 18 shows the comparison to the situation where the weight value is in FP6 (1-3-2) format. Because W0 <1> is set to zero, the second row of partial products $W_{01}$, $M_{12}$, $M_{11}$ and $M_{10}$ can be set to zero. Different from the situation where Wdata 0 <1> is set to zero, the partial products generated by the leading bit "1" need to be shifted before inputting into the full adders for accumulation. To utilize the column cell 220 with the same configuration and design to compute in both modes 1 and 2 listed in Table 1, multiplexers can be used to select zero or W0 <1> bit in the FP6 (1-3-2) and select zero or the partial products generated from the W0 <1> bit. The mantissa handling block 832 can includes registers to shift the partial products from the leading bit "1" before inputting into the full adders.

Figure 19:
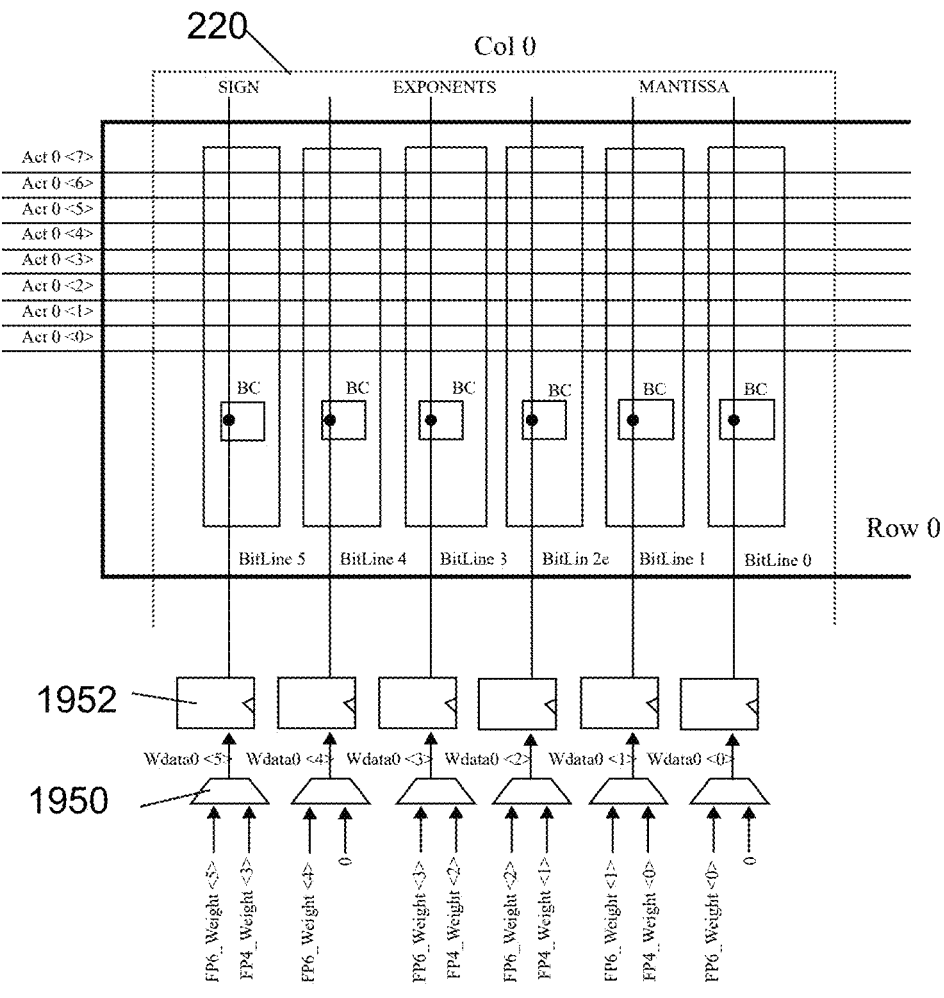
FIG. 19 illustrates illustrate a scheme for handling data with various FP formats in a column cell in the CIM macro, in accordance with some aspects of the present disclosure.

To write weight values in both FP6 and FP4 formats in the same column cell 220, multiplexers can be used to select which bit to be written into each memory cell. FIG. 19 illustrates an exemplary design for writing or updating the weight value in the column cell 220. In this example, the column cell 220 includes a plurality of multiplexers 1950 and storage unit 1952 (e.g., registers, latches, flip-flops). Each multiplexer 1950 outputs one bit to a respective storage unit 1952 and a respective memory cell having a single bitcell (BC) or a double bitcells (BC1 and BC2) through a respective bitline. Each multiplexer 1950 can have two inputs, one input from the weight value in FP6 format and the other input from the weight value in FP4 format or zero. As discussed above, some bits of FP6 format can be set as zero in the computation for the weight value in FP4 format (e.g., Wdata 0 <4> and Wdata 0 <0>), and thereby number zero can be input to the corresponding multiplexers. When writing or updating the weight value in FP6 format, each bit of the weight value Wdata 0 <5:0> can be written to the corresponding memory cell, where the bits of FP6 provided to the multiplexers 1950 are directly mapped to the memory cells of the column cell 220. When writing or updating the weight value in FP4 format, the sign bit Wdata 0 <5> can be written into the memory cell connected to bitline 5; the 2 exponent bits Wdata 0 <3:2> can be written into the memory cells connected to bitlines 3 and 2, respectively; and the mantissa bit Wdata 0 <1> can be written into the memory cell connected to bitline 1. Number zeros can be written into the memory cells connected to bitlines 4 and 2. As a result, the bits of FP4 provided to the multiplexers 1950 are mapped to Wdata 0 <5>, Wdata 0 <3:2> and Wdata 0 <1> of the FP6 format. The multiplexers 1950 can be controlled through a control signal from the mode decoding unit 110 (in FIG. 1) according to the mode of the VMM operation as depicted in Table 1.

In some embodiments, the logic circuits used for exponent computation can be improved. FIG. 14 illustrates another exemplary scheme for multiplication between floating point formats. As discussed above with respect to FIG. 9, three half adders (which are coupled to the memory cells) are used along with three full adders for exponent computation between Act 0 in FP8 (1-4-3) and Wdata 0 in FP6 (1-3-2). As shown in FIG. 14, logic circuits for this exponent computation may be reduced to 2 half adders and 2 full adders, where exponent bits of the activation value and the weight value can be added directly rather than in a two-stage operation described in FIG. 9. For example, the addition of the LSBs of the exponents Act0<3> and W0<2> can be achieved through a first half adder 1440 in one step. A second half adder 1442 can be used to add the MSB (e.g., Act 0 <6>) of the exponent of the activation value and the carry-out bit from a prior stage full adder. The additions of the rest of the exponent bits can be performed by full adders, each configured to add a further exponent bit of the activation value (e.g., Act 0 <5>) and a further exponent bit of the weight value (e.g., w0 <4>), together with a further carry-out bit (e.g., $C_3$) from a prior stage full adder or half adder. Note that if the weight value has more exponent bits and the activation value, the second half adder 1442 can be used to add the MSB of the exponent of the weight value and the carry-out bit from a prior stage full adder. This improvement in exponent computation can be extended to other FP formats. For example, FIG. 14 also illustrates the logic circuits for exponent computation between Act 0 in FP8 (1-4-3) format and Wdata 0 in FP4 (1-2-1) format, where 2 half adders and 2 full adders can be used similarly, with W0 <4> bit in FP6 (1-3-2) set to zero. As such, to perform the VMM operation for the 1×32 vector of activation values and the 32×32 matrix of weight values, 64×64 number of half adders and full adders can be saved.

Figure 22:
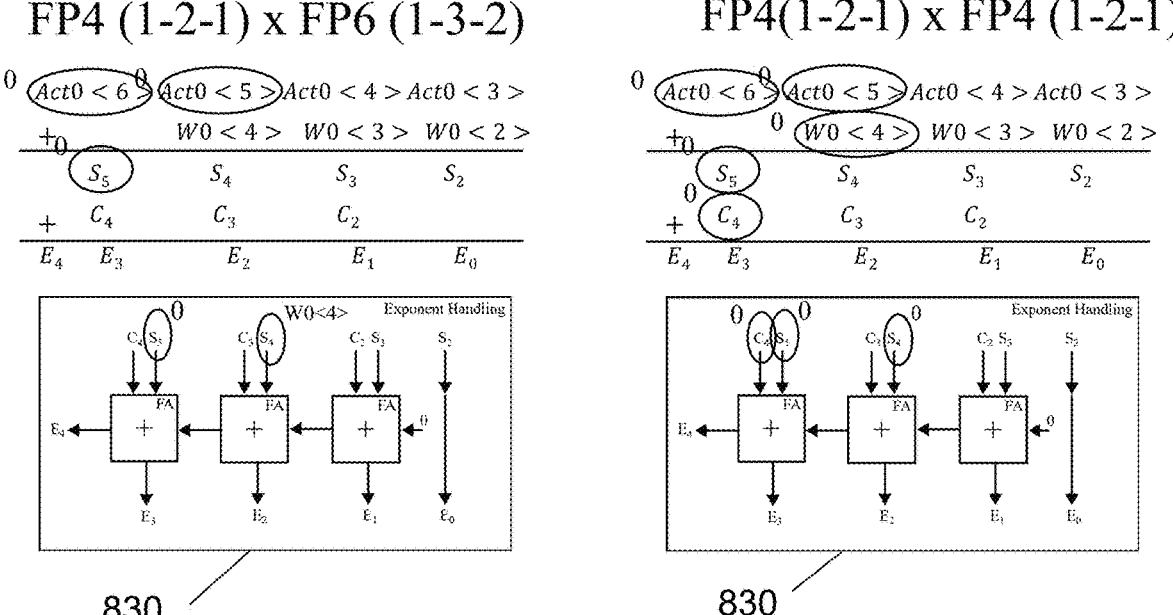
Figure 23:
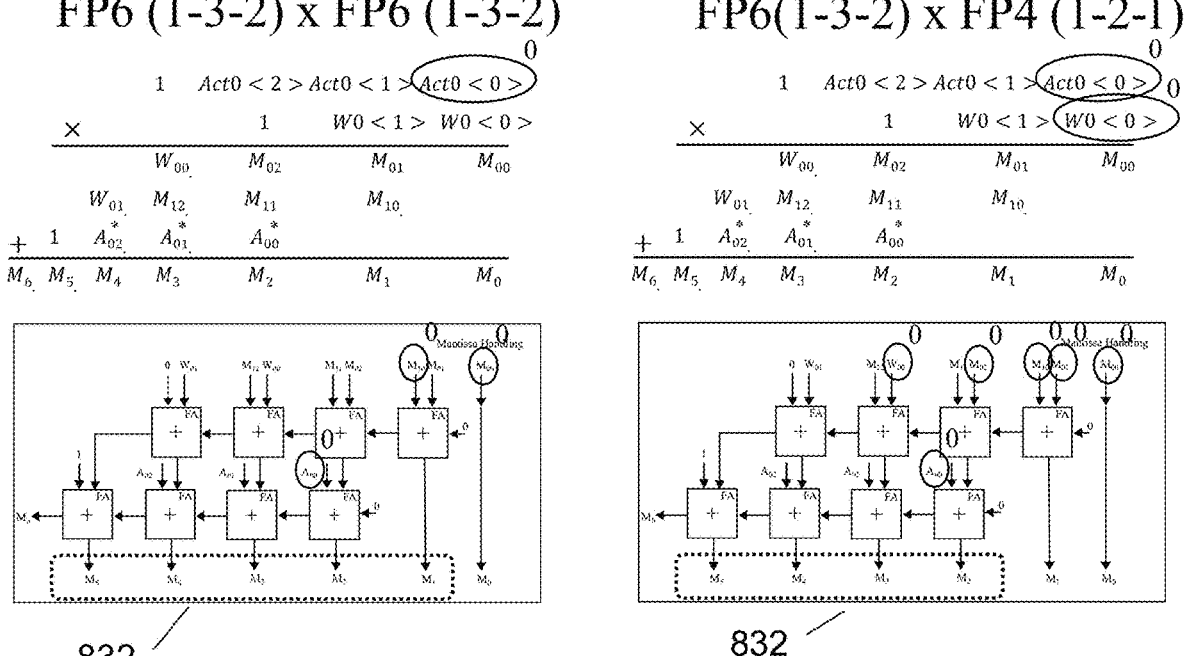
Figure 24:
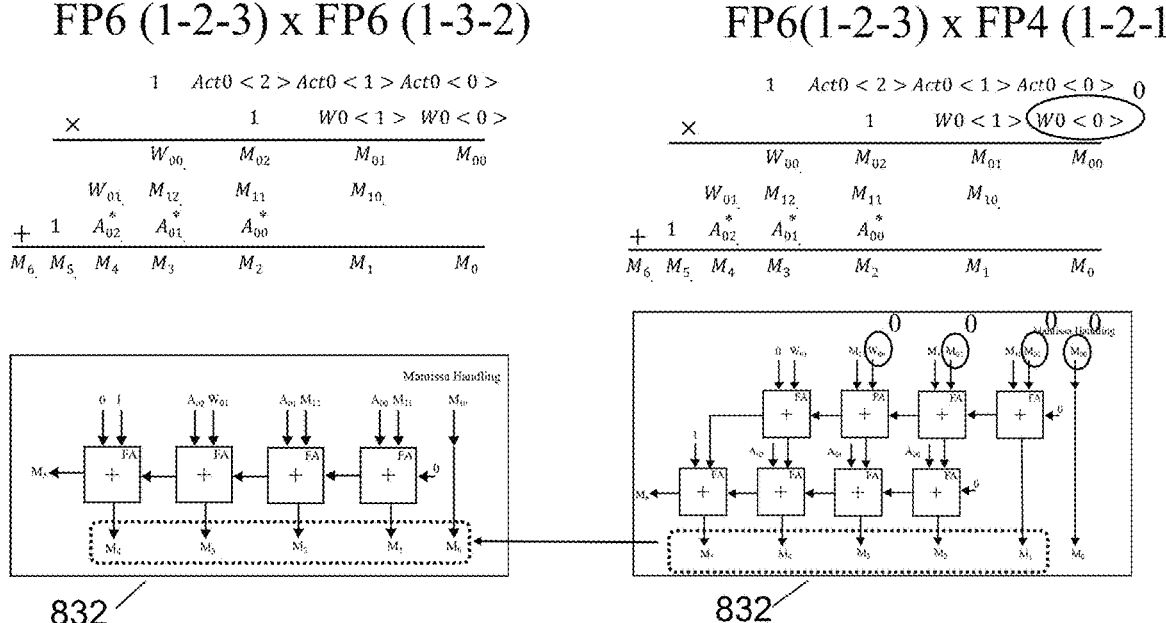

Similar to the weight values, the activation values can be represented in different formats. The mode 1 in Table 1 can be the main implementation for the compute engine 100, where the activation values are in FP8 (1-4-3) format and the weight values are in FP6 (1-3-2) format. However, the compute engine 100 can also support other modes, where the activation values are in FP6 (1-3-2) format in modes 3 and 4, in FP6 (1-2-3) format in modes 5 and 6, or in FP4 (1-2-1) format in modes 7 and 8. For activation values in lower precisions, some of the bits in the FP8 (1-4-3) formats can be set as zero, similar to the approach described above for weight values in FP4 format. Table 2 (in FIG. 60) lists exemplary representations for the lower FP formats based on FP8 (1-4-3) for activation values and FP6 (1-3-2) for weight values during the VMM operation in the CIM macro 101. Resulting FP representations for the primitive products are also listed in Table 2 for each mode of operation. As shown in Table 2, there is no change made to the sign bits Act<7>. In general, the MSB of the FP data (e.g., Act<7> or Wdata<5>) is used for the sign. For exponent bits of lower FP precisions, MSB (e.g., Act<6>) and bits next to MSB (e.g., Act<5>) of the activation exponent bits can be set as zero as needed. For mantissa bits of lower FP precisions, LSB (e.g., Act<0>) and bits next to LSB (e.g., Act<1>) can be set as zero as needed. FIGS. 20-22 illustrates the details of the computation for the exponent bits of the primitive products between activation values and weight values in modes 3-8 as listed in Tables 1 and 2, along with the logic circuits in the exponents handling block 830 for each mode of operation. FIGS. 23-25 illustrates the details of the computation for the mantissa bits of the primitive products between activation values and weight values in modes 3-8 as listed in Tables 1 and 2, along with the logic circuits in the mantissa handling block 832 for each mode of operation.

To perform computation for activation values in lower precisions (e.g., FP4 (1-2-1) format) in the column cells supporting the high precision format (e.g., FP8 (1-4-3) format), multiplexers and storage units can be used to select a corresponding bit to provide to a corresponding memory cell through a corresponding bitline in the column cell. For example, Act<2> in Table 2 can be an output from a multiplexer with 4 inputs connected to bit FP8<2> in modes 1 and 2, to bit FP6<1> in modes 3 and 4, to bit FP6<2> in modes 5 and 6 and to bit FP4<0> in modes 7 and 8. In the example of mode 8, the activation value in FP4 (1-2-1) format has 4 bits and can be represented by FP4 <3:0>. The most significant bit FP4 <3> is the sign bit, which can be provided to the bitline and memory cell also handling the bit Act<7> for FP8 (1-4-3) format. According to Table 2, the exponent bits FP4 <2:1> can be provided to the bitlines and memory cells also handling the bits Act<4:3> for FP8 (1-4-3) format, and the mantissa bits FP4 <0> can be provided to the bitline and memory cell also handling the bit Act<2> for FP8 (1-4-3) format. As for the primitive products, in mode 8, the sign bit $P_S$<0> remains the same in mode 8, where the exponent bits are output from bits $P_E$<3:0> and the mantissa bits are output from bits $P_M$<6:3>, which can be shifted to representation of $P_{M'}$<3:0> if needed.

Figure 26:
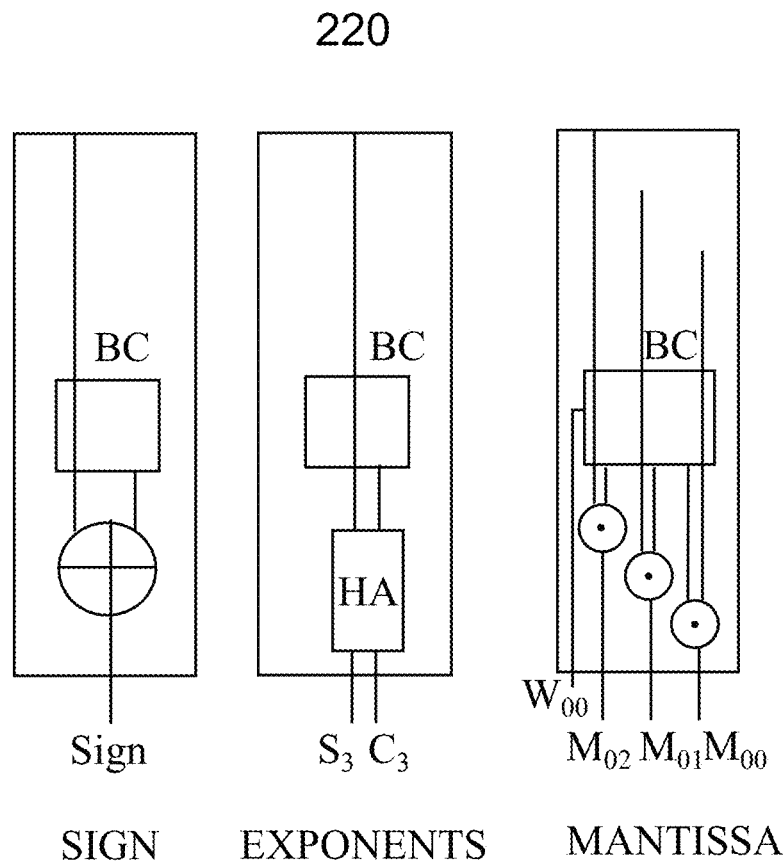
FIGS. 26, 27A, 27B, 27C illustrate exemplary logic circuits in a column cell in the CIM macro, in accordance with some aspects of the present disclosure.
Figure 27A:
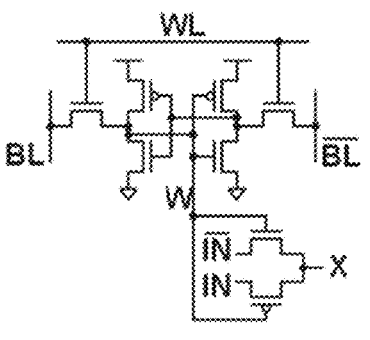
Figure 27B:
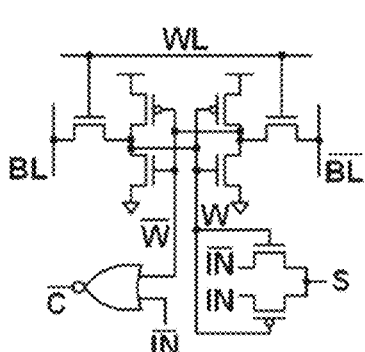
Figure 27C:
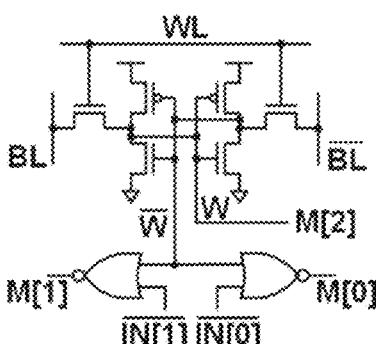

FIG. 26 illustrates exemplary memory cells and logic circuits in the column cell 220 designed for computing the sign, exponent and mantissa of the primitive products between the activation value and the weight value, as seen in, e.g., FIGS. 3, 7-13 and 15-17. As discussed above, one memory cell can include one or more bitcells (BC). FIG. 26 illustrates an example where one memory cell includes one bitcell (BC). To compute the sign of the primitive product, the memory cell stored the sign bit of the weight value can be connected to an XOR logic gate (⊕). FIG. 27A illustrates an exemplary design of the XOR gate, where X is the output bit and IN and W are the input bits, and X=IN⊕W. To compute the exponent of the primitive product, each memory cell stored a corresponding exponent bit of the weight value can be connected to a half adder (HA). FIG. 27B illustrates an exemplary design of the half adder, where the output bits are the sum bit S and the carry-out bit C, and S=IN⊕W, C=$\overline{\overline{IN}+\overline{W}}$=IN·W. To compute the mantissa of the primitive product, each memory cell stored a corresponding mantissa bit of the weight value can be connected to a plurality of AND logic gates (·) to generate the partial products. FIG. 27C illustrates an exemplary design of the logic circuits to generate partial products, where the output bits are M<2:0> and M<2>=W·1, M<1>=W·IN[1] and M<0>=W·IN[0].

The compute engine 100 can support various FP formats (e.g., FP8, FP6, FP4), beyond those listed in Tables 1 and 2. For example, FP8 format includes FP8 (1-5-2), FP8 (1-4-3), FP8 (1-3-4); FP6 format includes FP6 (1-3-2), FP6 (1-2-3); and FP4 format includes FP4 (1-2-1), FP (1-1-2). The activation values and weight values can be represented by any of these FP formats. Accordingly, the exponents of the activation values and weight values can have 5, 4, 3 or 2 bits and the mantissas of the activation values and weight values can have 4, 3, 2 or 1 bit. To compute the exponent of the primitive product between the activation value and the weight value, the column cell 220 supports addition (accumulation) operation for the following possible combinations: 5b+3b, 5b+2b, 5b+1b, 4b+3b, 4b+2b, 4b+1b, 3b+3b, 3b+2b and 3b+1b, and supports multiplication operation for the following possible combinations: 4b×3b, 4b×2b, 4b×1b, 3b×3b, 3b×2b, 3b×1b, 2b×1b.

Exponent computations of the primitive products for operation modes listed in Table 2 have been described with respect to FIG. 20 (3b+3b) for the activation value Act 0 in FP6 (1-3-2) format and the weight value Wdata 0 in FP6 (1-3-2) format both having the same size in exponent bits, FIG. 9 (4b+3b) for the activation value Act 0 in FP8 (1-4-3) format having one more bit in exponent than the weight value Wdata 0 in FP6 (1-3-2) format, and FIG. 13 (4b+2b) for the activation value Act 0 in FP8 (1-4-3) format having two more bit in exponent than the weight value Wdata 0 in FP4 (1-2-1) format.

Figure 28:
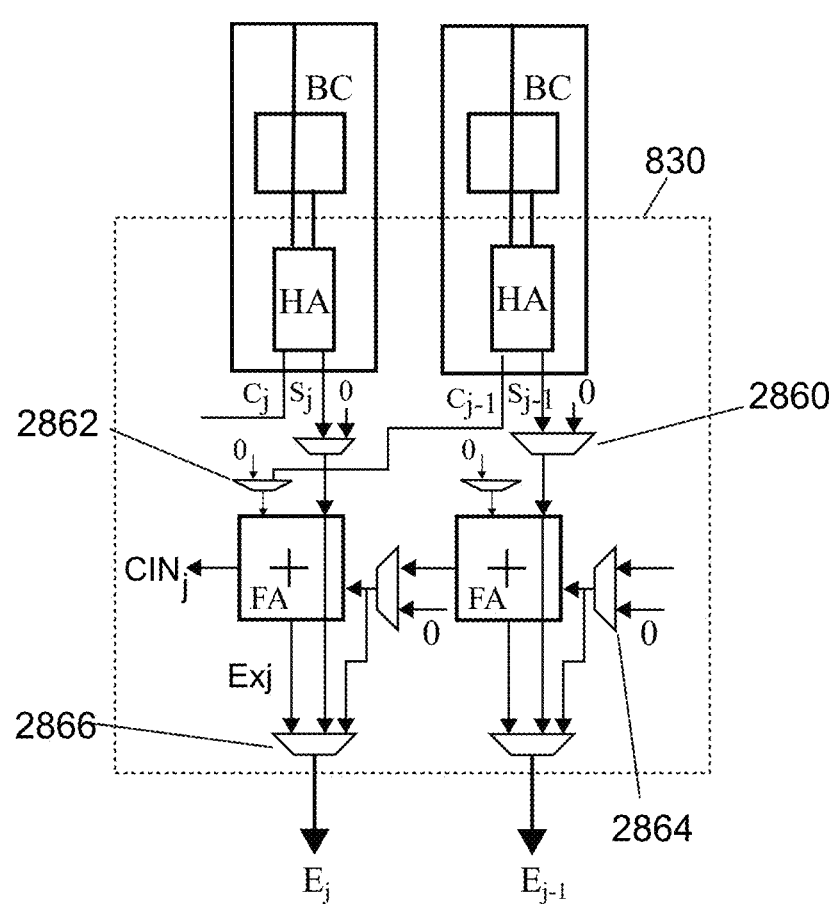
FIGS. 28-29 illustrate exemplary column cells for handling exponent bits for various FP data, in accordance with some aspects of the present disclosure.

To compute exponents of the primitive products for activation values and weight values in any possible FP formats beyond those listed in Table 2, similar exponent handling blocks 830 can be used in the column cell 220. FIG. 28 illustrates an exemplary design of the column cell 220 for handling exponents of the flexible FP data. Here only a portion of the column cell 220 is shown for simplicity. FIG. 28 illustrates two memory cells, each having one bitcell (BC). It is noted that each memory cell can have two or more bitcells. In FIG. 28, each bitcell stores a corresponding exponent bit of the weight value. The exponent handling block 830 in FIG. 28 includes logic circuits such as half adders (HA), full adders (FA) and multiplexers. The logic circuits of the exponent handling block 830 are arranged in stages, where each stage j is associated with a corresponding bitcell and the bit stored in the corresponding bitcell. To compute the exponent of the primitive product, the exponent bit of the weight value and a corresponding exponent bit of the activation value can be provided to a corresponding half adder. The half adder can add the corresponding exponent bits of the activation value and the weight value to produce one sum bit $S_j$ and one carry-out bit $C_j$. A first multiplexer 2860 selects zero or the sum bit $S_j$ produced by the half adder and output a first selection to a corresponding full adder. A second multiplexer 2862 selects zero or a prior stage carry-out bit $C_{j-1}$ from a prior stage half adder and output a second selection to the full adder. A third multiplexer 2864 selects zero or a carry-in bit $CIN_{j-1}$ from a prior stage full adder and output a third selection to the full adder. Namely, the full adder add the bits provided by the three inputs (the first selection from the first multiplexer 2860, the second selection from the second multiplexer 2862 and the third selection from the third multiplexer 2864) to produce an accumulation output $Ex_j$. The exponent handling block 830 can also include a fourth multiplexer 2866, which can be used to select the accumulation output $Ex_j$ from the full adder of the current stage, the first selection from the first multiplexer 2860 and the third selection from the third multiplexer 2864 to produce the carry-in bit $CIN_j$ for the next stage full adder and the exponent bit $E_j$ of the primitive product. To perform respective selections, the first multiplexer 2860, the second multiplexer 2862, the third multiplexer 2864 and the fourth multiplexer 2866 can be controlled by one or more control signals from the mode decoding unit 110 (in FIG. 1) according to a corresponding arithmetic mode and associated FP formats of the activation values and the weight values. The resulting exponent bits of the primitive product include the sum bit $S_{LSB}$ from the half adder for the LSBs of the exponents of the activation value and the weight value, the exponent bits $E_j$ output from the fourth multiplexers 2866, and the carry-in bit $CIN_{MSB}$ from the last stage full adder for the MSB of the exponent of the activation value and/or the MSB of the exponent of the weight value.

Figure 29:
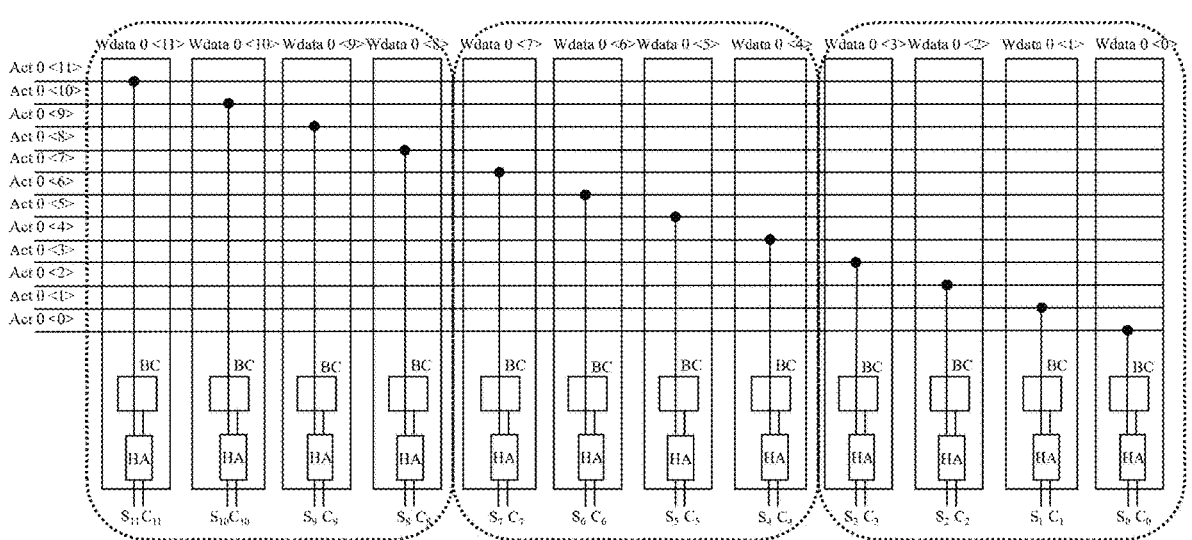

In some embodiments, a shared column cell can be implemented to support activation values and weight values having exponents with 4b, 3b or 2b. FIG. 29 illustrates an exemplary column cell for handling weight values and activation values in various floating point format. As shown in FIG. 29, the common cell 220 includes 12 columns and 12 rows, where number 12 is the least common multiple of number 4, 3, and 2. Each column has one memory cell, each memory cell having one bitcell. It is noted that one memory cell may have two or more bitcells. Each memory cell can store one bit of the weight value. Each row corresponds to one bit of the activation value. Accordingly, the column cell 220 can support activation values and weight values having exponents with 4b, 3b and 2b utilizing any combination of Act 0 <11:0> and Wdata 0 <11:0>. As shown in FIG. 29, for the weight value having exponent with 4b, the memory cells or bits of Wdata 0 can be arranged into 3 groups (capable of supporting 3 elements), each group can be used to store the exponent bits of the weight value. For the weight value having exponent with 3b and 2b, the memory cells can be arranged into 4 groups and 6 groups, respectively. Accordingly, the storage capacity of weight values in one column cell can be increased and the throughput of the column cell can also be increased by pipelining the adder tree through overlapping executions of multiple operations instructions. Similarly, a shared column cell can be implemented to support activation values and weight values having exponents with 5b, 4b, 3b or 2b, where the common cell 220 can include 60 columns and 60 rows, where number 60 is the least common multiple of number 5, 4, 3, and 2. The memory cells or bits of Wdata 0 can be arranged into 12, 15, 20 or 30 groups, respectively. In this example, the number of rows associated with action value bits Act 0 can be kept as a constant (e.g., constant 12 or 60), which determines the number of primitive products for the addition operation and the size of the adder tree 426 in each column of computing unit 222 (in FIGS. 2 and 4).

Mantissa computations of the primitive products for operation modes listed in Table 2 have been described with respect to FIG. 15 (3b×1b) for the activation value Act 0 in FP8 (1-4-3) format and the weight value Wdata 0 in FP4 (1-2-1) format, and FIG. 10 (3b×2b) for the activation value Act 0 in FP8 (1-4-3) format and the weight value Wdata 0 in FP6 (1-3-2) format. FIG. 30 illustrates an example of mantissa computation and associated mantissa handling block 832 for (3b×3b) and FIG. 31 illustrates an example of mantissa computation and associated mantissa handling block 832 for (4b×3b). In general, the mantissa handling block 832 includes a staggered array of full adders to perform the addition operations for the partial products between the mantissa bits of the activation values and the weight values. Multiplexers can be used to select inputs to each full adder as discussed above with respect to exponent computation for flexible FP data. For example, logic gates such as AND gates can be used to output partial products between mantissa bits of the activation value and mantissa bits of the weight value. Each multiplexer can select zero or a corresponding partial product and output a selection to a corresponding full adder based on a control signal from the mode decoding unit 110 (in FIG. 1) according to the arithmetic mode of the VMM computation and the FP formats of the activation values and the weight values. The full adders can output mantissa bits of the primitive product between the activation value and the weight value according to the selection made by the multiplexers.

However, exponent computation is more straightforward because each exponent bit corresponds to a full adder that can be configured to support flexible FP data with various possible combinations using multiplexers (see FIG. 28). Table 3 summarizes the number of full adders (FA) used for mantissa multiplication for FP data with various number of mantissa bits. As shown in Table 3, the total number of full adders needed for a single element of activation value and weight value can be as high as 15 or as low as 3. In general, the number of full adders per row is proportional to or related to the number of mantissa bits in the multiplicand (activation value) and the number of rows of full adders is proportional to or related to the number of mantissa bits in the multiplier (weight value).

TABLE 3

| Multiplicand | Multiplier | # of FA per row | # of FA rows | Total # of FA |
|---|---|---|---|---|
| 4 | 3 | 5 | 3 | 15 |
| 4 | 2 | 5 | 2 | 10 |
| 4 | 1 | 5 | 1 | 5 |
| 3 | 3 | 4 | 3 | 12 |
| 3 | 2 | 4 | 2 | 8 |
| 3 | 1 | 4 | 1 | 4 |
| 2 | 1 | 3 | 1 | 3 |

FIG. 32 illustrates an exemplary method 3200 for utilizing resources of the compute engine 100 for the VMM computation to support flexible FP data in various formats. At step 3202, a minimum number of exponent bits in each column cell is determined by finding the least common multiple among all the possible combination of exponent bits in the various FP formats supported by each column cell of the compute engine 100. At step 3204, the number of groups (or elements) of weight values for a given activation value bit (per row) can be determined for each column cell, which is the least common multiple of exponent bits divided by the number of exponent bits of per element of the weight value. At step 3206, a total number of mantissa bits supported per row can be determined for each column cell, which is the number of mantissa bits per element of the weight value multiplied by the number of elements. At step 3208, a total number of full adders needed in each column cell to produce the mantissa bits of the primitive products between the weight values and activation values can be determined, which is the total number of full adders per element computation multiplied by the number of elements. Table 4 (in FIG. 61) illustrates exemplary calculation for the number of full adders needed for the mantissa computation for weight values in FP8, FP6 and FP4 formats and activation values have 4 mantissa bits, where the total number of full adders per element computation (between one activation value and one weight value) is listed in Table 3. Table 5 (in FIG. 62) illustrates another exemplary calculation for the number of full adders needed for the mantissa computation for weight values in FP8, FP6 and FP4 formats and activation values have 3 mantissa bits.

FIG. 33 illustrates another exemplary method 3300 for utilizing resources of the compute engine 100 for the VMM computation to support flexible FP data in various formats. At step 3302, a minimum number of mantissa bits in each column cell is determined by finding the least common multiple among all the possible combination of mantissa bits in the various FP formats supported by each column cell of the compute engine 100. At step 3304, the number of groups (or elements) of weight values for a given activation value bit (per row) can be determined for each column cell, which is the least common multiple of mantissa bits divided by the number of mantissa bits per element of the weight value. At step 3306, a total number of exponent bits supported per row can be determined, which is the number of exponent bits per element of the weight value multiplied by the number of elements. At step 3308, a total number of full adders needed in each column cell to produce the mantissa bits of the primitive products between the weight values and activation values can be determined. Tables 6 and 7 (in FIGS. 63 and 64) illustrate exemplary calculations for the number of full adders needed for the mantissa computation for weight values in FP8, FP6 and FP4 formats and activation values have 4 or 3 mantissa bits, respectively.

In summary, exponent computation for the primitive products can be optimized to support multiple FP format options with some overhead in the exponent handling or computation by using extra multiplexers and global control signals. The number of bitcells for mantissa computation can be optimized per row for a given activation value bit. The number of full adders needed for the accumulation of the partial products of the mantissa bits may have a wide range in handling of flexible FP formats, which may not be amortized by changing the number of elements per row (see Tables 4-7). The method (in FIG. 32) starting the optimization with exponent bits is preferrable, where the number of full adders for mantissa computation may vary from 30 to 40s if the supporting formats are limited to certain FP4 and FP6 formats (see Table 4). There may be redundancy or waste when supporting flexible FP formats. For example, weight value of "0" is stored in the CIM macro 101 in bitcells, and flexible option are provided in computation methods and logic circuit designs. However, the potential redundancy or waste is not critical because the bitcells and their appended logic circuits are a small portion of the total power, performance and area (PPA) budget. The advantages of storing the weight value "0" includes straightforward design, easy to implement, and power gating for unused sections to save leakage power. Providing flexible options for VMM operation also enables storing multiple sets of weight values or a smaller macro to support a target size of weight value, and achieving higher throughput in the VMM operations.

It is noted that column cell 220 for row 0 and column 0 is used in the above descriptions as an example to describe the multiplication between the activation value in FP8 (1-4-3) format and the weight value in FP6 (1-3-2) format. However, features and functions of column cell 220 are not so limited and can be applied to other column cells in the CIM macro 101 to handle other FP formats of the activation values and weight values.

After producing the primitive products $P_{ik}=a_i \times w_{ik}$ for all the elements in the vector of activation values (i.e., $a_i$ with i=0, 1, 2, .... $N_E-1$, where $N_E$ is the total number of elements) and the weight values $w_{ik}$ in the kth column of CIM macro 101, the primitive products $P_{ik}$ can be added up to produce the dot product $Dot\_P_k$. To perform the addition operation for all the primitive products $P_{ik}$ with i=0, 1, 2, .... $N_E-1$, a mantissa alignment process can be performed first to convert the mantissas of the primitive products $P_{ik}$ from the FP format to INT format.

FIG. 34 illustrates an exemplary process flow 3400 for aligning the mantissas of the primitive products $P_{ik}$. In this example, the primitive products $P_{ik}$ has 13 bits, with 1 sign bit $P_{S\_i}<0>$, 5 exponent bits $P_{E\_i}<4:0>$ and 7 mantissa bits $P_{M\_i}<6:0>$. It is noted that mantissas of primitive products $P_{ik}$ in other FP formats can also be aligned using similar processes. The flow of mantissa bits during the alignment process is also depicted in FIG. 4, where $S_0$ corresponds to $P_{S\_i}<0>$, $(E_4:E_0)$ corresponds to $P_{E\_i}<4:0>$, and $(M_6:M_0)$ corresponds to $P_{M\_i}<6:0>$.

As shown in FIG. 34, at step 3402, a maximum exponent value $E_{max}$ among the $P_{E\_i}$<4:0> of all the primitive products $P_{ik}$ can be determined. For multiplication of FP8 (1-4-3)× FP6 (1-3-2), the maximum exponent value $E_{max}$ of the resulting primitive product is 22, which can be represented by a 5-bit integer INT5 (22). For multiplication of FP6×FP6, the maximum exponent value $E_{max}$ can be 14 instead.

At step 3404, a shift value $P_{shift\_i}$ of the mantissa bits of the primitive product $P_{ik}$ can be determined by subtracting an exponent value of $P_{E\_i}$<4:0> of the primitive product $P_{ik}$ from the maximum exponent value $E_{max}$, i.e., $P_{shift\_i}=E_{max}-P_{E\_i}$<4:0>. Here, the exponent value of $P_{E\_i}$<4:0> corresponds to the mantissa bits $P_{M\_i}$<6:0> to be shifted. To perform the subtraction, the exponent bits $P_{E\_i}$<4:0> can be converted to two's complement, which can be then added to $E_{max}$. The shift value $P_{shift\_i}$ can be any number from 0 to $E_{max}$. In some embodiments, the shift value $P_{shift\_i}$ can be represented in INT5 format. Referring to FIG. 4, the exponent bits (E4:E0) of all rows along with the maximum exponent value $E_{max}$ are provided for the shift value calculation. Here Row 0 to Row 31 corresponds to $N_E$=32 elements of primitive products $P_{ik}$.

At step 3406, mantissas of all the primitive products $P_{ik}$ (i=0, 1, 2, . . . . $N_E$–1) can be aligned through shifting the mantissa bits $P_{M\_i}$<6:0> of each primitive products $P_{ik}$ by a corresponding shift value $P_{shift\_i}$. FIGS. 35-39 illustrate exemplary schemes and processes for mantissa alignment in a computing unit of a CIM macro.

Figure 35:
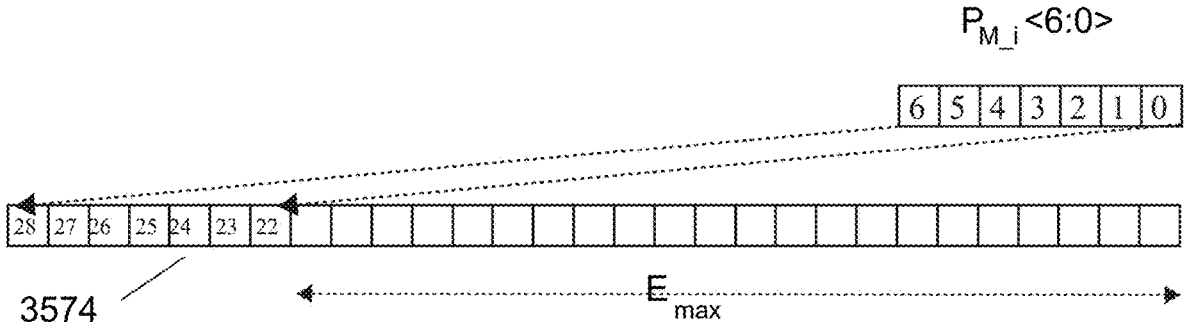

First, as shown in FIG. 35, the 7 mantissa bits $P_{M\_i}$<6:0> can be shifted, as a group, to the left, i.e., towards the MSB in a first shift register 3574 having a number of bits that equals $E_{max}$ plus the number of mantissa bits (e.g., 7b+22b=29b in FIG. 35). The number of bits shifted equals the maximum exponent value $E_{max}$ (e.g., 22 in FIG. 35). Except the positions for the mantissa bits $P_{M\_i}$<6:0>, the other bits in the first shift register 3574 can be filled with zeros.

Figure 36:
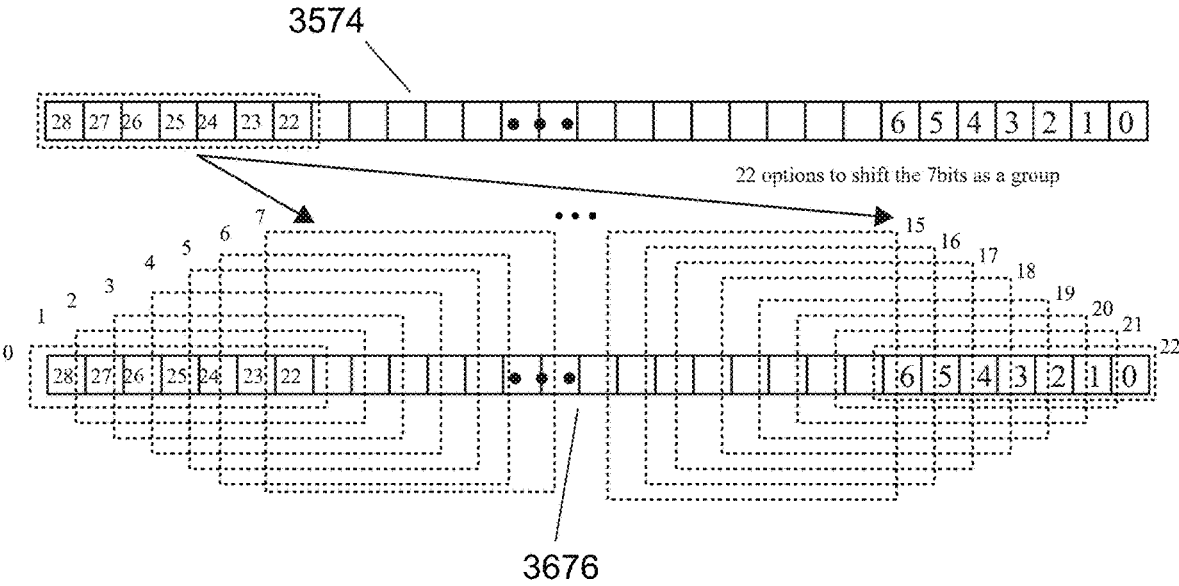

Next, the 7 mantissa bits $P_{M\_i}$<6:0> can be shifted, as a group, towards the right, where the shifted number of bits equals the shift value $P_{shift\_i}$ determined at step 3404. The shift value $P_{shift\_i}$ determines the position of the 7 mantissa bits $P_{M\_i}$<6:0>. As illustrated in FIG. 36, there can be $E_{max}$ number of possible positions for each set of mantissa bits $P_{M\_i}$<6:0>. In some embodiments, the mantissa bits $P_{M\_i}$<6:0> in the first shift register 3574 can be transferred to a second shift register 3676 to implement the shift.

Figure 37:
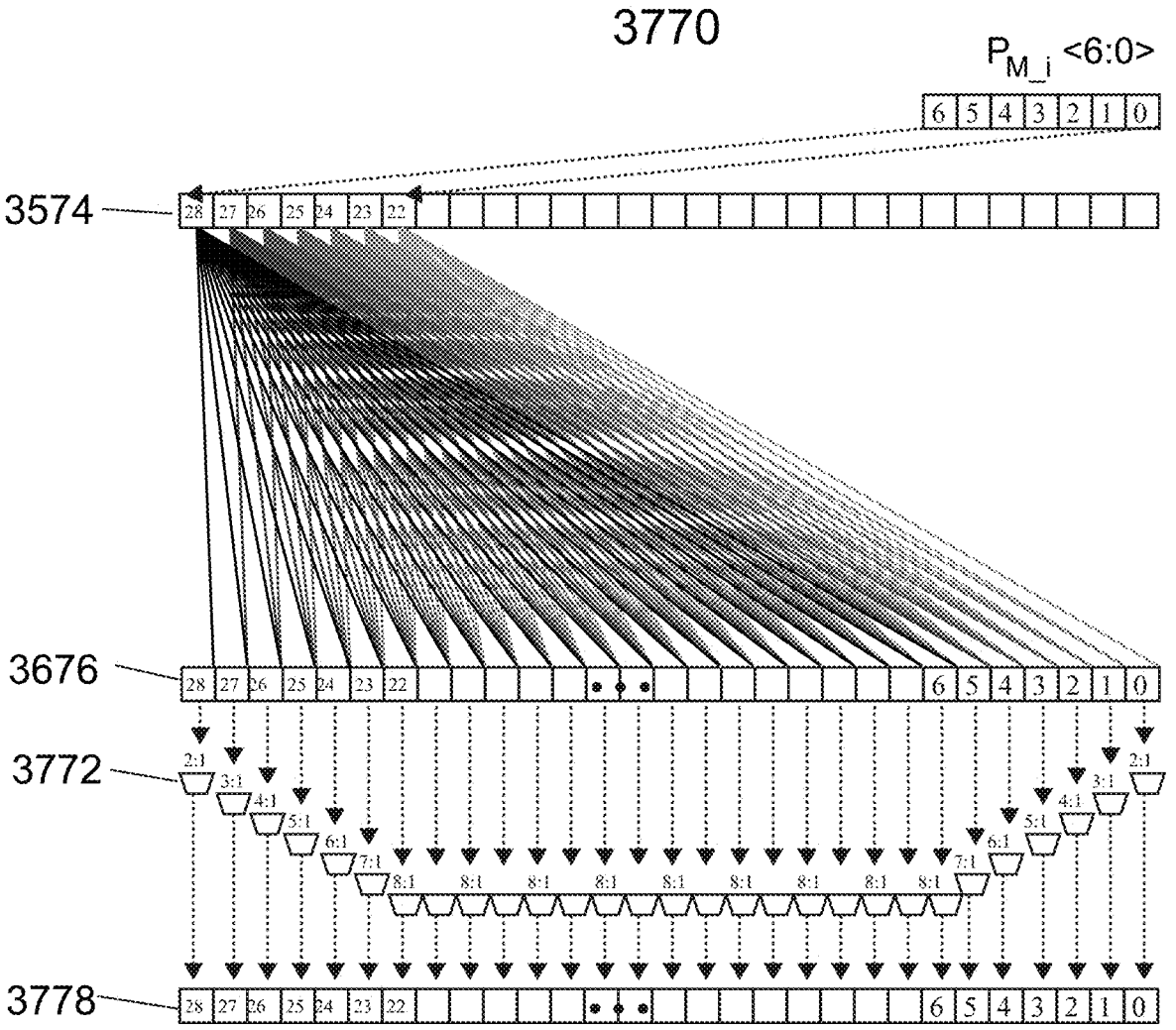

FIG. 37 illustrates an exemplary shifter 3770 for shifting the mantissa bits of a primitive product. The shifter 3770 includes a plurality of multiplexers 3772. The number of the multiplexers 3772 can be the same as the maximum exponent value $E_{max}$ plus the number of mantissa bits to be shifted (e.g., 29 as illustrated in FIG. 37). Because each set of mantissa bits $P_{M\_i}$<6:0> can have $E_{max}$ number of possible positions, every mantissa bit can be distributed to $E_{max}$ number of different multiplexers 3772. The maximum number of input bits per multiplexer can be n+1, where n the number of mantissa bits of the primitive product (e.g., $P_{M\_i}$<6:0> has 7 mantissa bits). The additional input to the multiplexers 3772 can a predetermined number "0" or "1," depending on the scheme of implementation, i.e., filling the rest of the bits with "0" or "1." The first and last groups of multiplexers may have inputs less than n+1 because the mantissa bits are shifted as a block and thereby not all bits can be shifted to all positions. Because the mantissa bits are shifted as a block, every one of the possible positions for the mantissa bits can be sent to a group of multiplexers to select the positions of all the mantissa bits, where the number of multiplexers in the group equals the number of mantissa bits. For example, in FIG. 37, every one of the possible positions can be sent to 7 multiplexers. The maximum number of inputs to each multiplexer is 7+1=8, while the first and last 6 multiplexers have inputs less than 8. In some embodiments, the multiplexers 3772 can be transmission gate multiplexers with specific select bits. The output of each multiplexer can be provided to a third shift register 3778 to store the shifted mantissa bits of the primitive product. Bit28 and Bit0 of the third shift register 3778 are respectively connected to the outputs of the first and last multiplexers having two inputs. Besides the predetermined number "0" or "1," the other input of the first and the last multiplexers is from the MSB and LSB of the mantissa bits, respectively. Bit27 and Bit1 of the third shift register 3778 are respectively connected to the outputs of the second and 28th multiplexers having three inputs, and so on. The shifter 3770 includes 2 sets of multiplexers 3772 having 2, 3, 4, 5, 6 and 7 inputs. The middle 17 multiplexers 3772 can have 8 inputs, corresponding to the maximum number of possible options. The shifter 3770 can also include (e.g., 29) inverters and (e.g., 170) logic gates, corresponding to the number of multiplexers 3772.

Figure 38:
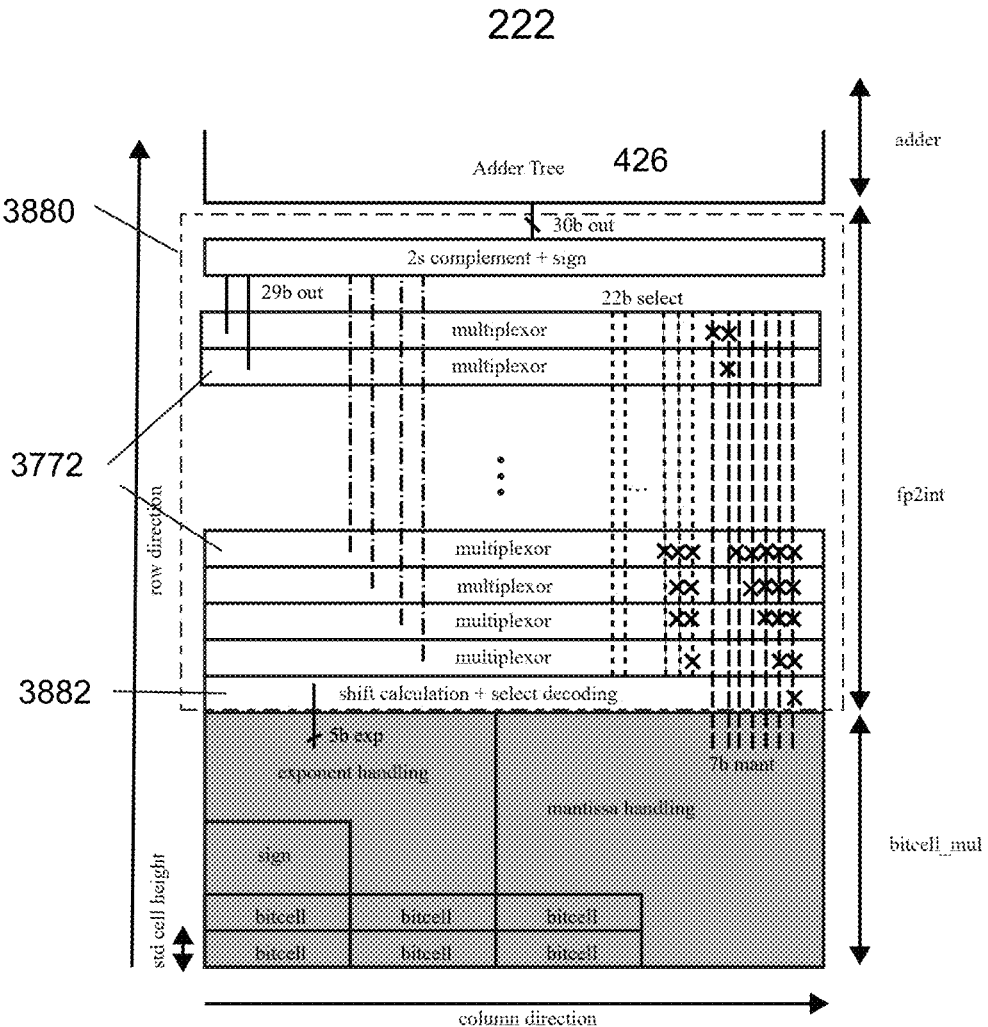
FIG. 38 illustrates an exemplary column cell for handling mantissa alignment, in accordance with some aspects of the present disclosure.

FIG. 38 illustrates an exemplary physical implementation of a column of computing unit 222 in the CIM macro 101, showing a functional block 3880 for mantissa alignment for the primitive products. The functional block 3880 for mantissa alignment includes a shift calculation and select decoding unit 3882 for determining the shift value $P_{shift\_i}$ for the mantissa of each primitive product. The functional block 3880 also includes multiplexers 3772 as described in FIG. 37. The shift calculation and select decoding unit 3882 can decode the shift value $P_{shift\_i}$ and generate control signals for the multiplexers 3772 according to the shift value $P_{shift\_i}$. The control signals are provided to the multiplexers 3772 to perform respective selection and thereby shift the mantissa bits of each primitive product. The functional block 3880 further includes a unit 3884 for computing two's complement and sign for the primitive products, as described below for step 3408. The functional block 3880 also includes registers (not shown in FIG. 38), such as the first shift registers 3574 (in FIGS. 35-37) and 3974 (in FIG. 39), the second shift registers 3676 (in FIGS. 36-37) and third shift registers 3778 (in FIG. 37) and 3978 (in FIG. 39). In some embodiments, other types of storage devices can be used instead of registers for temporarily storing the mantissa bits during shift operations, for example, programmable logic devices, latches, flip-flops, buffers and memory arrays.

Figure 39:
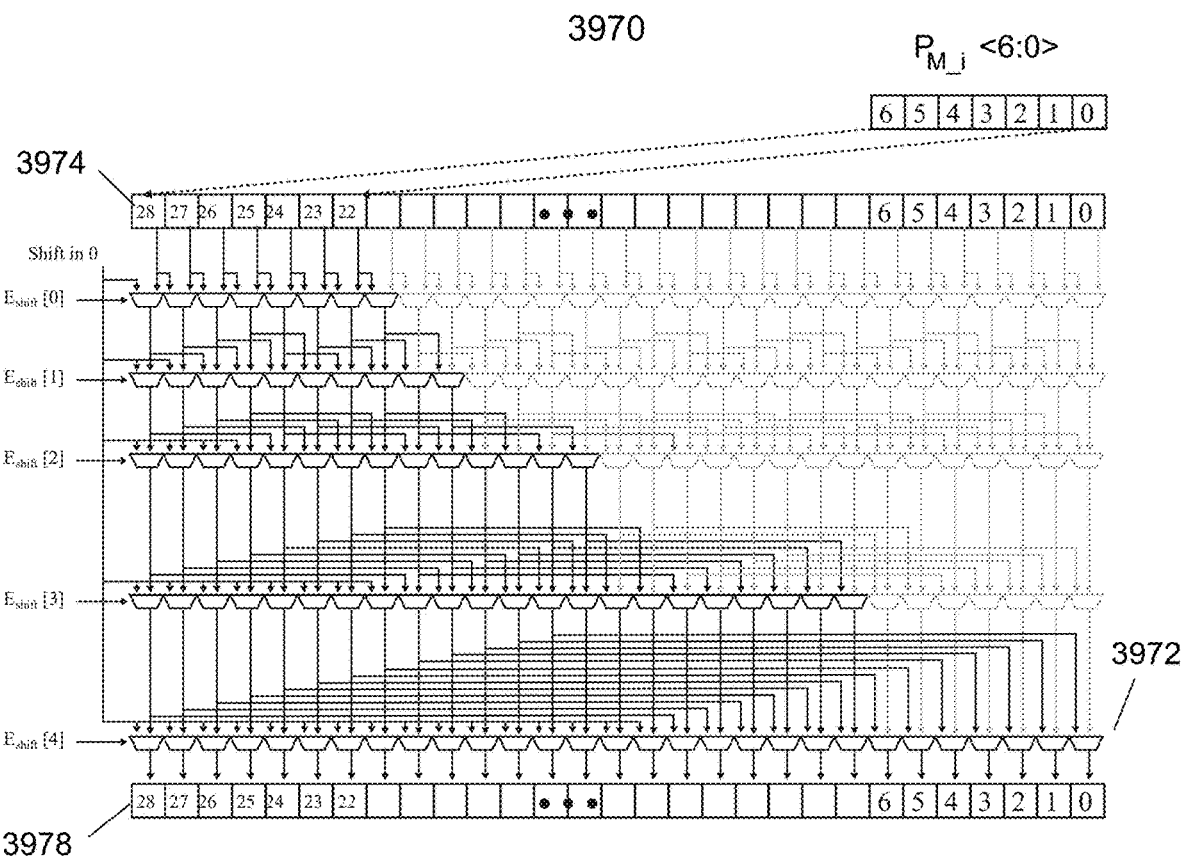
FIG. 39 illustrates another scheme for aligning the mantissas, in accordance with some aspects of the present disclosure.

FIG. 39 illustrates another exemplary shifter 3970 for shifting the mantissa bits of a primitive product. The shifter 3970 also includes a first shift register 3974 and a third shift register 3978, similar to the first shift register 3574 and the third shift register 3778 in FIG. 37. The shifter 3970 includes a plurality of multiplexers 3972 formed as a logarithmic tree. The shifter 3970 can shift mantissa bits of each primitive product without relying on a control signal decoded from the shift value $P_{shift\_i}$. For example, when the shift value $P_{shift\_i}$ has 5 bits, each bit of $P_{shift}$<4:0> can be used as a control signal to a respective row of multiplexers 3972 in shifter 3970. As shown in FIG. 39, the LSB of $P_{shift}$<4:0> is provided as the control signals to the top row of multiplexers 3972 and the MSB of $P_{shift}$<4:0> is provided as the control signals to the bottom row of multiplexers 3972. The bits $P_{shift}$<1>, $P_{shift}$<2> and $P_{shift}$<3> are provided as the controls signals to the second, third and fourth row of multiplexers 3970, respectively. An output of the multiplexer 3972 on an upper row is provided as an input to a corresponding multiplexer at a lower row. At least one of the multiplexers 3972 in each row is configured to select a number "0" or an output from an upper multiplexer in an upper row. Also, at least one of the multiplexers 3972 in each row is configured to select a first output from a first upper multiplexer and a second output form a second upper multiplexer in a same row as the first upper multiplexer. There are 8, 10, 14, 22 and 29 multiplexers in the $1^{st}$, $2^{nd}$, $3^{rd}$, $4^{th}$ and $5^{th}$ row, respectively, for a total of 83 multiplexers. The shifter 3970 may also include (e.g., 83) inverters and (e.g., 166) logic gates. There are several advantages of shifter 3970. First, no decoder is needed for the shift value $P_{shift\_i}$, where every bit of the shift value $P_{shift\_i}$ is directly used as control signals for the multiplexers 3972. There are less wires to route for the logarithmic tree configuration. There is less loading on mantissa bits. Shifter 3970 can also allow shifting "0" from right and "1" from left to handle two's complement conversion during shifting.

Referring to FIG. 34, at step 3408, the aligned mantissa bits of each primitive product can be sent to the adder tree 426 (in FIGS. 4 and 38) to compute the accumulation of all the primitive products $P_{ik}$ (i=0, 1, 2, . . . , $N_E$−1) in the kth column of computing unit. For example, after shifting the mantissa bits, the sign bit along with the 29 bits stored in the third shift register 3778 (in FIG. 37) or 3978 (in FIG. 39), i.e., for a total of 30 bits represented in INT30 format, can be sent to the adder tree 426. After receiving the shifted mantissa bits from all the primitive products $P_{ik}$ (i=0, 1, 2, . . . . $N_E$−1) in the kth column, the adder tree can perform addition and produce an accumulation value of all the primitive products $P_{ik}$ (i=0, 1, 2, . . . . $N_E$−1) in INT35 format, which can be output as the dot product $Dot\_P_k$ for the kth column of the CIM macro (see also FIG. 4).

In some embodiments, prior to sending to the adder tree, the shifted mantissa bits can be converted to two's complement if the sign of the primitive product is negative (see FIG. 4).

In some embodiments, the conversion of two's complement can be fused into the aligning ad shifting step 3406 (in FIG. 34) for optimized performance because the rest of the bits in the shift registers (e.g., the first shift register 3574 in FIG. 35 and the third shift register 3778 in FIG. 37) are zeros except for the mantissa bits. Thus, when the sign of the primitive product is "1" indicating a negative number, the mantissa bits can be inverted before performing the aligning and shifting at step 3406. The rest of the shift registers can be filled with "1" instead of "0" during the aligning and shifting operations. FIG. 40 shows an exemplary RTL implementation of mantissa alignment.

Figure 41:
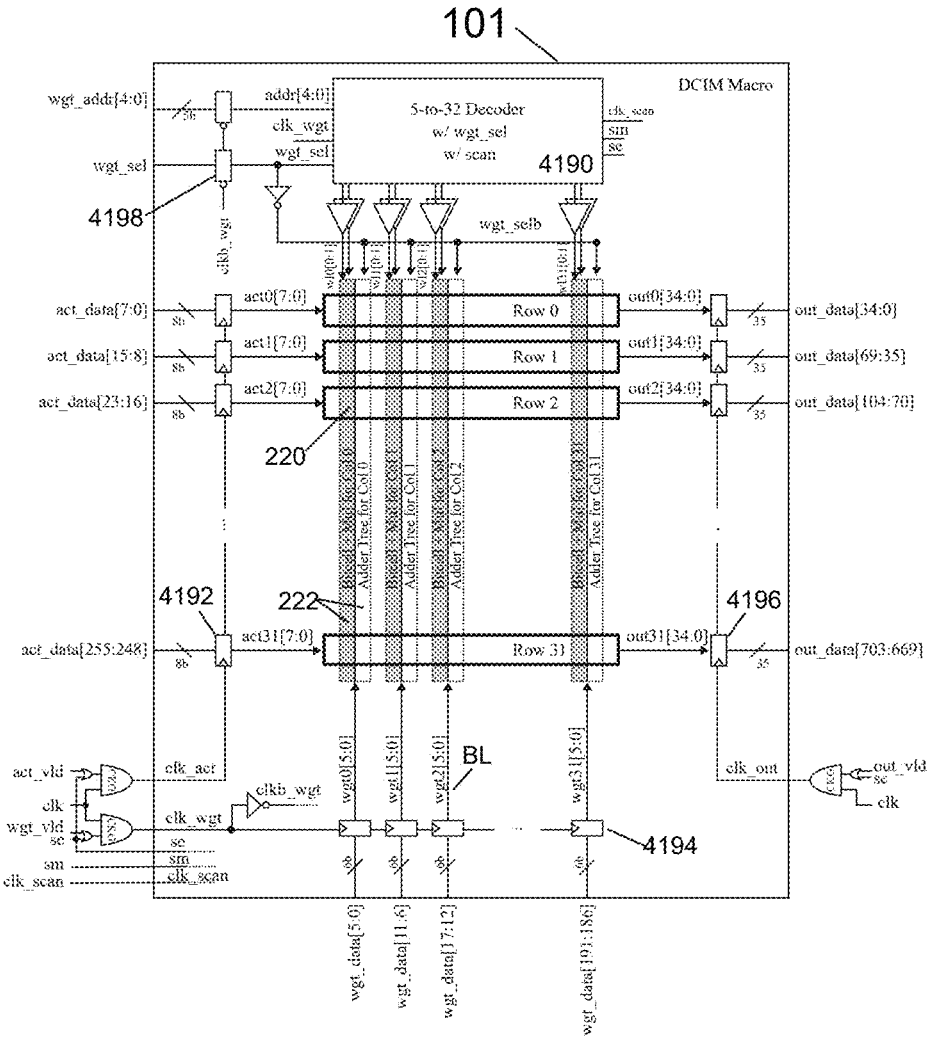
FIG. 41 illustrates various signals in a CIM macro, in accordance with some aspects of the present disclosure.

FIG. 41 illustrates exemplary interface signals and timing components for the CIM macro 101. As shown in FIG. 41, activation value data act_data can be provided to the column cells 220 row-by-row through a first set of input latches 4192, which output activation data signals act0, act1, . . . , act31. In this example, there are 32 activation values (i.e., a vector of 32 elements). Each of the activation data signal act0, act1, . . . , act31 has 8 bits with a total 256 bits in one set of activation data signals act0, act1, . . . , act31. The first set of input latches 4192 can be controlled by an activation clock signal clk_act.

The CIM macro 101 includes a weight address decoder 4190 (e.g., a 5-32 decoder), which decodes a weight address signal e.g., a 5-bit wgt_addr[4:0] signal, to generate word-line signals for the computing units 222. In the example in FIG. 41, 32 wordline signals wl0, wl1, . . . wl31 are provided to the column cells 220 in the computing units 222 column-by-column.

Weight value data wgt_data can be written into the column cells 220 through a second set of latches 4194, which output weight data signals wgt0, wgt1, wgt2, . . . , wgt31. In this example, there are 32 columns of computing units 22 and thereby 32 columns of column cells, which correspond to the 32 activation values. Each of the weight data signals wgt0, wgt1, wgt2, . . . , wgt31 has 6 bits, for a total of 192 bits in one set of weight data signals wgt0, wgt1, wgt2, . . . , wgt31. Each computing unit 222 is connected to a corresponding one of the second set of latches 4194 through a bitline (BL). The second set of input latches 4194 can be controlled by a weight clock signal clk_wgt.

The CIM macro sends output data out_data through output latches 4196. In the example in FIG. 41, the computing units 222 can output 32 output data signals out0, out1, . . . , out31 in parallel, where each of the output data signals out0, out1, . . . , out31 having 35 bits. After the VMM operation, 32 dot products between the 32 activation values and the 32×32 weight values can be output through output data signals out0, out1, . . . , out31. The output latches 4196 can be controlled by an output clock signal clk_out.

In FIG. 41, clock signals for the CIM macro 101, e.g., clk_act, clk_wgt, clk_out and clk_scan, are gated in the compute engine 100 outside of the CIM macro 101. The clock signals can be gated by selectively disabling the clock signals to portions of a synchronous circuit when they do not need to toggle, which can reduce resource overhead and enhance power savings. Data signals, e.g., act_data and wgt_data, can be registered with or coupled to respective gated clocks to have clean timing boundaries for the CIM macro 101. In some embodiments, registers used for the data signals can be positive-edge scannable flipflops.

Figure 42:
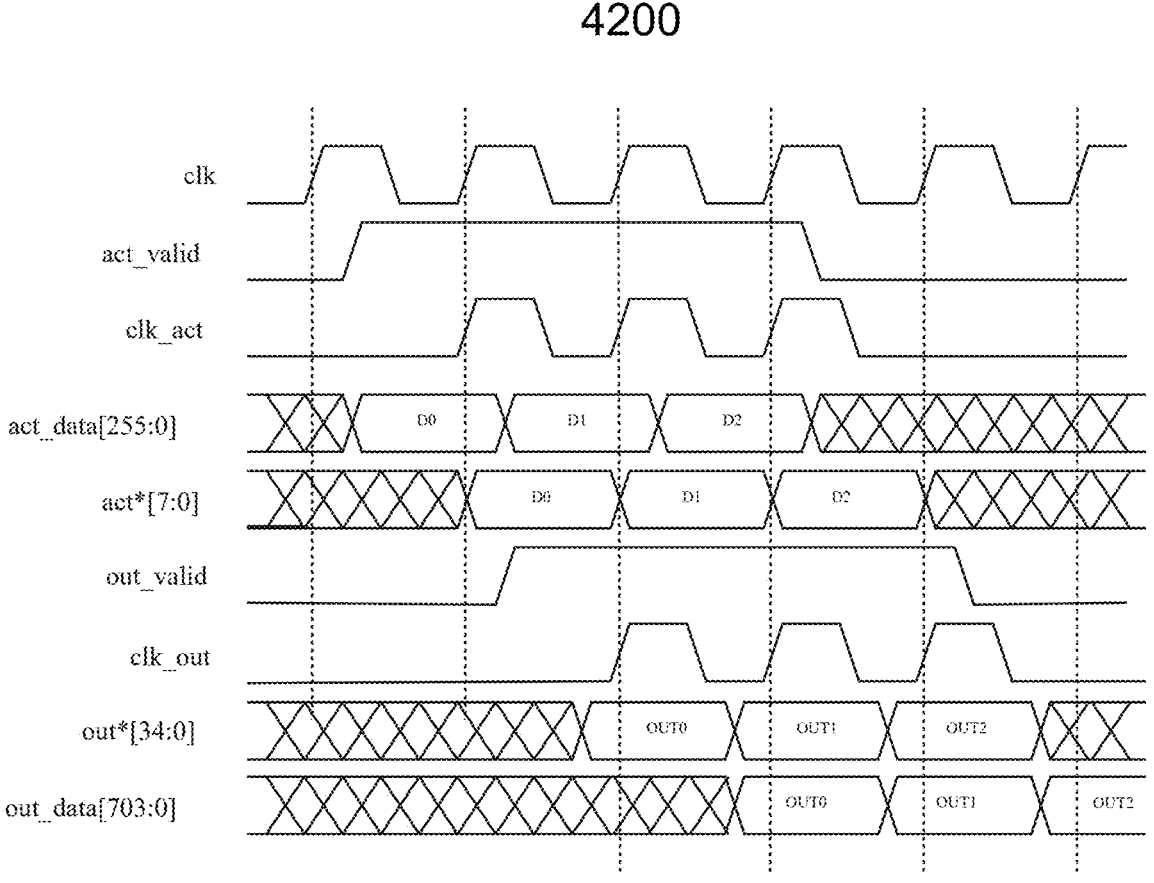
FIG. 42 illustrates a timing diagram for a compute operation in a CIM macro, in accordance with some aspects of the present disclosure.

FIG. 42 illustrates an exemplary timing diagram 4200 of the CIM macro 101 depicted in FIG. 41. The timing diagram in FIG. 42 can be used for the VMM operation discussed in the present disclosure. Multiple sets of activation values can be provided with a single stage pipeline. As shown in FIG. 42, there are 3 sets of activation data D0, D1, and D2, where each set of activation data can represent one vector of activation values discussed in Section II. Pipeline stages can be changed according to timing requirements and PPA targets.

As discussed above, each memory cell in the CIM macro can include one, two or more bitcells (see also FIGS. 3 and 8). The following discussions use a double-bitcell design as an example, where each memory cell includes two bitcells.

Figure 43:
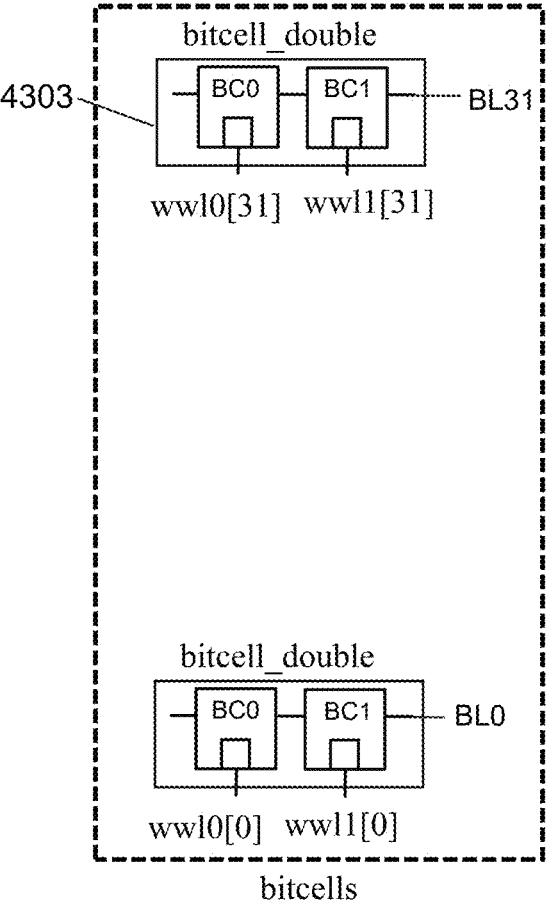
FIG. 43 illustrates an exemplary double-bitcell design, in accordance with some aspects of the present disclosure.

FIG. 43 illustrates an exemplary schematic diagram of a stack of memory cells 4303. The stack of memory cells 4303 can be included in the computing unit 222 of the CIM macro shown in FIG. 2, where each computing unit 222 can include multiple columns of the stack of memory cells 4303, where each column cell 220 in FIG. 2 can includes multiple memory cells 4303 in a row (see FIG. 3).

As shown in FIG. 43, each memory cell 4303 includes two bitcells BC0 and BC1, which can be accessed via separate wordlines wwl0 and wwl1. Each of the two bitcells BC0 and BC1 can store one bit of the weight values. The two bitcells BC0 and BC1 in each memory cell 4303 can share one bitline BL for writing or scanning the bits of weight values. For example, the two bitcells BC0 and BC1 in the memory cell 4303 of the top row share the bitline BL31, where bitcell BC0 can be addressed by wordline wwl0 and bitcell BC1 can be address by wordline wwl1.

In some embodiments, bitcell BC0 can store a first bit of a first weight value and bitcell BC1 can store a second bit of a second weight value that is different from the first weight value. Namely, each memory cell 4303 can store two bits from two different weight values. In this example, the column cell 220 in FIGS. 2 and 3 can include a first set of bitcells storing the first weight value and a second set of bitcells storing the second weight value that is different from the first weight value. A first set of wordlines wwl0 and a second set of wordlines wwl1 can be used to address the first set of bitcells and the second set of bitcells, respectively. As such, two different weight values can be provided by the memory cells in one column cell to enable simultaneous operations, e.g., VMM, writing, or scan operations. For example, the first set of bitcells can perform a write operation and the second set of bitcells can perform a VMM operation.

Figure 44:
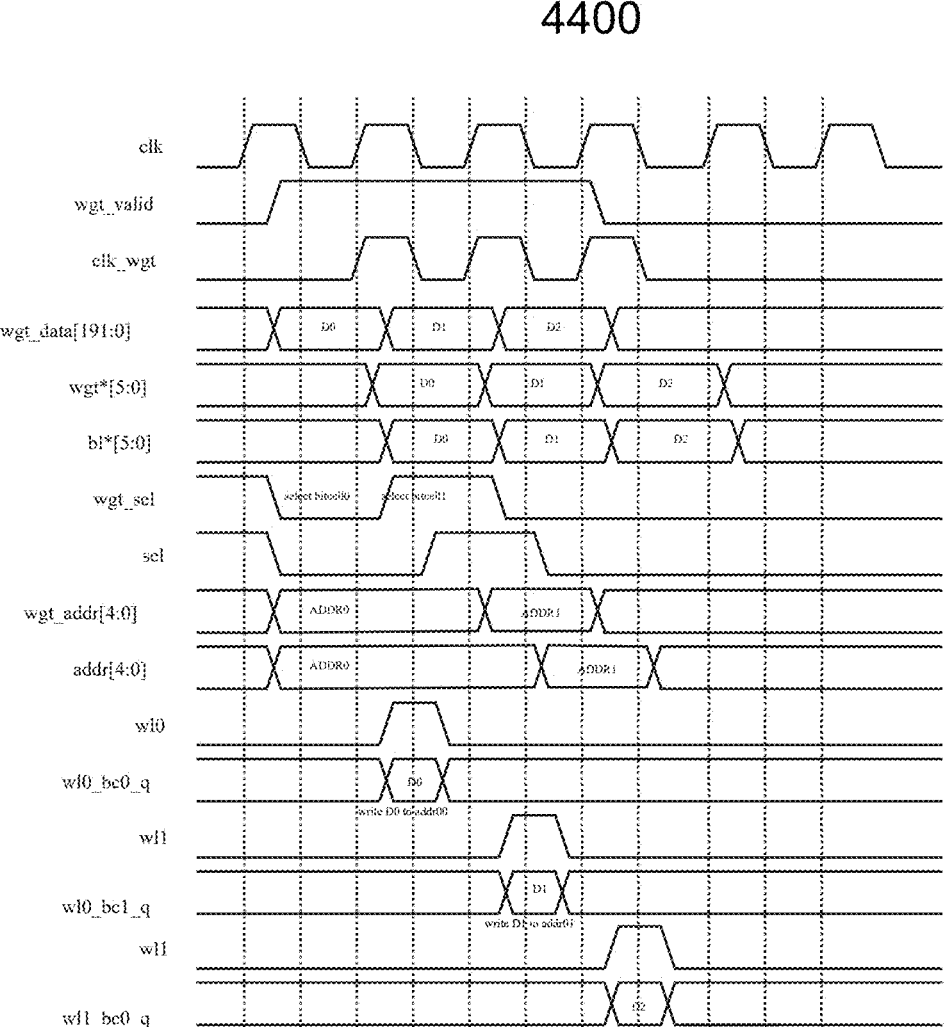
FIG. 44 illustrates a timing diagram of a CIM macro for a write operation, in accordance with some aspects of the present disclosure.

The parallel operations of the memory cell 4303 with doube-bitcells can be controlled by a weight select signal wgt_sel. FIG. 44 illustrates an exemplary timing diagram 4400 for operations related to weight values in the CIM macro 101 having double-bitcells. As shown in FIGS. 41 and 44, the weight select signal wgt_sel can determine which bitcell BC0 or BC1 to be accessed for various operations (e.g., write and VMM operations). According to the weight select signal wgt_sel and the weight address signal wgt_addr, the first two cycles in FIG. 44 are write operations for two weight values D0 and D1 provided by the weight value data wgt_data, where the weight value DO is written to bitcell BC0 at address ADDR0, and the weight value D1 is written to bitcell BC1 at address ADDR1. During the write operation of last cycle in FIG. 44, weight value D2 is written to bitcell BC0 at address ADDR1.

In one example, the weight select signal wgt_sel can be treated as an extra address bit for write operations, which can be fused into the weight address decoder 4190 (in FIG. 41). The weight address decoder 4190 can select one of the wordlines according to the weight select signal wgt_sel and the weight address signal wgt_addr, e.g., select 1 out of 64 wordlines (2 wordlines per memory cell for a total of 32 elements).

Referring to FIGS. 41 and 44, the weight address signal wgt_addr and the weight select signal wgt_sel can be latched with an inverted weight clock signal clkb_wgt through a set of select latches 4198, to pre-decode the weight address signal ahead of the clock's rising edge. As shown in FIG. 41, weight value data wgt_data are provided to the column cells 220 through the second set of latches 4194 controlled by the weight clock signal clk_wgt. Accordingly, the weight address signal wgt_addr and the weight address signal wgt_addr can be latched together and can thereby enable write operations without functional failure risk. Latched weight address signal wgt_addr and weight select signal wgt_sel can be decoded and gated by a high phase of the weight clock signal clk_wgt to create the wordline signals.

As shown in FIGS. 41 and 44, weight value data wgt_data can be sent in or out of the computing units 222 through the bitlines (BL), which can take place when the wordline signals wl0, wl1, . . . , wl31 are in high phases. Because the wordline signals wl0, wl1, . . . , wl31 transition to low phases when the weight clock signal clk_wgt is kept in a low phase, changing of weight value data wgt_data on the BLs takes place at the rising edge of the weight clock signal clk_wgt.

As shown in FIG. 44, all wordlines connected to the bitcells BC0 can be activated at the same time by setting the weight select signal wgt_sel to, e.g., a low phase. All wordlines connected to bitcells BC1 can be activated at the same time by setting the weight select signal wgt_sel to, e.g., a high phase. To separate from a write operation, a scan enable signal se can be set to high, e.g., se=1, during a scan operation.

Figure 45:
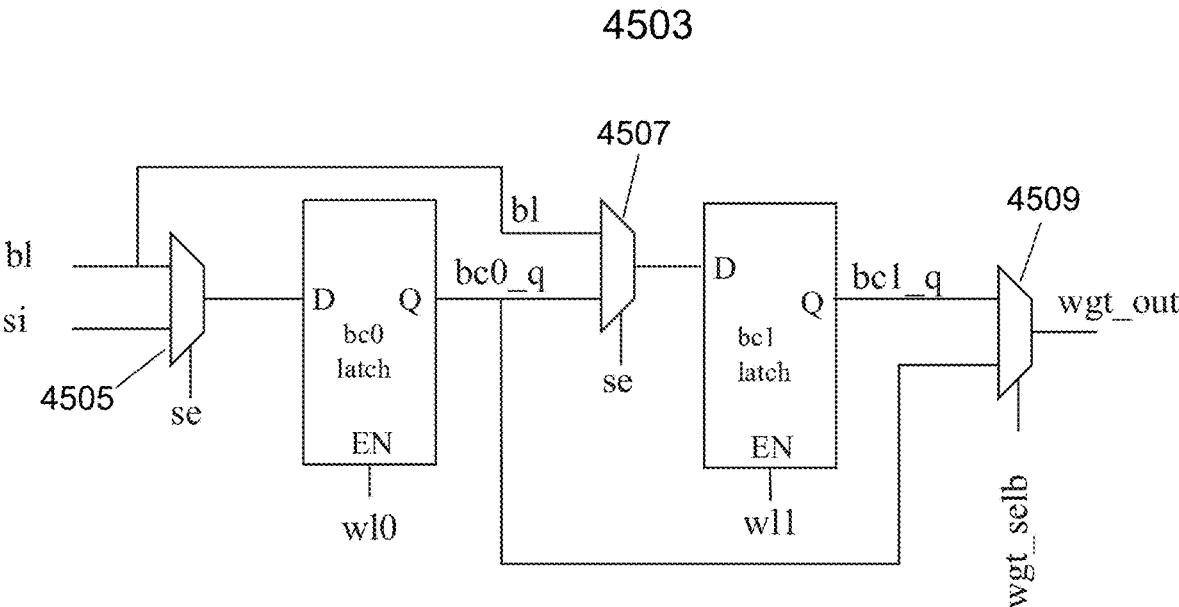
FIG. 45 illustrates an exemplary double-bitcell design, in accordance with some aspects of the present disclosure.

FIG. 45 illustrates an exemplary circuit diagram for a memory cell 4503 with double bitcells. The memory cell 4503 is similar to the memory cell 4303 in FIG. 43 and also includes two bitcells BC0 and BC1. In FIG. 45, bitcells BC0 and BC1 can be implemented using latches bc0 and bc1, respectively. It is noted that the implementation of bitcells BC0/BC1 is not so limited and can be other types of storage devices such as registers, flip-flops, programmable logic devices.

In FIG. 45, each latch bc0/bc1 has two inputs (a data input D and a clock signal EN) and one output Q that follows the data input D as long as the clock signal EN is high. When the clock signal EN goes low, the output Q is stored in the latch bc0/bc1 until the next rising edge of the clock signal EN. As shown in FIG. 45, the clock signals EN of the latches bc0 and bc1 are wordline signals wl0 and wl1, respectively, and can be provided through wordlines wwl0 and wwl1 (in FIG. 43).

The memory cell 4503 also includes three multiplexers: a first weight select multiplexer 4505, a second weight select multiplexer 4507 and a weight output multiplexer 4509. The first weight select multiplexer 4505 and the second weight select multiplexer 4507 are controlled by the scan enable signal se. The outputs of the first weight select multiplexer 4505 and the second weight select multiplexer 4507 are sent to the data inputs D of the latches bc0 and bc1, respectively. A bitline signal bl and a scan in signal si are the two inputs to the first weight select multiplexer 4505. The bitline signal bl and an output signal bc0_q from the latch bc0 are the two inputs to the second weight select multiplexer 4507. The output signal bc0_q from the latch bc0 and an output signal bc1_q from the latch bc1 are the two inputs to the weight output multiplexer 4509, where the weight output multiplexer 4509 can be controlled by an inverted weight select signal wgt_selb and outputs an output signal wgt_out. The inverted weight select signal wgt_selb can be generated by an inverter based on the weigh select signal such that when the weight select signal is in a high phase, the inverted weight select signal is in a low phase and vice versa.

In some embodiments, the weight select signal wgt_sel can be sent to a low-phase latch in the CIM macro 101 for the decoding of the weight address signal wgt_addr during the writing operations for weight value updates. The low-phase latch is transparent during the low phase of the clock. Referring to FIGS. 41 and 44-45, the weight select signal wgt_sel and the weight address signal wgt_addr can be sent to the weight address decoder 4190 to generate the wordline signals, e.g., wl0 for bitcell BC0 (latch bc0 in FIG. 45) and wl1 for bitcell BC1 (latch bc1) for all 32 elements (i.e., all column cells in one column of computing unit 222). The bit of the wordline signal wl0/wl1 determines which bitcell (BC0/BC1) to be accessed per element (i.e., in each memory cell of the column cells) for the write operation.

During VMM operations, the weight select signal wgt_sel determines output from which bitcell BC0/BC1 to be used for the computation. As shown in FIG. 45, the weight output multiplexer 4509 sends the output signal wgt_out by selecting the output signal bc0_q from the latch bc0 or the output signal bc1_q from the latch bc1 according to the inverted weight select signal wgt_selb, assuming that during write operations the true version of the weight select signal wgt_sel are used for wordlines. It is noted that write operation and VMM operation can be performed in parallel in two different bitcells. Therefore, the true version of the weight select signal wgt_sel can be sent to the weight address decoder 4190 and the inverted version of the weight select signal wgt_selb can be sent to the weight output multiplexer 4509 in the memory cells having doubt-bitcells.

Referring to FIGS. 41, 43-45, each column cell of the CIM macro can include a first set of bitcells BC0 for storing a first weight value wgt_data_0 and a second set of bitcells BC1 for storing a second weight value wgt_data_1 that is different from the first weight value wgt_data_0, where the first set of bitcells BC0 and the second set of bitcells BC1 can be accessible through a first set of wordlines wwl0 and a second set of wordlines wwl1, respectively. The write operation can be performed in the first set of bitcells BC0 in parallel with the VMM operation performed in the second set of bitcells BC1 based on the weight select signal wgt_sel. Each bitcell of the first set of bitcells BC0 share a bitline BL with a corresponding bitcell of the second set of bitcells BC1. The weight address decoder 4190 generates a first set of wordline signals wl0 for the first set of wordlines wwl0 and a second set of wordline signals wl1 for the second set of wordlines wwl1 based on the weight address signal wgt_addr and the weight select signal wgt_sel. The write operation can be performed in the first set of bitcells BC0 according to the first set of wordline signals wl0 when the weight select signal wgt_sel is in a low phase, and can be performed in the second set of bitcells BC1 according to the second set of wordline signals wl1 when the weight select signal wgt_sel is in a high phase.

During the write operation, the weight address decoder 4190 can generate the first set of wordline signals wl0 and the second set of wordline signals wl1 based on the weight select signal wgt_sel and the weight address signal wgt_addr. The first set of wordline signals wl0 and the second set of wordline signals wl1 can then be provided to the first set of bitcells BC0 and the second set of bitcells BC1 through the first set of wordlines wwl0 and the second set of wordlines wwl1, respectively. The first set of bitcells BC0 and the second set of bitcells BC1 can be activated or deactivated according to the first set of wordline signals wl0 and the second set of wordline signals wl1. For example, when the first set of bitcells BC0 is activated for the write operation (i.e., updating the weight value wgt_data) when the weight select signal wgt_sel is in a low phase, the second set of bitcells BC1 is deactivated. When the second set of bitcells BC1 is activated for the write operation (i.e., updating the weight value wgt_data) when the weight select signal wgt_sel is in a high phase, the first set of bitcells BC1 is deactivated.

In the meantime, a weight value to be written/updated (e.g., wgt_data) can be provided to a set of bit lines BL shared by the first set of bitcells BC0 and the second set of bitcells BC1, and can be written into the activated first set of bitcells BC0 or the activated second set of bitcells BC1.

Concurrently, the inverted weight select signal wgt_selb can be generated based on the weight select signal wgt_sel (e.g., through an inverter) and can be provided to a set of weight output multiplexers 4509 to select first outputs bc0_q of the first set of bitcells BC0 or second outputs bc1_q of the second set of bitcells BC1. When the first set of bitcells BC0 is activated for the write operation (i.e., updating the weight value wgt_data), the inverted weight select signal wgt_selb can control the set of weight output multiplexers 4509 to select the second outputs bc1_q of the second set of bitcells BC1 that are deactivated from the write operation and send the outputs wgt_out to logic circuits in the column cell for computations like VMM operation. For example, the set of weight output multiplexers 4509 can select the second outputs bc1_q of the second set of bitcells BC1 deactivated for the write operation when the weight select signal is in the low phase, and select the first outputs bc0_q of the first set of bitcells BC0 deactivated for the write operation when the weight select signal is in a high phase. Accordingly, the write operation can be performed concurrently with the VMM operation in the same column cell of the CIM macro.

In some embodiments, the weight select signal wgt_sel can have a setup time with respect to the weight clock signal clk_wgt, and can have another setup time with respect to the activation clock signal clk_act, to enable write and compute within the same cycle. To support concurrent weight select update, weight value update, and computation within the same cycle, the following relationships between an activation valid signal act_vld (in FIGS. 41-42), a weight valid signal wgt_vld (in FIGS. 41 and 44) and the weight select signal wgt_sel are to be satisfied:

$$act\_vld=H \ \& \ wgt\_vld=H \ \& \ wgt\_sel=H2L\|L2H,$$

where "H" and "L" stand for a high phase and a low phase, respectively. "H2L" and "L2H" stand for a high to low phase transition and a low to high phase transition, respectively, where "&" and "‖" are symbols for logic AND and OR, respectively.

While write operation can be performed on one of the two bitcells in one memory cell according to the update of the weight value update, the weight select signal wgt_sel can be changed for switching to another bitcell in the memory cell and VMM computation can be performed from the corresponding bitcell. In some embodiments, the weight select signal wgt_sel for weight update and the VMM computation can be fit within one cycle, and the setup time for the weight select signal wgt_sel can be adjusted accordingly. When the weight select signal wgt_sel is sent to the weight address decoder 4190 through a low-phase latch, write operation cannot be more than half a cycle.

Additionally, there is no functional race between the generating of the wordline signal wl0/wl1 using the weight select signal wgt_sel and driving the weight output multiplexer using the inverted weight select signal wgt_selb. Because VMM computation uses combinational logic instead of sequential logic, the data can be updated even if the output signal wgt_out from the weight output multiplexer 4509 (in FIG. 45) arrives later, as long as all inputs are stable before the next clock cycle. In some embodiments, the parallel write operation and VMM operation can be timed for power savings.

The CIM macro 101 can support the following scan operations. First, the CIM macro 101 can compute with a known set of activations and weights. This scan operation includes the following steps:
  a. Scan shift in activation registers to a known state;
  b. Scan shift in bitcell registers to a known state;
  c. Launch clock signal clk and activation valid signal act_vld for computing; and
  d. Capture output at output registers and scan out.

Note that this test can be done even if the bitcells are not scannable. The assumption would be that the write operation has been successfully performed for 32 cycles to achieve the known 32×32 array of weight values.

Second, the CIM macro 101 can write one or multiple rows. This scan operation includes the following steps:
  a. Scan shift in bitcell registers to a known state;
  b. Launch clock signal clk, weight valid signal wgt_vld, and weight address signal wgt_addr for writing to a known row; and
  c. Scan out the bitcell registers to see the change of the written row data for bitcell 0.

Third, the CIM macro 101 can update the weight value. This scan operation includes the following steps:

a. Scan shift in bitcell registers to a known state;

b. Launch clock signal clk, weight update signal wgt_update for updating the weight values;

c. Scan out the bitcell registers, where weight values in bitcell 0 may stay the same and weight values in bitcell 1 can be updated to be same as bitcell 0.

Fourth, the CIM macro can write one or multiple rows and update the weight values. This scan operation includes the following steps:

a. Scan shift in bitcell registers to a known state;

b. Launch clock signal clk, weight valid signal wgt_vld, weight address signal wgt_addr, and weight update signal wgt_update for writing to a known row and updating the weight values;

c. Scan out the bitcell registers to verify data change in written bitcell 0 row and all bitcell 1 rows.

The following devices and logic circuits may be used during a scan operation (scan chains):

1. Activation registers

2. Weight registers

3. Bitcell registers→bitcell0 and bitcell1

Figure 46:
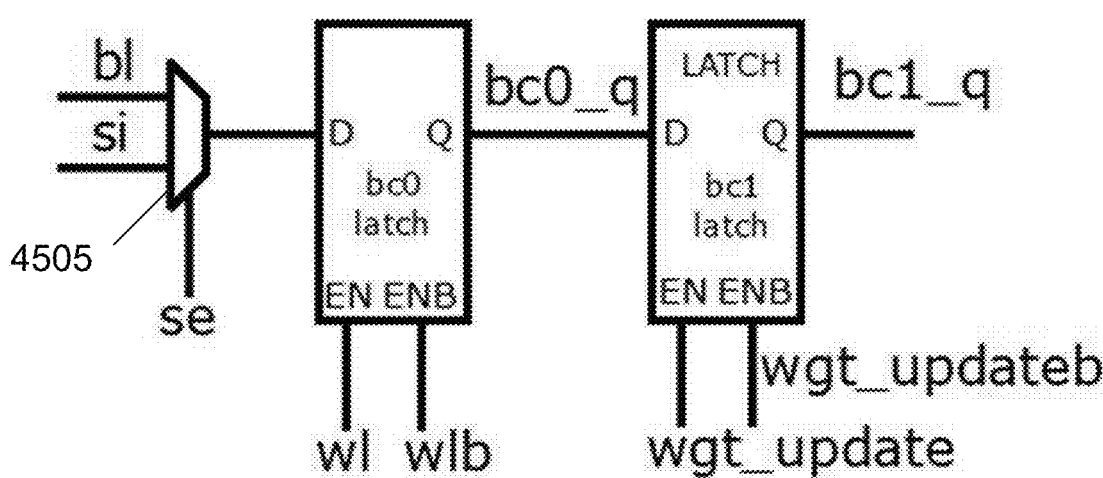
FIGS. 46, 47, 48 illustrate exemplary double-bitcell designs for scan operations, in accordance with some aspects of the present disclosure.

4. Pipeline output registers: at the output of bitcell and multiplexers or fp2int during mantissa alignment or adder tree 5. latches for weight address signal wgt_addr and weight update signal wgt_update Bitcell timing is critical in scan operations. FIG. 46 illustrates an exemplary circuit diagram for a memory cell 4603 having double bitcells bc0 and bc1, according to another embodiment of the present disclosure. Different from memory cell 4503 in FIG. 45, the memory cell 4603 is configured to perform a scan operation. Similar to the memory cell 4503 in FIG. 45, bitcells BC0 and BC1 of the memory cell 4603 can be implemented using latches bc0 and bc1, respectively. The memory cell 4603 is different from the memory cell 4503, in that each of the two latches bc0 and bc1 in the memory cell 4603 includes two clock signals EN and ENB, where clock signal ENB is an invert signal of the clock signal EN. The two clock signals EN and ENB of the latch bc0 are controlled by the wordline signal wl and an inverted wordline signal wlb, respectively. The two clock signals EN and ENB of the latch bc1 are controlled by a weight update signal wgt_update and an inverted weight update signal wgt_updateb, respectively.

Similar to the memory cell 4503 in FIG. 45, the memory cell 4603 also includes the first weight select multiplexer 4505, having two inputs: the bitline signal bl for the write operation and the scan in signal si for the scan operation. The first weight select multiplexer 405 is controlled by the scan enable signal se and sends its output to the data input D of latch bc0. The data input D of latch bc1 is the output bc0_q from latch bc0. The output of the memory cell 4603 is the output from latch bc1, i.e., bc1_q.

In scan mode, the wordline signal wl receives a low-phase pulse of a scan clock signal clk_scan, and the weight update signal wgt_update receives a high-phase pulse of the scan clock signal clk_scan. It is critical that the weight update signal wgt_update does not overlap with the wordline signal wl. Because the wordline signal wl and the weight update signal wgt_update are generated through different logic paths, it is necessary to check timing and margin very carefully across many processes, voltages and temperatures (PVTs). In some embodiments, the wordline signal wl and the weight update signal can be gated at the latest stage of signal generation with the scan enable signal se and the scan clock signal clk_scan to match the origin of these two signals. Additionally, routing of the wordline signal wl and the weight update signal may also affect their timing reaching latches bc0 and bc1. In one example, the wordline signal wl and the weight update signal can be routed similarly.

Figure 47:
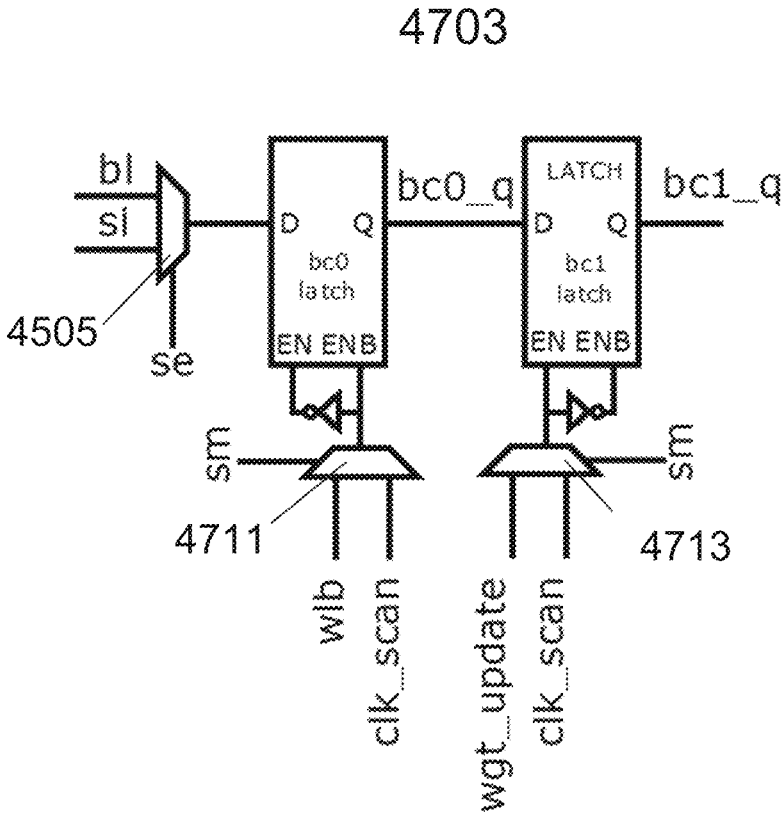

FIG. 47 illustrates another exemplary memory cell 4700 having double bitcells configured for a scan operation. Memory cell 4703 in FIG. 47 can be similar to memory cell 4603 in FIG. 46. However, unlike memory cell 4606, memory cell 4703 may includes two additional multiplexers (a first scan multiplexer 4711 and a second scan multiplexer 4713) and two additional clocks (the scan clock signal clk_scan and a scan mode signal sm). The first scan multiplexer 4711 and the second scan multiplexer 4713 can be controlled by the scan mode signal sm.

Two inputs of first scan multiplexer 4711 can be the inverted wordline signal wlb and the scan clock signal clk_scan. Two inputs of the second scan multiplexer 4713 can be the weight update signal wgt_update and the scan clock signal clk_scan.

In some implementations, an output of the first scan multiplexer 4711 can be sent to the clock signal ENB of the latch bc0, and the output of the second scan multiplexer 4713 can be sent to the clock signal EN of the latch bc1. In this example, the scan clock signal clk_scan can toggle for a scan operation, and thereby the routing of the scan clock signal ckl_scan may not have a significant impact on the timing of the clock signals EN and ENB between latch bc0 and bc1.

In some implementations, adding multiplexers can be advantages for controlling the timing of latch bc0 and bc1 during a scan operation, but may introduce overhead that may impact area, power, and the timing of computation and write and update of the weight values.

In some embodiments, memory cell 4703 can operate in different modes. For example, memory cell 4703 may operate in a functional mode, for normal weight storage and update operations, and a scan mode, for design-for-test (DFT) operations. The scan mode signal sm can select between these modes for both latches in memory cell 4703. Additionally, or alternatively, when sm is deasserted, first scan multiplexer 4711 can couple the inverted wordline signal wlb to the enable input ENB of latch bc0 and second scan multiplexer 4713 can couple the weight update signal wgt_update to the enable input EN of latch bc1. In this functional configuration, latch bc0 and latch bel can therefore be clocked according to the normal timing of wordline and weight update events, so that the presence of the scan structure does not alter the critical timing between the two latches or along the main compute path of the bitcell.

When the scan mode signal sm is asserted, the behavior of memory cell 4703 can be reconfigured for scan operations. In this scan configuration, first scan multiplexer 4711 and second scan multiplexer 4713 can each select the scan clock signal clk_scan, thereby driving both enable inputs ENB and EN of latches bc0 and bc1 from the same scan clock domain. As clk_scan toggles, scan data can be shifted serially through the latches from the scan input si (selected by multiplexer 4505 in scan mode) toward the next element in the scan chain at node bc1_q. Because the clocking of both latches is now synchronized to clk_scan, scan shifting can be performed in a controlled and predictable manner without relying on functional wordline or weight update activity.

The combination of scan multiplexers 4711 and 4713, scan clock clk_scan, and scan mode signal sm can allow memory cell 4703 to share the same storage elements for both functional and test purposes while isolating the routing and timing of the scan clock from the normal computation path. For example, clk_scan can be physically routed with relaxed skew and latency constraints appropriate for DFT, since it is only selected in scan mode, while wlb and wgt_update can be optimized for the tight timing requirements of weight access and update operations. This separation can help preserve the performance of the compute-in-memory array during normal operation while still providing full scan visibility into bitcell state during manufacturing test or debug.

In some implementations, integrating scan functionality directly into memory cell 4703 as shown in FIG. 47 can simplify the construction of longer scan chains across multiple bitcells or columns. Because each memory cell 4703 already includes the necessary multiplexing and shared scan clocking, neighboring cells can be connected by wiring bc1_q of one cell to the scan input si or equivalent input of an adjacent cell, forming a continuous scan path through an entire row or column of weight storage elements. Although the additional multiplexers 4505, 4711, and 4713 and the distribution of clk_scan may introduce some overhead in terms of silicon area and power, such overhead can be offset by improved test coverage, easier fault isolation, and reduced need for separate scan latches outside of the compute-in-memory array.

In some implementations, memory cell 4703 can correspond to at least a portion of a bitcell column within a compute-in-memory (CIM) macro that stores weight values used for tensor operations such as vector-matrix or matrix-matrix multiplications. For example, latch bc0 can be configured to store a first bit of a first weight value associated with a first column or row of the CIM macro, and latch bel can be configured to store a second bit of a second weight value associated with a different column or row of the CIM macro. In such configuration, the output bc0_q of latch bc0 can be electrically coupled to a scan input of latch bc1, such that the two latches form successive elements of a scan chain, even though they may store bits of different weight values during functional operation.

The combination of the first scan multiplexer 4711, the second scan multiplexer 4713, scan mode signal sm, and scan clock signal clk_scan can enable a CIM macro to multiplex between functional timing signals and scan timing signals without duplicating storage elements. When memory cell 4703 is in functional mode, the enable inputs ENB and EN of latches bc0 and bc1 can be driven by wlb and wgt_update, respectively, and the latches can be updated in response to wordline and weight-update events in synchrony with the rest of the weight array. For example, when memory cell 4703 is in scan mode, the enable inputs ENB and EN can instead be driven synchronously by clk_scan, allowing scan data to be shifted through latches bc0 and bc1 without disturbing normal wordline or weight-update signaling in other memory cells that remain in functional mode.

Moreover, a scan functionality implemented in memory cell 4703 can be extended across multiple bitcells in a column or row of the CIM macro. For example, a plurality of memory cells 4703 can be arranged such that the output bc1_q of one memory cell 4703 is coupled to the scan input si of a subsequent memory cell 4703, thereby forming a continuous scan path traversing an entire column of weight-storage elements. Further, the first latch bc0 of each memory cell can function as a "first bitcell" in the scan path segment for that cell, and the second latch bc1 can function as a "second bitcell" in the scan path segment, with the outputs and inputs of adjacent latches interconnected to create a longer scan chain.

In some aspects, scan multiplexers 4711 and 4713 can be placed physically close to latches bc0 and bc1 so that functional clock signals (such as wlb and wgt_update) and scan clock signal clk_scan can be routed along separate clock networks. For example, the wordline-related signal wlb and the weight update signal wgt_update can be routed along timing-critical networks that are optimized for minimal skew and low insertion delay, while the scan clock signal clk_scan can be routed along a separate, less timing-critical network primarily used during manufacturing test or debug. Because first scan multiplexer 4711 and second scan multiplexer 4713 select clk_scan when scan mode signal sm is asserted, the physical routing characteristics of clk_scan may have little or no impact on the timing closure of the functional clock paths to latches bc0 and bc1.

In some embodiments, memory cell 4703 can further include an input-side multiplexer configured to select between a bitline signal BL carrying data associated with a weight write or update operation and a serial scan input signal si associated with a scan chain. When scan mode signal sm indicates functional mode, multiplexer 4505 can couple the bitline BL to a data input of latch bc0 so that latch bc0 can capture a bit of a weight value from the CIM macro's write path. When scan mode signal sm indicates scan mode, multiplexer 4505 can instead couple the scan input signal si to the data input of latch bc0 so that scan data can be shifted into latch bc0 under control of clk_scan. This configuration can allow the same latches bc0 and bc1 to participate in both weight storage and scan shifting without additional dedicated scan storage elements.

The described scan architecture can support different operating methods for the CIM macro and for a computing device that includes the CIM macro. For example, during normal operation, the computing device can perform a tensor operation by loading weight values into the CIM macro using the wordline and weight-update mechanisms described above, storing bits of first and second weight values in corresponding latches bc0 and bel across multiple memory cells 4703, and then invoking compute cycles in which the CIM macro uses the stored weight bits to perform multiply-accumulate operations on activation data. During such functional operation, scan mode signal sm can remain deasserted so that first scan multiplexer 4711 and second scan multiplexer 4713 select wlb and wgt_update, respectively, and scan clock signal clk_scan may be held at a static value or disabled.

The computing device can switch the CIM macro into a scan mode to perform design-for-test operations. For instance, test control logic can assert scan mode signal sm, causing first scan multiplexer 4711 and second scan multiplexer 4713 to select scan clock signal clk_scan for both latches bc0 and bc1. The computing device can then toggle clk_scan to shift a sequence of scan data bits through latches bc0 and bel of memory cell 4703, and through corresponding latches of neighboring memory cells, by propagating data from scan input si toward bc1_q and then into scan inputs of successive memory cells. By observing scan outputs at the end of the scan chain, the computing device can verify the integrity of the weight-storage path, detect stuck-at faults in the latches or multiplexers, and validate the correct operation of the scan-mode control signals.

Moreover, control circuitry of the CIM macro or of a higher-level memory controller can generate the mode signal sm described above based on commands received from a processor or test controller. For example, a processor can issue configuration writes to a control register that encodes whether the CIM macro is to operate in a functional mode or a scan mode, and internal decode logic can generate sm accordingly. The same mode signal sm can be distributed to scan multiplexers 4711 and 4713 and to multiplexer 4505 across multiple memory cells 4703, ensuring that all such cells switch coherently between functional mode and scan mode. In addition, the processor can coordinate timing of clk_scan and any scan chain capture or compare operations as part of a broader built-in self-test (BIST) or external test protocol.

In some embodiments, the structures described with respect to memory cell 4703 can be integrated into a larger system comprising a processor and memory subsystem. For example, the CIM macro including multiple memory cells 4703 can be coupled to a processor that orchestrates both training-time or inference-time tensor operations and one or more scan operations. The processor can initiate functional tensor operations by supplying activation data and scheduling compute cycles while the CIM macro operates in functional mode, and can selectively pause compute activity and transition the CIM macro into scan mode to perform test sequences or diagnostics. Because the scan clock signal clk_scan is separated from the functional control signals wlb and wgt_update, such test sequences can be executed without significantly disturbing the timing characteristics of the tensor-operation pipeline.

The method of operating the computing device can include storing bits of different weight values in first and second cells that correspond to latches bc0 and bc1 of one or more memory cells 4703, receiving mode signal sm indicative of functional mode or scan mode, controlling scan multiplexers 4711 and 4713 in response to sm to select appropriate clock signals for latches bc0 and bc1, and performing a tensor operation using data stored in the CIM macro while the CIM macro is in functional mode. When sm indicates scan mode, the method can further include controlling multiplexers 4711, 4713, and 4505 so that clk_scan and scan data are applied to the latches, thereby forming an active scan chain used to shift in or shift out diagnostic patterns. In this way, the same cell-level structures can support both normal tensor operations and scan-based test procedures within a unified operating method.

Further variations for memory cells are possible. For example, while FIG. 47 illustrates two latches bc0 and bc1 per memory cell 4703, the same techniques may be extended to bitcells having more than two latches, or to configurations where the first and second cells store bits of the same multi-bit weight value rather than bits of different weight values in different positions of the CIM macro. Similarly, although clk_scan and sm are illustrated as single-ended digital signals, differential or multi-phase scan clocks and multi-bit mode encodings may be employed in other implementations, provided that the scan multiplexers are able to select between functional and scan clocking behaviors in a manner consistent with the foregoing description.

Figure 48:
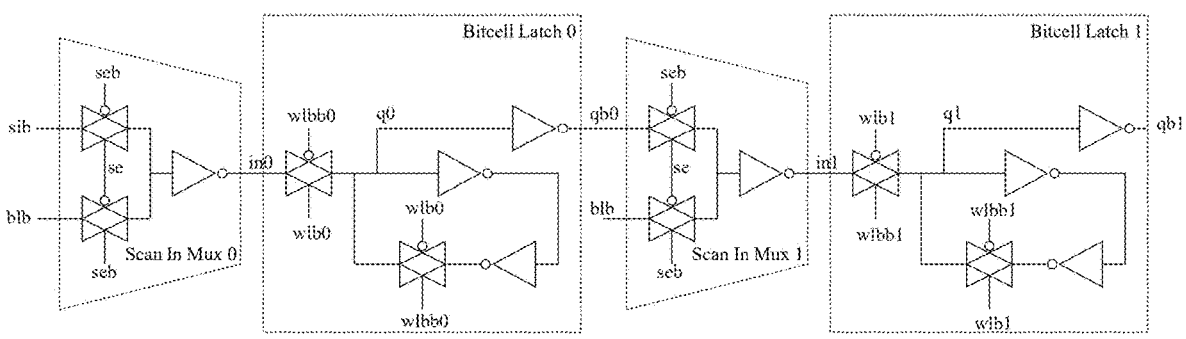

FIG. 48 illustrates exemplary circuit design of a memory cell 4803 with double bitcells. The memory cell 4803 is similar to memory cell 4503 (in FIG. 45), memory cell 4603 (in FIG. 46) and memory cell 4703 (in FIG. 47). The memory cell 4803 is configured to perform a scan operation. Similar to memory cell 4503 in FIG. 45, the memory cell 4803 also includes two multiplexers, scan in mux 0 and scan in mux 1, connected in series with bitcell latch 0 and bitcell latch 1. The memory cell 4803 may include another multiplexer (not shown) similar to the weight output multiplexer 4509 in FIG. 45.

Figure 49:
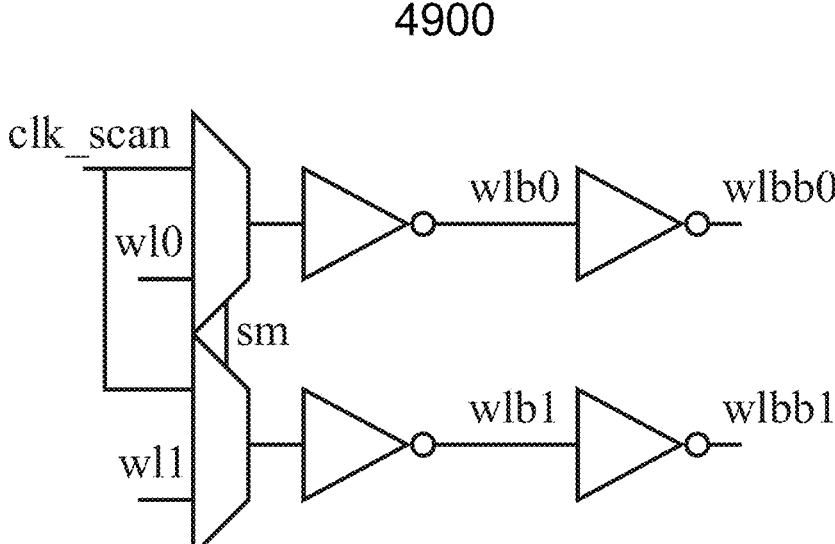
FIG. 49 illustrates an exemplary circuit for generating wordline signals, in accordance with some aspects of the present disclosure.

As shown in FIG. 48, the scan in mux 0 and the scan mux 1 each includes two transmission gates and one inverter. The bitline latch 0 and the bitline latch 1 each includes two transmission gates and three inverters. The two transmission gates of bitcell latch 0 are control by a wordline control signal wlb0 and an inverted wordline control signal wlbb0. The two transmission gates of bitcell latch 1 are control by a wordline control signal wlb1 and an inverted wordline control signal wlbb1. FIG. 49 illustrates an exemplary circuit 4900 for generating wordline signals for a memory cell with double bitcells. As shown in FIG. 49, the wordline control signals wlb0, wlbb0, wlb1 and wlbb1 can be generated using wordline signal wl0 and wl1 along with scan clock signal clk_scan.

Figure 50:
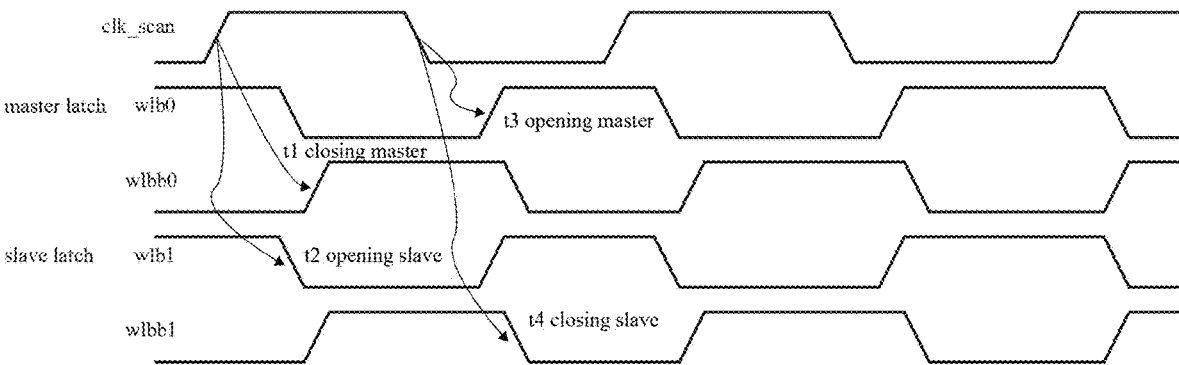
FIG. 50 illustrates a timing diagram for a scan operation, in accordance with some aspects of the present disclosure.

FIG. 50 illustrates an exemplary timing diagram 5000 for a scan operation. The timing diagram in FIG. 50 is based on the double-bitcell design shown in FIGS. 48 and 49. As shown in FIG. 50, the rising edge of the scan clock signal clk_scan generates a rising edge in wordline control signal wlbb0 for closing the master latch (i.e., bitcell latch 0) with a delay of t1, and generates a falling edge in wordline control signal wlb1 for opening the slave latch (i.e., bitcell latch 1) with a delay of t2. The falling edge of the scan clock signal clk_scan generates a rising edge in wordline control signal wlb0 for opening the master latch with a delay of t3, and generates a falling edge in wordline control signal wlbb1 for closing the slave latch with a delay of t4.

Ideally, the transparent pulse of the slave latch (i.e., bitcell latch 1) should be smaller than the opaque phase of the master latch. The following script can be written to monitor these time delays:

t4 closing slave<t3 opening master if not true; internal hold violation t4−t3 (inv+mismatch*)<in0→in1 (tx+inv+tx+inv)

t1 closing master>t2 opening slave if not true; increase hold for input data t2−t1 (inv+mismatch*)<prev stage q1→in0 (inv+tx+inv)

where tx stands for transmission gate and inv stands for inverter.

As shown in FIG. 48, data delay between the transmission gates of bitcell latch 0 and bitcell latch 1 (i.e., internal hold) are q0→inv→tx→inv→in1. Data delay between the transmission gates of bitcell1 and next element bitcell0 (i.e., external hold for scan in) are q1→inv→tx→inv→sib*. Accordingly, in the current implementation in FIG. 50, the hold time for internal and external data can be the same. In some embodiments, the hold time for internal data can be adjusted because bitcell latche 0 and bitcell latch 1 can be controlled independently. Therefore, hold time for internal and external data can be treated similarly for the double-bitcell design in FIGS. 48-50.

Figure 51:
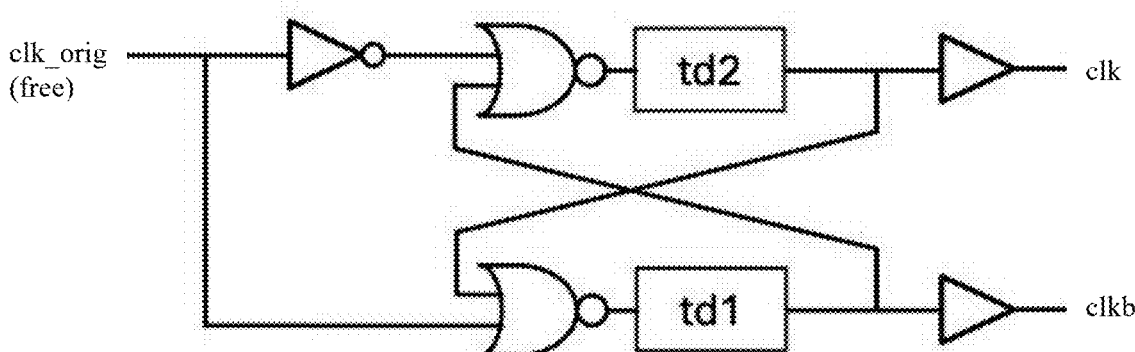
FIG. 51 illustrates a circuit diagram for generating clock signals for a scan operation, in accordance with some aspects of the present disclosure.
Figure 52A:
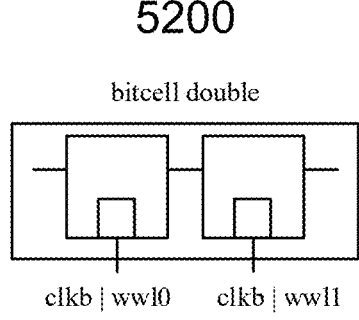
FIG. 52A illustrates another double-bitcell design for scan operations, in accordance with some aspects of the present disclosure.
Figure 52B:
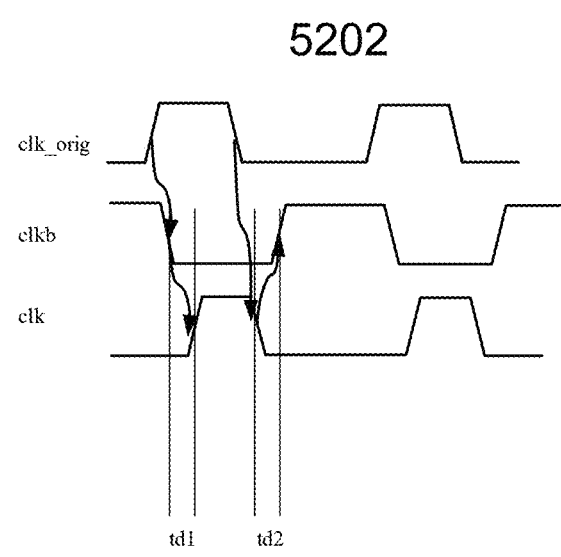
FIG. 52B illustrates a timing diagram for scan clocks, in accordance with some aspects of the present disclosure.

FIG. 51 illustrates an exemplary circuit diagram 5100 for generating two non-overlapping clock signals for the CIM macro. FIG. 52A illustrates an exemplary implementation of the two non-overlapping clock signals in a memory cell 5200 having double bitcells. FIG. 52B shows the timing diagram 5202 of the circuits depicted in FIG. 51. As shown in FIGS. 51 and 52B, two non-overlapping clock signals clk and clkb can be generated from an original clock signal clk_orig. a rising edge of the original clock signal clk_orig generates a falling edge of the clock signal clkb and a rising edge of the clock signal clk with a time delay of td1 between the falling edge of the clock signal clkb and the rising edge of the clock signal clk. A falling edge of the original clock signal clk_orig generates a rising edge of the clock signal clkb and a falling edge of the clock signal clk with a time delay of td2 between the rising edge of the clock signal clkb and the falling edge of the clock signal clk. The time delays td1 and td2 can be identical or different, and can be adjusted. As shown in FIG. 52B, the high phases of the clock signal clk can be contained entirely within the low phase of the clock signal clkb, and vice versa. Accordingly, the clock signal clk and clkb are non-overlapping, and can be used as wordline signals wl0 and wl1 through the two separate wordlines wwl0 and wwl1 to address the two bitcells BC0 and BC1 (see FIG. 52A). The non-overlapping clock signal clk and clkb can also be used as wordline signal wl and weight update signal wgt_update (in FIGS. 46-47) for the two bitcell latches bc0 and bc1.

In addition to non-overlapping clock phases to be used by the master-slave latch pair in the scan mode, the divergence of clock paths can be moved close to the bitcells, while keeping the overhead manageable. In general, 2:1 multiplexers are needed after row decoders and de-mux logic (controlled by wgt_sel). However, the non-overlapping clocks (i.e., clk and clkb) can be forced to "0" in the normal operation by clock generating circuits inside the CIM macro such that circuit overhead can be reduced.

Figure 53:
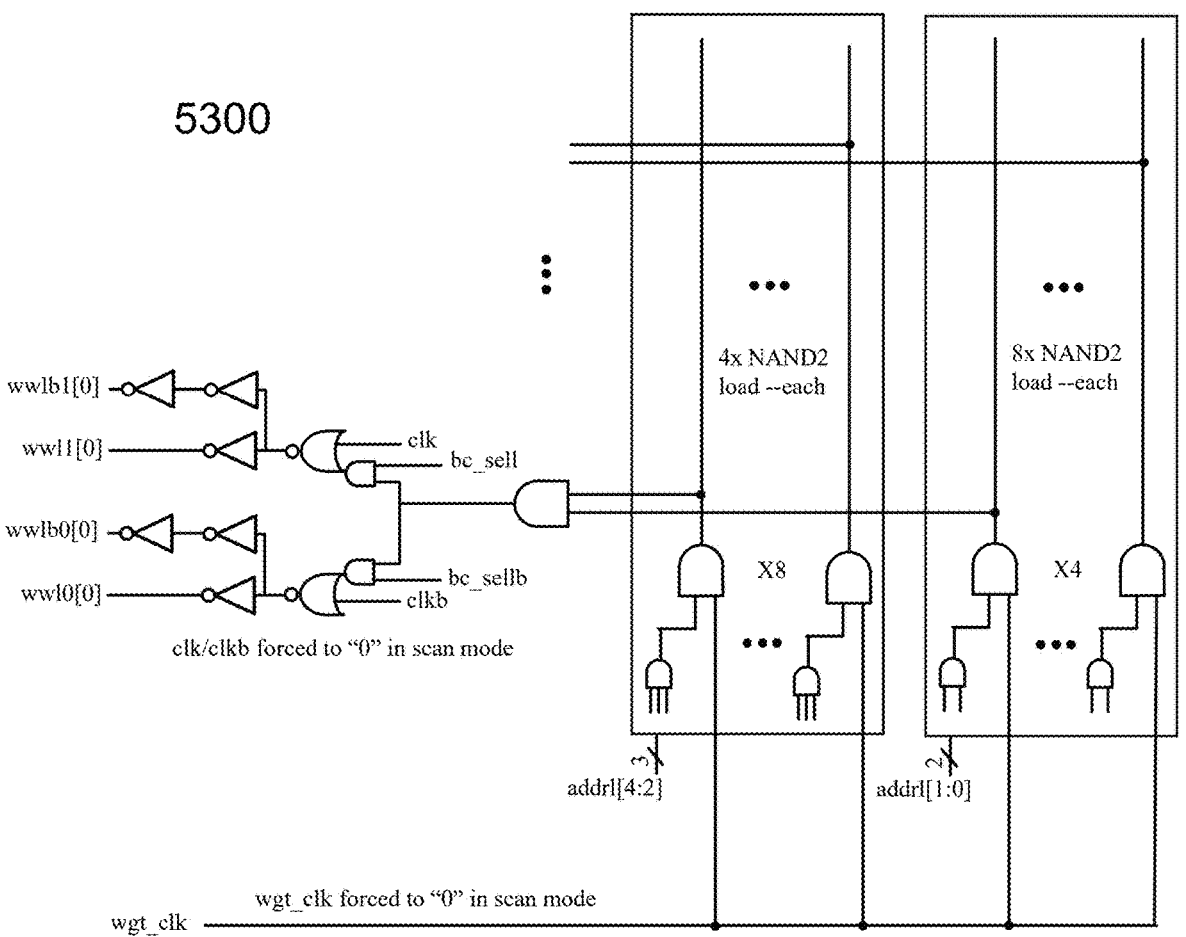
FIG. 53 illustrates an exemplary wordline circuit for scan operations, in accordance with some aspects of the present disclosure.
Figure 54:
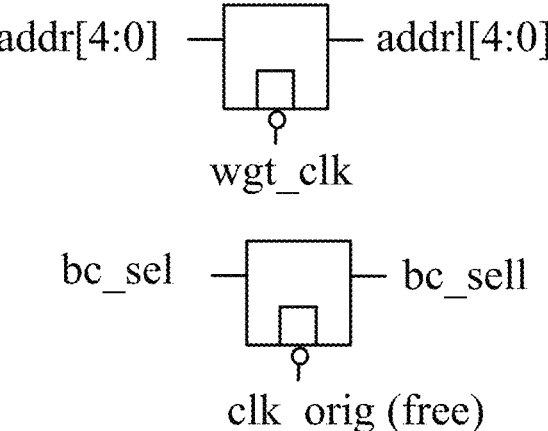
FIG. 54 illustrates signals to bitcells for scan operations, in accordance with some aspects of the present disclosure.
Figure 55:
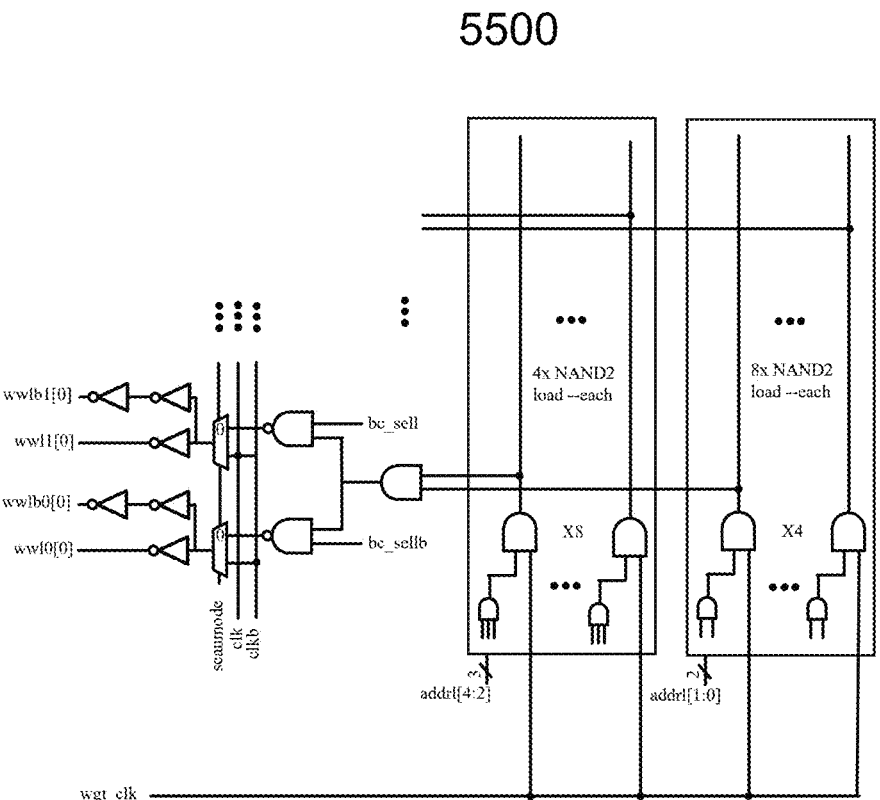
FIG. 55 illustrates another wordline circuit for scan operations, in accordance with some aspects of the present disclosure.

FIG. 53 illustrates exemplary wordline circuits 5300 that support the scan operation. FIG. 54 illustrates a scheme for latching clock signals for scan operations. In FIG. 53, the weight clock signal wgt_clk can also be forced to "0" by the compute engine in scan mode. The output wordline signals wwl0 and wwl1 can be sent to the memory cell of double bitcells in FIG. 45. The address signals addrl and bitline select signals bc_sel can be controlled by the weight clock signal wgt_clk and the original clock signal clk_orig, respectively, using, e.g., latches as depicted in FIG. 54. FIG. 55 provides a variation of the wordline circuits 5500 depicted in FIG. 53, which includes a plurality of multiplexers controlled by scan mode signal scan mode to select between clock signal clk or inverted clock signal clkb.

Figures 56A, 56B:
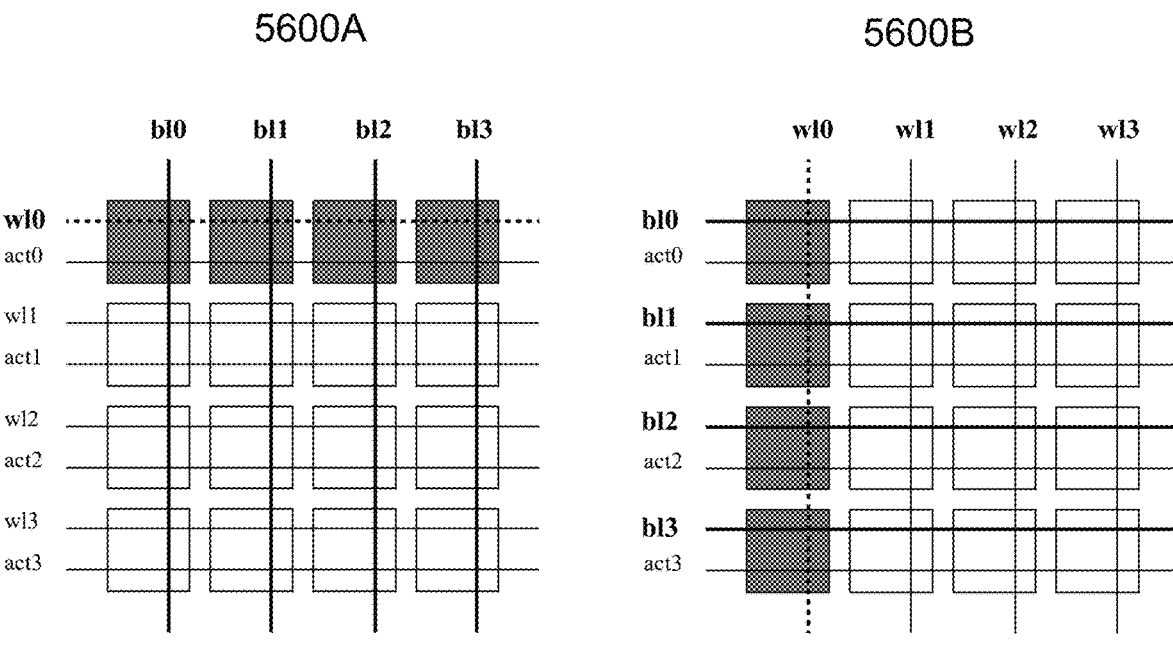

The following discusses row and column parallel writing in the CIM macro. FIGS. 56A and 56B illustrate two exemplary writing schemes 5600A and 5600B for a memory array. For simplicity, a 4×3 memory cell array is used as an example. As shown in FIG. 56A, wordlines wl0, wl1, wl2 and wl3 are arranged in rows and bitlines bl0, bl1, bl2 and bl3 are arranged in columns. The memory cells in each row are addressed by a shared wordline, which provides a wordline signal that determines whether the row of memory cells are accessible. Data (e.g., weight values) can be written in to the memory cells through a shared bitline. Because data can be written into all the memory cells in one row, the scheme in FIG. 56A is also referred to as write per row. In FIG. 56A, activation values act0, act1, act2 and act3 are provided to the memory array row-by-row, parallel to the wordlines wl0, wl1, wl2 and wl3.

In FIG. 56B, the orientation of wordlines and bitlines are switched, while the orientation of the activation values act0, act1, act2 and act3 remains the same as those in FIG. 56A. In FIG. 56B, the activation values act0, act1, act2 and act3 are provided to the memory array row-by-row, parallel to the bitlines bl0, bl1, bl2 and bl3. Each of the wordline wl0, wl1, wl2 and wl3 addresses memory cells in the same column. Therefore, all the memory cells in a column can be accessible through a shared wordline, and can be written with data (e.g., weight values) provided through respective bitlines. Because data can be written into all the memory cells in one column shared by a wordline, the scheme in FIG. 56B is also referred to as write per column. Switching orientations of the wordlines and bitlines can be affected by materials and processes used to make the wordlines and bitlines during manufacturing (e.g., wordlines using polysilicon may have smaller pitch than bitlines using metal).

FIGS. 57A and 57B depicts exemplary writing schemes 5700A and 5700B for the CIM macro. For simplicity, only 4×4 column cells are depicted in FIGS. 57A and 57B. Similar to FIGS. 56A and 56B, the scheme in FIG. 57A is referred to write per row and the scheme in FIG. 57B is referred to as write per column. Because each weight value may have multiple bits, each column cell can have multiple memory cells, where each memory cell in one column cell is connected to a different bitline. The number of memory cells and bitlines for one column cell corresponds to the number of bits in one weight value. In FIGS. 57A and 57B, each column cell has 4 memory cells and is connected to 4 bitlines to write weight values having 4b. There are totally 4×4×4 memory cells or 4×4×4 bits of data in FIGS. 57A and 57B. In FIG. 57A, one word line (e.g., wl0) addresses all the memory cells in a column cell. Therefore, activating a single wordline wl0, a 4b weight value can be written into the column cell connected to bitlines bl0, bl1, bl2, bl3. However, in FIG. 57B, 4 wordlines (e.g., wl0, wl1, wl2, wl3) must be activated to write a 4b weight value to the column cells connected to the bitlines bl0, bl1, bl2, bl3.

Figures 58A, 58B, 58C:
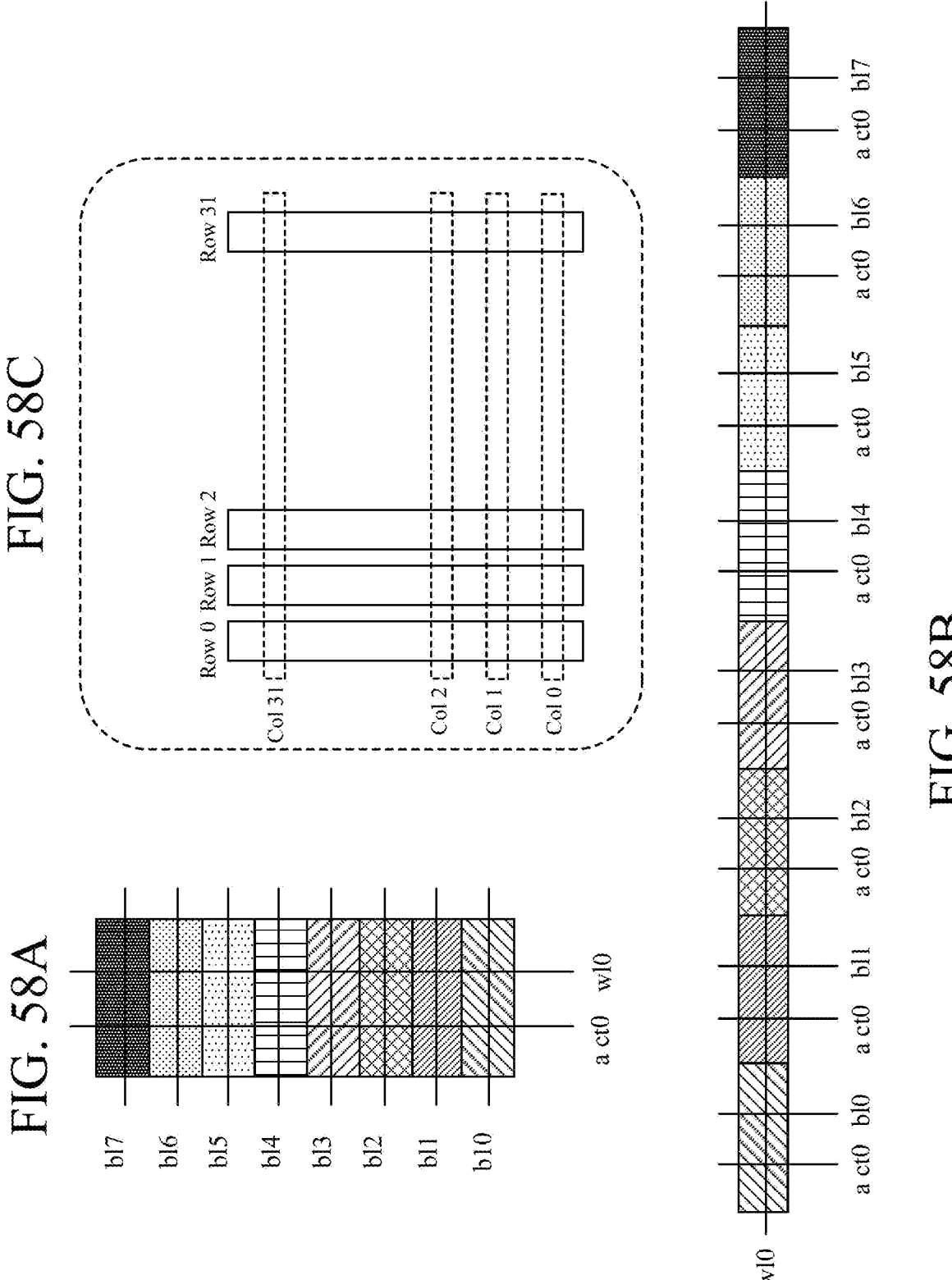

FIGS. 58A-58C illustrates exemplary schemes of writing operations for integer data. FIG. 58C depicts a logic representation of a CIM macro, showing that computing units Col0, Col1, Col2, . . . , Col 31 and wordlines are arranged in rows and that bitlines are arranged in columns Row0, Row1, Row3, . . . , Row31. Thus, a logic representation of an integer INT8 (one element of weight value) having 8 bits can be 1 row×1 column×8b.

FIG. 58A shows an exemplary physical representation of bitcells for an element of weight value. In this example, the element of weight value is in INT8 format. In FIG. 58A, the 8 bits of the element can be written into a column of bitcells addressed by a vertical wordline wl0 through bitlines bl0, bl1, . . . , bl7 arranged in rows. A bit of an activation value act0 can be provided to the column of bitcells in parallel to the wordline wl0. This physical representation for the element INT8 is rotated by 90 degrees from its original logic representation of 1 row×1 column×8b.

FIG. 58B depicts another exemplary physical representation of bitcells for an element of weight value. In this example, the element of weight value is in INT8 format. The element of weight value can be written into 8 bitcells in a row using wordline wl0. The 8 bits of the weight value can be provided through bitlines bl0, bl1, . . . , bl7, arranged in columns. A corresponding bit of an activation value act0 can be provided in parallel with the bitlines bl0, bl1, . . . , bl7 to each of the memory cells. The orientations of the wordlines and bitlines in FIG. 58B are switched from those in FIG. 58A. In the example of FIG. 58B, due to computation direction (e.g., for VMM operation) and bit-serial scheme, one activation value is provided to every column of column cells as well as every bitcells in each column per element of weight value. Switching the bitlines and wordlines and unrolling bitcells like the scheme in FIG. 58B may result in extra wiring for activation values. In some embodiments, data lines for the activation values (e.g., act0) can be arranged horizontally such that one activation bit can be provided to a row of bitcells shared by the same wordline wl0.

Figures 59A, 59B:
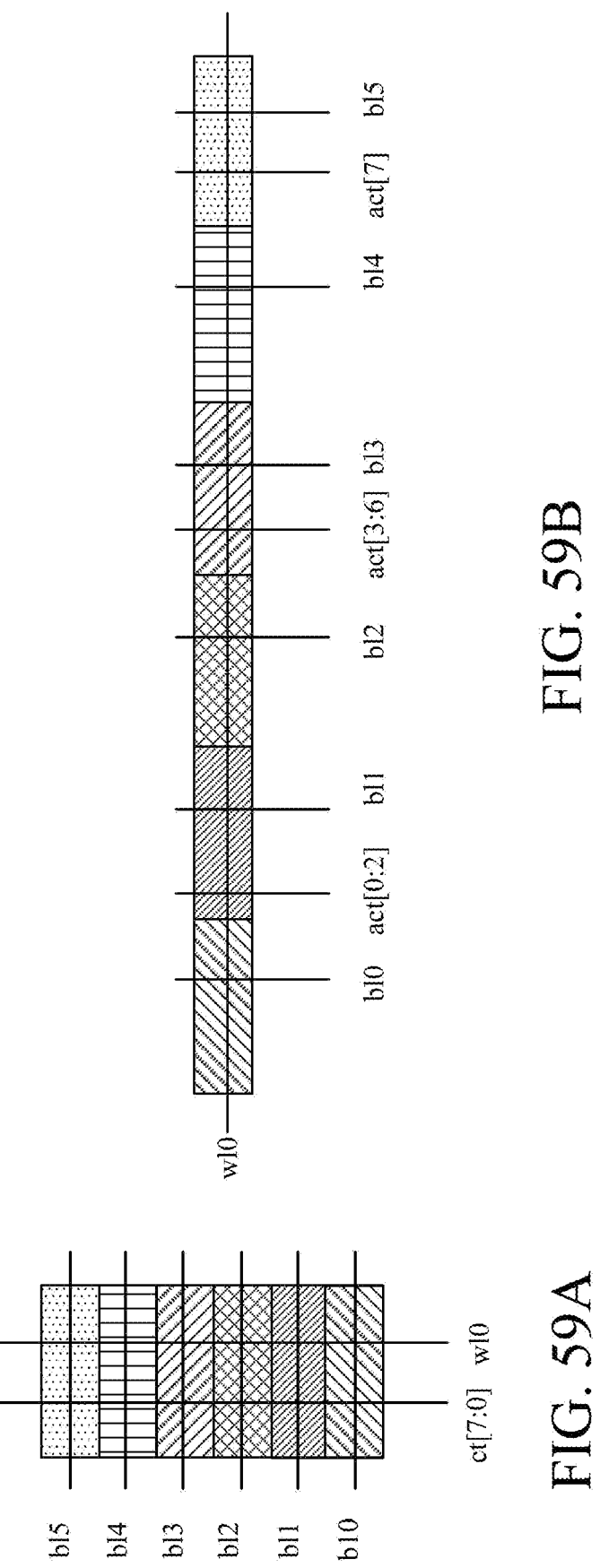

FIGS. 59A-58B illustrates exemplary writing operations for floating point data. In this example, an element of weight value is in FP6 format, and an activation value is in FP8 format. FIG. 59A shows a physical representation of bitcells. In FIG. 59A, six bits of the element of weight values can be written into a column of bitcells addressed by a vertical wordline wl0 through bitlines bl0, bl1, . . . , bl5 arranged in rows. 8 bits of the activation value act <7:0> can be provided to the column of bitcells in parallel to the wordline wl0. This physical representation is rotated by 90 degrees from its original logic representation of 1 row×1 column×6b.

FIG. 59B depicts another exemplary physical representation of bitcells. In this example, 6 bits of the weight value can be written into 6 bitcells in a row addressed by a single wordline wl0. The 6 bits of the weight value can be provided through bitlines bl0, bl1, . . . , bl5, arranged in columns to each bitcell. Corresponding bits of the activation value act <7:1> can be provided in parallel with the bitlines bl0, bl1, . . . , bl7 to the respective bitcells. The orientations of the wordlines and bitlines in FIG. 59B are switched from those in FIG. 59A.

Computation (e.g., VMM operation) for FP data can be parallel for different bits. Different bits of the activation value can be provided to different bitcells storing different bits of the weight value according to the sign, exponent and mantissa. The operations for sign bits, exponent bits and mantissa bits can be performed in parallel. In the example of FIG. 59B, the sign bit act<7> is provided to the bitcell storing the sign bit for the weight value, the exponent bits act<3:6> are provided to the bitcells storing the exponent bits for the weight value, and the mantissa bits act<0:2> are provided to the bitcells storing the mantissa bits for the weight value. There is some overlap for the partial product operation between the mantissa bits, but only for 2 bitcells in FIG. 59B. Thus, writing in columns for FP data can be feasible because activation value bits are not duplicated, and extra wiring can be greatly reduced.

The present technology includes devices, apparatuses, and assemblies addressed in the aspects of the present technology presented below:

Aspect I: A hardware accelerator including:

a compute-in-memory (CIM) macro configured to perform a vector matrix multiplication (VMM) operation between a vector of activation values and a matrix of weight values; and a mode decoding unit configured to provide an arithmetic mode of the VMM operation according to a first floating point format of the activation values and a second floating point format of the weight values, the first floating point format and the second floating point format being flexible;

wherein a column cell of the CIM macro is configured to output a primitive product between an activation value and a weight value and includes:

a half adder configured to add an exponent bit of the activation value and an exponent bit of the weight value and output a carry-out bit and a sum bit;

a first multiplexer configured to select zero or a prior stage carry-out bit from a prior stage half adder and output a first selection to a full adder;

a second multiplexer configured to select zero or the sum bit and output a second selection to the full adder; and a third multiplexer configured to select zero or a carry-in bit from a prior stage full adder and output a third selection to the full adder, wherein the first multiplexer, the second multiplexer, and the third multiplexer perform respective selections based on control signals according to the arithmetic mode.

Aspect II: The hardware accelerator of Aspect I, wherein the column cell further includes a fourth multiplexer configured to output an exponent bit of the primitive product by selecting an output from the full adder, the sum bit from the half adder, or the carry-in bit from the prior stage full adder.

Aspect III: The hardware accelerator of any of Aspects I or II, wherein the column cell further includes a plurality of memory cells configured to store the weight value.

Aspect IV: The hardware accelerator of any of Aspects I to III, wherein one of the plurality of memory cells includes a bitcell configured to store the exponent bit of the weight value and provide the exponent bit of the weight value to the half adder.

Aspect V: The hardware accelerator of any of Aspects I to IV, wherein:

one of the plurality of memory cells includes a first bitcell and a second bitcell; and the first bitcell is addressed by a first wordline and the second bitcell is addressed by a second wordline different from the first wordline.

Aspect VI: The hardware accelerator of any of Aspects I to V, wherein the first bitcell and the second bitcell share a bitline and are addressed by different wordlines.

Aspect VII: The hardware accelerator of any of Aspects I to VI, wherein the first bitcell is configured to store a first bit of the weight value and the second bitcell is configured to store a second bit of another weight value that is different from the weight value.

Aspect VIII: The hardware accelerator of any of Aspects I to VII, wherein the first bitcell is configured to provide the first bit of the weight value to the half adder, the first bit being the exponent bit of the weight value.

Aspect IX: The hardware accelerator of any of Aspects I to VIII, wherein the second bitcell is configured to concurrently update the second bit when the first bitcell is providing the first bit to the half adder.

Aspect X: The hardware accelerator of any of Aspects I to IX, wherein a number of exponent bits in the activation value includes at least one of 2, 3, 4, and 5.

Aspect XI: The hardware accelerator of any of Aspects I to X, wherein a number of exponent bits in the weight value includes at least one of 2, 3, 4, and 5.

Aspect XII: A method for performing a vector matrix multiplication (VMM) operation in a compute-in-memory (CIM) macro between a vector of activation values and a matrix of weight values, the method including:

adding, by a half adder in a column cell of the CIM macro, an exponent bit of an activation value and an exponent bit of a weight value to output a carry-out bit and a sum bit;

selecting, by a first multiplexer in the column cell, zero or a prior stage carry-out bit from a prior stage half adder to output a first selection to a full adder;

selecting, by a second multiplexer in the column cell, zero or the sum bit to output a second selection to the full adder;

selecting, by a third multiplexer in the column cell, zero or a carry-in bit from a prior stage full adder to output a third selection to the full adder; and outputting an exponent bit of a primitive product between the activation value and the weight value.

Aspect XIII: The method of Aspect XII, further including controlling the selections performed by the first multiplexer, the second multiplexer, and the third multiplexer based on control signals according to an arithmetic mode of the VMM operation.

Aspect XIV: The method of any of Aspects XII or XIII, further including determining the arithmetic mode based on a first floating point format of the activation value and a second floating point format of the weight value.

Aspect XV: The method of any of Aspects XII to XIV, further including:

selecting, by a fourth multiplexer in the column cell, an output from the full adder, the sum bit from the half adder, or the carry-in bit from the prior stage full adder; and outputting, by the fourth multiplexer in the column cell, an exponent bit of the primitive product.

Aspect XVI: The method of any of Aspects XII to XV, further including providing, by a first bitcell in the column cell, the exponent bit of the weight value to the half adder.

Aspect XVII: The method of any of Aspects XII to XVI, further including writing, concurrently, a further exponent bit of a further weight value to a second bitcell in the column cell, wherein the further weight value is different from the weight value.

Aspect XVIII: The method of any of Aspects XII to XVII, further including writing the further exponent bit to the second bitcell through a bitline shared with the first bitcell.

Aspect XIX: The method of any of Aspects XII to XVIII, wherein:

a number of exponent bits in the activation value is at least one of 2, 3, 4, or 5;

a number of exponent bits in the weight value is at least one of 2, 3, 4, or 5; and the method further includes determining a number of bitcells in the column cell using a least common multiple among a plurality of possible numbers of exponent bits in the activation value and the weight value.

Aspect XX: A system including:

a compute device configured to perform a vector matrix multiplication (VMM) operation between a vector of activation values and a matrix of weight values; and a mode device configured to provide a mode of the VMM operation according to a first floating point format of the activation values and a second floating point format of the weight values, the first floating point format and the second floating point format being flexible;

wherein the compute device includes:

a half adder configured to add an exponent bit of the activation value and an exponent bit of the weight value and output a carry-out bit and a sum bit;

a first multiplexer configured to select zero or a prior stage carry-out bit from a prior stage half adder and output a first selection to a full adder;

a second multiplexer configured to select zero or the sum bit and output a second selection to the full adder; and a third multiplexer configured to select zero or a carry-in bit from a prior stage full adder and output a third selection to the full adder;

wherein the first multiplexer, the second multiplexer, and the third multiplexer perform respective selections based on control signals according to the mode.

Aspect XXI: An apparatus including: a compute-in-memory (CIM) macro configured to perform a vector matrix multiplication (VMM) operation and including a column cell; and a mode decoding unit configured to provide an arithmetic mode of the VMM operation according to floating point formats of an activation value and a weight value; wherein the column cell of the CIM macro is configured to produce a primitive product between the activation value and the weight value and includes logic gates configured to output partial products between mantissa bits of the activation value and mantissa bits of the weight value, an array of full adders configured to output mantissa bits of the primitive product, and a plurality of multiplexers configured to select zero or a corresponding partial product and output a selection to a corresponding full adder based on a control signal according to the arithmetic mode.

Aspect XXII: The apparatus of Aspect XXI, wherein the logic gates include AND gates.

Aspect XXIII: The apparatus of any of Aspects XXI or XXII, wherein the CIM macro is configured to add one before a most significant bit of the mantissa bits of the activation value and before the mantissa bits of the weight value.

Aspect XXIV: The apparatus of any of Aspects XXI to XXIII, wherein the column cell further includes a plurality of memory cells configured to store the mantissa bits of the weight value.

Aspect XXV: The apparatus of any of Aspects XXI to XXIV, wherein the plurality of memory cells include a bitcell configured to store a respective one of the mantissa bits of the weight value and provide the respective one of the mantissa bits of the weight value to the logic gates.

Aspect XXVI: The apparatus of any of Aspects XXI to XXV, wherein the plurality of memory cells include a further bitcell, and the bitcell and the further bitcell are addressed by different wordlines.

Aspect XXVII: The apparatus of any of Aspects XXI to XXVI, wherein the bitcell and the further bitcell share a bitline.

Aspect XXVIII: The apparatus of any of Aspects XXI to XXVII, wherein the further bitcell is configured to store a further mantissa bit of a further weight value that is different from the weight value.

Aspect XXIX: The apparatus of any of Aspects XXI to XXVIII, wherein the further bitcell is configured to concurrently update the further mantissa bit when the bitcell is providing the respective one of the mantissa bits of the weight value to the logic gates.

Aspect XXX: The apparatus of any of Aspects XXI to XXIX, wherein a number of mantissa bits in the activation value includes at least one of 1, 2, 3, and 4, and a number of mantissa bits in the weight value includes at least one of 1, 2, 3, and 4.

Aspect XXXI: A method for performing a vector matrix multiplication (VMM) operation in a compute-in-memory (CIM) macro including a column cell, the method including:

providing, by a mode decoding unit, an arithmetic mode of the VMM operation according to floating point formats of an activation value and a weight value;

generating, by logic gates, partial products between mantissa bits of the activation value and mantissa bits of the weight value;

selecting, by a multiplexer, zero or one of the partial products to output a selection to a full adder based on a control signal according to the arithmetic mode; and producing, by an array of full adders, mantissa bits of a primitive product between the activation value and the weight value.

Aspect XXXII: The method of Aspect XXXI, wherein the generating of the partial products includes inputting the mantissa bits of the activation value and the mantissa bits of the weight value through AND gates.

Aspect XXXIII: The method of any of Aspects XXXI or XXXII, wherein the generating of the partial products includes adding one before a most significant bit of the mantissa bits of the activation value and before the mantissa bits of the weight value.

Aspect XXXIV: The method of any of Aspects XXXI to XXXIII, further including storing the mantissa bits of the weight value in a plurality of memory cells in the column cell.

Aspect XXXV: The method of any of Aspects XXXI to XXXIV, further including storing one of the mantissa bits of the weight value in a bitcell and providing the one of the mantissa bits of the weight value to the logic gates.

Aspect XXXVI: The method of any of Aspects XXXI to XXXV, further including storing, in a further bitcell, a further mantissa bit of a further weight value that is different from the weight value, wherein the bitcell and the further bitcell are addressed by different wordlines and share a bitline.

Aspect XXXVII: The method of any of Aspects XXXI to XXXVI, further including updating, concurrently, the further mantissa bit when the bitcell is providing the one of the mantissa bits of the weight value to the logic gates.

Aspect XXXVIII: The method of any of Aspects XXXI to XXXVII, wherein a number of mantissa bits in the activation value includes at least one of 1, 2, 3, and 4, and a number of mantissa bits in the weight value includes at least one of 1, 2, 3, and 4.

Aspect XXXIX: The method of any of Aspects XXXI to XXXVIII, further including at least one of: determining a number of bitcells in the column cell using a least common multiple among a plurality of possible numbers of exponent bits in the activation value and the weight value; or determining a number of bitcells in the column cell using a least common multiple among a plurality of possible numbers of mantissa bits in the activation value and the weight value.

Aspect XL: A system including: a compute device configured to perform a vector matrix multiplication (VMM) operation between a vector of activation values and a matrix of weight values; and a mode device configured to provide a mode of the VMM operation according to floating point formats of an activation value of the vector of activation values and a weight value of the matrix of weight values; wherein the compute device includes logic gates configured to output partial products between mantissa bits of the activation value and mantissa bits of the weight value, an array of full adders configured to output mantissa bits of a primitive product between the activation value and the weight value, and a plurality of multiplexers configured to select zero or a corresponding partial product and output a selection to a corresponding full adder, wherein the plurality of multiplexers perform respective selections based on control signals according to the mode.

Aspect XLI: A computing device including a compute-in-memory (CIM) macro including a column cell, wherein the column cell is configured to produce a primitive product between an activation value and a weight value and includes a first half adder configured to perform addition between a least significant exponent bit of the activation value and a least significant exponent bit of the weight value, a second half adder configured to perform addition for a most significant exponent bit of the activation value or a most significant exponent bit of the weight value, and a plurality of full adders configured to add a further exponent bit of the activation value and a further exponent bit of the weight value, wherein the further exponent bit of the activation value and the further exponent bit of the weight value are not provided to the first half adder or the second half adder.

Aspect XLII: The computing device of Aspect XLI, wherein the first half adder is configured to output an exponent bit of the primitive product and a carry-in bit for a next stage full adder.

Aspect XLIII: The computing device of any of Aspects XLI or XLII, wherein the second half adder is configured to output two exponent bits of the primitive product.

Aspect XLIV: The computing device of any of Aspects XLI to XLIII, wherein the plurality of full adders are configured to output an exponent bit of the primitive product and a carry-in bit for a next stage full adder.

Aspect XLV: The computing device of any of Aspects XLI to XLIV, wherein the column cell further includes a plurality of memory cells configured to store exponent bits of the weight value.

Aspect XLVI: The computing device of any of Aspects XLI to XLV, wherein the plurality of memory cells include a bitcell configured to store one of the exponent bits of the weight value and provide the one of the exponent bits of the weight value to the first half adder, the second half adder, or one of the plurality of full adders.

Aspect XLVII: The computing device of any of Aspects XLI to XLVI, wherein the plurality of memory cells include a further bitcell, and the bitcell and the further bitcell are addressed by different wordlines.

Aspect XLVIII: The computing device of any of Aspects XLI to XLVII, wherein the bitcell and the further bitcell share a bitline.

Aspect XLIX: The computing device of any of Aspects XLI to XLVIII, wherein the further bitcell is configured to store a further exponent bit of a further weight value that is different from the weight value.

Aspect L: The computing device of any of Aspects XLI to XLIX, wherein the further bitcell is configured to concurrently update the further exponent bit when the bitcell is providing the one of the exponent bits of the weight value to the first half adder, the second half adder, or one of the plurality of full adders.

Aspect LI: A method for producing a product between an activation value and a weight value in a computing device including a column cell, the method including:

adding, by a first half adder, a least significant exponent bit of the activation value and a least significant exponent bit of the weight value;

adding, by a second half adder, a most significant exponent bit of the activation value or a most significant exponent bit of the weight value and a first carry-in bit; and adding, by a full adder, a further exponent bit of the activation value and a further exponent bit of the weight value, wherein the further exponent bit of the activation value and the further exponent bit of the weight value are not provided to the first half adder or the second half adder.

Aspect LII: The method of Aspect LI, wherein the product is a primitive product and the method further includes outputting, by the first half adder, an exponent bit of the primitive product and a second carry-in bit for a next stage full adder.

Aspect LIII: The method of any of Aspects LI or LII, further including outputting, by the second half adder, two exponent bits of the product.

Aspect LIV: The method of any of Aspects LI to LIII, further including outputting, by the full adder, an exponent bit of the product and a third carry-in bit for a next stage full adder or the first carry-in bit for the second half adder.

Aspect LV: The method of any of Aspects LI to LIV, further including storing exponent bits of the weight value in a plurality of memory cells in the column cell.

Aspect LVI: The method of any of Aspects LI to LV, further including storing one of the exponent bits of the weight value in a bitcell and providing the one of the exponent bits of the weight value to the first half adder, the second half adder, or the full adder.

Aspect LVII: The method of any of Aspects LI to LVI, further including storing a further exponent bit of a further weight value that is different from the weight value in a further bitcell, wherein the bitcell and the further bitcell are addressed by different wordlines and share a bitline.

Aspect LVIII: The method of any of Aspects LI to LVII, further including concurrently updating, by the further bitcell, the further exponent bit when the bitcell is providing the one of the exponent bits of the weight value to the first half adder, the second half adder, or one of the full adders.

Aspect LIX: The method of any of Aspects LI to LVIII, further including providing, by a mode decoding unit, an arithmetic mode based on floating point formats of the activation value and the weight value, wherein a number of full adders used to produce exponent bits of the primitive product is a number of exponent bits of the activation value subtracting 2 or a number of exponent bits of the weight value subtracting 2.

Aspect LX: A system including: a processor coupled to a compute device including a column cell, wherein the column cell is configured to produce a primitive product between an activation value and a weight value; the compute device including a first half adder configured to perform addition between a least significant exponent bit of the activation value and a least significant exponent bit of the weight value, a second half adder configured to perform addition for a most significant exponent bit of the activation value or a most significant exponent bit of the weight value, and a plurality of full adders configured to add a further exponent bit of the activation value and a further exponent bit of the weight value, wherein the further exponent bit of the activation value and the further exponent bit of the weight value are excluded from the first half adder or the second half adder.

Aspect LXI: A hardware accelerator including:
a compute-in-memory (CIM) macro including a column cell, wherein the column cell is configured to produce a primitive product between an activation value and a weight value and includes:
a first logic gate configured to provide a first output bit based on inputs from exponent bits of the activation value;
a second logic gate configured to provide a second output bit based on inputs from exponent bits of the weight value; and
a plurality of third logic gates configured to output partial products between mantissa bits of the activation value and mantissa bits of the weight value,
wherein the partial products are generated after the first output bit is added before a most significant bit (MSB) of the mantissa of the activation value and the second output bit is added before the MSB of the mantissa of the weight value.

Aspect LXII: The hardware accelerator of Aspect LXI, wherein the plurality of third logic gates include AND logic gates.

Aspect LXIII: The hardware accelerator of any of Aspects LXI or LXII, wherein the first logic gate and the second logic gate each include an OR logic gate.

Aspect LXIV: The hardware accelerator of any of Aspects LXI to LXIII, further including: an array of full adders arranged in columns and rows and configured to output mantissa bits of the primitive product based on the partial products.

Aspect LXV: The hardware accelerator of any of Aspects LXI to LXIV, wherein a number of the full adders in one row is proportional to a number of mantissa bits in the activation value.

Aspect LXVI: The hardware accelerator of any of Aspects LXI to LXV, wherein a number of rows of the full adders is proportional to a number of mantissa bits in the weight value.

Aspect LXVII: The hardware accelerator of any of Aspects LXI to LXVI, wherein inputs of a full adder in a first row of the array include two of the partial products and a carry-in bit from a prior stage full adder in the same row.

Aspect LXVIII: The hardware accelerator of any of Aspects LXI to LXVII, wherein inputs to a full adder in a last row of the array include:
one of the partial products,
a carry-in bit from a prior stage full adder in the same row, and
an output bit from another full adder in an upper row.

Aspect LXIX: The hardware accelerator of any of Aspects LXI to LXVIII, further including: a mode decoding unit configured to provide an arithmetic mode to the CIM macro based on floating point formats of the activation value and the weight value.

Aspect LXX: The hardware accelerator of any of Aspects LXI to LXIX, wherein a memory cell of the column cell includes:
a first bitcell configured to store one of the mantissa bits of the weight value and provide the one of the mantissa bits of the weight value to one of the plurality of third logic gates; and
a second bitcell configured to store a further mantissa bit of a further weight value that is different from the weight value and concurrently update the further mantissa bit when the first bitcell is providing the one of the mantissa bits of the weight value to one of the plurality of third logic gates,
wherein the first bitcell and the second bitcell share a bitline and are addressed by different wordlines.

Aspect LXI: A hardware accelerator including:
a compute-in-memory (CIM) macro including a column cell, wherein the column cell is configured to produce a primitive product between an activation value and a weight value and includes:
a first logic gate configured to provide a first output bit based on inputs from exponent bits of the activation value;
a second logic gate configured to provide a second output bit based on inputs from exponent bits of the weight value; and
a plurality of third logic gates configured to output partial products between mantissa bits of the activation value and mantissa bits of the weight value,
wherein the partial products are generated after the first output bit is added before a most significant bit (MSB) of the mantissa of the activation value and the second output bit is added before the MSB of the mantissa of the weight value.

Aspect LXII: The hardware accelerator of Aspect LXI, wherein the plurality of third logic gates include AND logic gates.

Aspect LXIII: The hardware accelerator of any of Aspects LXI or LXII, wherein the first logic gate and the second logic gate each include an OR logic gate.

Aspect LXIV: The hardware accelerator of any of Aspects LXI to LXIII, further including: an array of full adders arranged in columns and rows and configured to output mantissa bits of the primitive product based on the partial products.

Aspect LXV: The hardware accelerator of any of Aspects LXI to LXIV, wherein a number of the full adders in one row is proportional to a number of mantissa bits in the activation value.

Aspect LXVI: The hardware accelerator of any of Aspects LXI to LXV, wherein a number of rows of the full adders is proportional to a number of mantissa bits in the weight value.

Aspect LXVII: The hardware accelerator of any of Aspects LXI to LXVI, wherein inputs of a full adder in a first row of the array include two of the partial products and a carry-in bit from a prior stage full adder in the same row.

Aspect LXVIII: The hardware accelerator of any of Aspects LXI to LXVII, wherein inputs to a full adder in a last row of the array include:
one of the partial products,
a carry-in bit from a prior stage full adder in the same row, and
an output bit from another full adder in an upper row.

Aspect LXIX: The hardware accelerator of any of Aspects LXI to LXVIII, further including a mode decoding unit configured to provide an arithmetic mode to the CIM macro based on floating point formats of the activation value and the weight value.

Aspect LXX: The hardware accelerator of any of Aspects LXI to LXIX, wherein a memory cell of the column cell includes:
a first bitcell configured to store one of the mantissa bits of the weight value and provide the one of the mantissa bits of the weight value to one of the plurality of third logic gates; and
a second bitcell configured to store a further mantissa bit of a further weight value that is different from the weight value and concurrently update the further mantissa bit when the first bitcell is providing the one of the mantissa bits of the weight value to one of the plurality of third logic gates,
wherein the first bitcell and the second bitcell share a bitline and are addressed by different wordlines.

Aspect LXXI: A method for producing a product between an activation value and a weight value in a hardware accelerator, the method including:
generating, by a first logic gate, a first output bit based on inputs from exponent bits of the activation value;
generating, by a second logic gate, a second output bit based on inputs from exponent bits of the weight value;
generating a first set of mantissa bits by adding the first output bit before a most significant bit (MSB) of the mantissa of the activation value;
generating a second set of mantissa bits by adding the second output bit before a most significant bit (MSB) of the mantissa of the weight value; and
generating, by a plurality of third logic gates, partial products between the first set of mantissa bits and the second set of mantissa bits.

Aspect LXXII: The method of Aspect LXXI, wherein the plurality of third logic gates include AND logic gates.

Aspect LXXIII: The method of any of Aspects LXXI or LXXII, wherein the first logic gate and the second logic gate each include an OR logic gate.

Aspect LXXIV: The method of any of Aspects LXXI to LXXIII, further including: outputting, by an array of full adders arranged in columns and rows, mantissa bits of the product based on the partial products.

Aspect LXXV: The method of any of Aspects LXXI to LXXIV, wherein a number of the full adders in one row is proportional to a number of mantissa bits in the activation value.

Aspect LXXVI: The method of any of Aspects LXXI to LXXV, wherein a number of rows of the full adders is proportional to a number of mantissa bits in the weight value.

Aspect LXXVII: The method of any of Aspects LXXI to LXXVI, further including adding, by a full adder in a first row of the array, two of the partial products and a carry-in bit from a prior stage full adder in the same row.

Aspect LXXVIII: The method of any of Aspects LXXI to LXXVII, further including adding, by a full adder in a last row of the array, one of the partial products, a carry-in bit from a prior stage full adder in the same row, and an output bit from another full adder in an upper row.

Aspect LXXIX: The method of any of Aspects LXXI to LXXVIII, further including:
providing, by a mode decoding unit, an arithmetic mode based on floating point formats of the activation value and the weight value;
storing one of the mantissa bits of the weight value in a first bitcell;
storing a further mantissa bit of a further weight value that is different from the weight value in a second bitcell, wherein the first bitcell and the second bitcell share a bitline and are addressed by different wordlines;
providing the one of the mantissa bits of the weight value to one of the plurality of third logic gates; and
updating, concurrently, the further mantissa bit when the one of the mantissa bits of the weight value is provided to one of the plurality of third logic gates.

Aspect LXXX: A system for computing products, the system including:
a compute device including a column cell, wherein the column cell is configured to produce a product between an activation value and a weight value, the compute device including:
a first logic gate configured to provide a first output bit based on inputs from exponent bits of the activation value;
a second logic gate configured to provide a second output bit based on inputs from exponent bits of the weight value; and
a plurality of third logic gates configured to output partial products between mantissa bits of the activation value and mantissa bits of the weight value,
wherein the partial products are generated after the first output bit is added before a most significant bit (MSB) of the mantissa of the activation value and the second output bit is added before the MSB of the mantissa of the weight value.

Aspect LXXXI: A computing system including:
a compute-in-memory (CIM) macro including columns of computing units, the columns of computing units including:
a column cell configured to generate a primitive product of an activation value and a weight value in a floating point format;

a functional block configured to align mantissa bits of primitive products generated by column cells in the computing unit by shifting the mantissa bits; and an adder tree configured to output an accumulation value of the primitive products in an integer format by adding the shifted mantissa bits.

Aspect LXXXII: The computing system of Aspect LXXXI, wherein the functional block includes a shift calculation and select decoding unit configured to determine a shift value for the primitive product generated by the column cell.

Aspect LXXXIII: The computing system of any of Aspects LXXXI or LXXXII, wherein the functional block further includes a shift register, where a number of bits stored in the shift register equals a maximum exponent value plus a number of mantissa bits of the primitive product.

Aspect LXXXIV: The computing system of any of Aspects LXXXI to LXXXIII, wherein the functional block further includes a multiplexer configured to:

select at least one of the mantissa bits of the primitive product or a number zero; and output the selection to the shift register.

Aspect LXXXV: The computing system of any of Aspects LXXXI to LXXXIV, wherein the shift calculation and select decoding unit is configured to decode the shift value and provide a control signal to the multiplexer based on the decoded shift value.

Aspect LXXXVI: The computing system of any of Aspects LXXXI to LXXXIII, wherein:

the functional block includes a plurality of multiplexers configured to form a logarithmic tree; and an output from an upper multiplexer in an upper row is provided to an input of a lower multiplexer in a lower row.

Aspect LXXXVII: The computing system of any of Aspects LXXXI to LXXXVI, wherein at least one of the plurality of multiplexers in each row is configured to select between a number zero or the output from the upper multiplexer.

Aspect LXXXVIII: The computing system of any of Aspects LXXXI to LXXXVII, wherein at least one of the plurality of multiplexers in each row is configured to select a first output from a first upper multiplexer and a second output from a second upper multiplexer in a same row as the first upper multiplexer.

Aspect LXXXIX: The computing system of any of Aspects LXXXI to LXXXVIII, wherein multiplexers in a row are controlled by a bit of the shift value.

Aspect XC: The computing system of any of Aspects LXXXI to LXXXIX, wherein the functional block further includes a unit configured to compute a complement and a sign of the shifted mantissa bits.

Aspect XCI: A method for aligning mantissa bits of primitive products, the method including:

determining a maximum exponent value among the primitive products produced by a column of a computing unit;

determining a shift value for a primitive product by subtracting, from the maximum exponent value, an exponent value of the primitive product;

shifting mantissa bits of the primitive product by the shift value; and sending the shifted mantissa bits to an adder tree to output an accumulation value of the primitive products.

Aspect XCII: The method of Aspect XCI, further including: prior to shifting the mantissa bits of the primitive product by the shift value, shifting the mantissa bits to a most significant bit (MSB) of a first shift register, wherein a number of bits stored in the first shift register equals the maximum exponent value plus a number of mantissa bits of the primitive product.

Aspect XCIII: The method of any of Aspects XCI or XCII, wherein the shifting of the mantissa bits of the primitive product by the shift value includes shifting the mantissa bits towards a least significant bit (LSB) of the first shift register from the MSB of the first shift register by the shift value.

Aspect XCIV: The method of any of Aspects XCI to XCIII, wherein the shifting of the mantissa bits towards the LSB of the first shift register from the MSB of the first shift register by the shift value includes selecting, by a multiplexer, at least one of the mantissa bits of the primitive product and a number zero.

Aspect XCV: The method of any of Aspects XCI to XCIV, further including decoding the shift value to generate a control signal for the multiplexer based on the shift value.

Aspect XCVI: The method of any of Aspects XCI to XCIII, wherein the shifting of the mantissa bits towards the LSB of the first shift register from the MSB of the first shift register by the shift value includes selecting, by at least one of multiplexers in each row of a logarithmic tree, a number zero or an output from an upper multiplexer in an upper row.

Aspect XCVII: The method of any of Aspects XCI to XCVI, wherein the shifting of the mantissa bits towards the LSB of the first shift register from the MSB of the first shift register by the shift value includes selecting, by at least one of the multiplexers in each row of the logarithmic tree, a first output from a first upper multiplexer and a second output from a second upper multiplexer in a same row as the first upper multiplexer.

Aspect XCVIII: The method of any of Aspects XCI to XCVII, further including controlling the multiplexers in each row based on a bit of the shift value.

Aspect XCIX: The method of any of Aspects XCI to XCVIII, further including:

prior to sending the shifted mantissa bits to the adder tree, computing two's complement and a sign of the shifted mantissa bits; and prior to sending the shifted mantissa bits to the adder tree, storing the shifted mantissa bits in a third shift register, wherein a number of bits stored in the third shift register equals the maximum exponent value plus a number of mantissa bits of the primitive product.

Aspect C: A system including:

a computing device including a plurality of columns of computing units, the computing device including:

a column cell configured to generate a product of an activation value and a weight value in a floating point format;

a functional block configured to align mantissa bits of products generated by column cells in the computing unit by shifting the mantissa bits; and an adder tree configured to output an accumulation value of the products in an integer format by adding the shifted mantissa bits, wherein the functional block includes a shift calculation and select decoding unit configured to determine a shift value for the product generated by the column cell.

Aspect CI: An apparatus including:

a compute-in-memory (CIM) macro configured to store an array of weight values and perform a vector matrix multiplication (VMM) operation using the array of weight values, wherein the CIM macro includes:

a column cell including a first set of bitcells configured to store a first weight value and a second set of bitcells configured to store a second weight value that is different from the first weight value; and a first set of wordlines and a second set of wordlines configured to address the first set of bitcells and the second set of bitcells, respectively, wherein the CIM macro is further configured to perform, in parallel, a write operation to the first set of bitcells and the VMM operation in the second set of bitcells based on a weight select signal.

Aspect CII: The apparatus of Aspect CI, wherein a bitcell of the first set of bitcells shares a bitline with a corresponding bitcell of the second set of bitcells.

Aspect CIII: The apparatus of any of Aspects CI or CII, wherein the column cell further includes a weight output multiplexer configured to select a first output from a first bitcell of the first set of bitcells or a second output from a second bitcell of the second set of bitcells and provide an output for the VMM operation.

Aspect CIV: The apparatus of any of Aspects CI to CIII, wherein the weight output multiplexer is controlled by an inverted weight select signal.

Aspect CV: The apparatus of any of Aspects CI to CIV, wherein the column cell further includes a first weight select multiplexer controlled by a scan enable signal and configured to select a bitline signal or a scan in signal for the first bitcell.

Aspect CVI: The apparatus of any of Aspects CI to CV, wherein the column cell further includes a second weight select multiplexer controlled by the scan enable signal and configured to select the bitline signal or the first output from the first bitcell.

Aspect CVII: The apparatus of any of Aspects CI to CVI, wherein the first set of bitcells includes a first latch and the second set of bitcells includes a second latch.

Aspect CVIII: The apparatus of any of Aspects CI to CVII, wherein the CIM macro further includes a weight address decoder configured to generate a first set of wordline signals for the first set of wordlines and a second set of wordline signals for the second set of wordlines based on a weight address signal and the weight select signal.

Aspect CIX: The apparatus of any of Aspects CI to CVIII, wherein the write operation is performed in the first set of bitcells when the weight select signal is in a low phase, and performed in the second set of bitcells when the weight select signal is in a high phase.

Aspect CX: The apparatus of any of Aspects CI to CIX, wherein the CIM macro is further configured to adjust a setup time of the weight select signal such that the write operation and the VMM operation are performed within a same clock cycle.

Aspect CXI: A method for performing a write operation in a compute-in-memory (CIM) macro including a column cell having a first set of bitcells connected to a first set of wordlines and a second set of bitcells connected to a second set of wordlines, the method including:

generating, by a weight address decoder, a first set of wordline signals for the first set of wordlines and a second set of wordline signals for the second set of wordlines based on a weight select signal;

providing a weight value to a set of bit lines shared by the first set of bitcells and the second set of bitcells; and providing an inverted weight select signal to a set of weight output multiplexers, wherein the set of weight output multiplexers is configured to select first outputs of the first set of bitcells or second outputs of the second set of bitcells.

Aspect CXII: The method of Aspect CXI, further including generating, by an inverter, the inverted weight select signal based on the weight select signal.

Aspect CXIII: The method of any of Aspects CXI or CXII, further including controlling a set of first weight select multiplexers with a scan enable signal to output the weight value or a scan in signal to the first set of bitcells.

Aspect CXIV: The method of any of Aspects CXI to CXIII, further including controlling a set of second weight select multiplexers with the scan enable signal to output the weight value or the first outputs of the first set of bitcells to the second set of bitcells.

Aspect CXV: The method of any of Aspects CXI to CXIV, wherein the first set of bitcells includes a first latch and the second set of bitcells includes a second latch.

Aspect CXVI: The method of any of Aspects CXI to CXV, wherein the generating of the first wordline signal and the second wordline signal includes decoding a weight address signal by the weight address decoder.

Aspect CXVII: The method of any of Aspects CXI to CXVI, further including:

writing the weight value to the first set of bitcells when the weight select signal is in a low phase; and writing the weight value to the second set of bitcells when the weight select signal is in a high phase.

Aspect CXVIII: The method of any of Aspects CXI to CXVII, further including:

selecting, by the set of weight output multiplexers, the first outputs of the first set of bitcells when the weight select signal is in a high phase; and selecting, by the set of weight output multiplexers, the second outputs of the second set of bitcells when the weight select signal is in a low phase.

Aspect CXIX: The method of any of Aspects CXI to CXVIII, further including:

outputting the selection of the set of weight output multiplexers for a vector matrix multiplication (VMM) operation performed concurrently in the CIM macro; and adjusting a setup time of the weight select signal such that the write operation and the VMM operation are performed within a same clock cycle.

Aspect CXX: A system including:

a computing device configured to store an array of weight values and perform a vector matrix multiplication (VMM) operation using the array of weight values, the computing device including:

a column cell including a first set of bitcells configured to store a first weight value and a second set of bitcells configured to store a second weight value; and a first set of wordlines and a second set of wordlines configured to address the first set of bitcells and the second set of bitcells, respectively, wherein the computing device is configured to perform parallel write operations to the first set of bitcells and the VMM operation in the second set of bitcells based on a weight select signal.

Aspect CXXI: An apparatus including:

a compute-in-memory (CIM) macro configured to store an array of weight values and perform a tensor operation using the array of weight values, the CIM macro including:

a first bitcell configured to store a first bit of a first weight value;

a second bitcell configured to store a second bit of a second weight value different from the first weight value, wherein an output of the first bitcell is an input of the second bitcell;

a first multiplexer configured to output a first control signal to the first bitcell according to a wordline signal and a scan clock signal; and a second multiplexer configured to output a second control signal to the second bitcell according to the scan clock signal and a weight update signal.

Aspect CXXII: The apparatus of Aspect CXXI, wherein:

the first multiplexer and the second multiplexer are controlled by a mode signal; and the first multiplexer and the second multiplexer are configured to form a scan chain.

Aspect CXXIII: The apparatus of any of Aspects CXXI or CXXII, wherein the first multiplexer and the second multiplexer are coupled to a mode signal and are configured to select between multiplexer inputs responsive to the mode signal.

Aspect CXXIV: The apparatus of any of Aspects CXXI to CXXIII, wherein when the mode signal indicates a functional mode, the first multiplexer is configured to output the wordline signal as the first control signal and the second multiplexer is configured to output the weight update signal as the second control signal.

Aspect CXXV: The apparatus of any of Aspects CXXI to CXXIII, wherein when the mode signal indicates a scan mode, the first multiplexer and the second multiplexer are each configured to output the scan clock signal as the first control signal and the second control signal.

Aspect CXXVI: The apparatus of any of Aspects CXXI to CXXV, wherein:

the first bitcell includes a first latch having an enable input and the second bitcell includes a second latch having an enable input; and an output of the first multiplexer is coupled to the enable input of the first latch and an output of the second multiplexer is coupled to the enable input of the second latch.

Aspect CXXVII: The apparatus of any of Aspects CXXI to CXXVI, wherein:

the first bitcell and the second bitcell form a portion of a scan chain when the scan clock signal is toggled; and the wordline signal includes an inverted wordline signal configured to enable writing of the first bit of the first weight value to the first bitcell during a write operation.

Aspect CXXVIII: The apparatus of any of Aspects CXXI to CXXVII, wherein the scan clock signal is physically and logically separated from the wordline signal and the weight update signal.

Aspect CXXIX: The apparatus of any of Aspects CXXI to CXXVIII, wherein the apparatus includes a plurality of first bitcells and a plurality of second bitcells arranged in at least one column, and outputs of the plurality of first bitcells and inputs of the plurality of second bitcells are interconnected to form a scan path traversing the at least one column.

Aspect CXXX: The apparatus of any of Aspects CXXI to CXXIX, further including a third multiplexer configured to select between a bitline signal carrying a data bit of the first weight value and a serial scan input signal responsive to a mode signal.

Aspect CXXXI: A system including:

a processor; and a memory coupled to the processor and configured to store an array of weight values and perform a tensor operation using the array of weight values, the memory including:

a first cell configured to store a first bit of a first weight value;

a second cell configured to store a second bit of a second weight value different from the first weight value, the first and second cells being configured so an output of the first bitcell is an input of the second bitcell;

a first multiplexer configured to output a first control signal to the first bitcell according to at least one of a wordline signal and a scan clock signal; and a second multiplexer configured to output a second control signal to the second bitcell according to at least one of the scan clock signal and a weight update signal.

Aspect CXXXII: The system of Aspect CXXXI, wherein the first multiplexer and the second multiplexer are coupled to a mode signal and are configured to enable formation of a scan chain between the first cell and the second cell.

Aspect CXXXIII: The system of any of Aspects CXXXI or CXXXII, wherein the first multiplexer and the second multiplexer are configured to select between inputs responsive to the mode signal.

Aspect CXXXIV: The system of any of Aspects CXXXI to CXXXIII, wherein the mode signal is configured to indicate a functional mode or a scan mode.

Aspect CXXXV: The system of any of Aspects CXXXI to CXXXIV, wherein, when the mode signal indicates the functional mode, the first multiplexer is configured to output the wordline signal as the first control signal and the second multiplexer is configured to output the weight update signal as the second control signal.

Aspect CXXXVI: The system of any of Aspects CXXXI to CXXXIV, wherein, when the mode signal indicates the scan mode, the first multiplexer and the second multiplexer are each configured to output the scan clock signal as the first control signal and the second control signal, respectively.

Aspect CXXXVII: The system of Aspect CXXXI, wherein:

the first cell includes a first latch having an enable input and the second cell includes a second latch having an enable input; and an output of the first multiplexer is coupled to the enable input of the first latch and an output of the second multiplexer is coupled to the enable input of the second latch.

Aspect CXXXVIII: The system of any of Aspects CXXXI to CXXXVII, wherein the first cell and the second cell form a portion of a scan chain when the scan clock signal is toggled.

Aspect CXXXIX: The system of any of Aspects CXXXI to CXXXVIII, wherein the scan clock signal is separated from the wordline signal and the weight update signal.

Aspect CXL: A method of operating a computing device, the method including:

storing, in a first cell, a first bit of a first weight value and, in a second cell, a second bit of a second weight value different from the first weight value, the first cell and the second cell being configured such that an output of the first cell is an input of the second cell;

receiving a mode signal indicative of one of a functional mode and a scan mode;

in response to the mode signal indicating the functional mode, controlling a first multiplexer to provide a word-line signal as a first control signal to the first cell and controlling a second multiplexer to provide a weight update signal as a second control signal to the second cell, and updating at least one of the first bit and the second bit based on the wordline signal and the weight update signal;

in response to the mode signal indicating the scan mode, controlling the first multiplexer and the second multiplexer to provide a scan clock signal as the first control signal and the second control signal, respectively, to the first cell and the second cell; and performing a tensor operation using data stored in the computing device while selectively operating the computing device in the functional mode.

The present technology also includes devices, apparatuses, and assemblies addressed and described in the following clauses.

Clause 1: An apparatus including: a compute-in-memory (CIM) macro configured to store an array of weight values and perform a tensor operation using the array of weight values, the CIM macro including: a first bitcell configured to store a first bit of a first weight value; a second bitcell configured to store a second bit of a second weight value different from the first weight value, wherein an output of the first bitcell is an input of the second bitcell; a first multiplexer configured to output a first control signal to the first bitcell according to a wordline signal and a scan clock signal; and a second multiplexer configured to output a second control signal to the second bitcell according to the scan clock signal and a weight update signal.

Clause 2: The apparatus according to clause 1, wherein: the first multiplexer and the second multiplexer are controlled by a mode signal; the first multiplexer and the second multiplexer are configured to form a scan chain.

Clause 3: The apparatus according to clause 1, wherein the first multiplexer and the second multiplexer are coupled to a mode signal and are configured to select between multiplexer inputs responsive to the mode signal.

Clause 4: The apparatus of clause 3, wherein when the mode signal indicates a functional mode, the first multiplexer is configured to output the wordline signal as the first control signal and the second multiplexer is configured to output the weight update signal as the second control signal.

Clause 5: The apparatus of clause 3, wherein when the mode signal indicates a scan mode, the first multiplexer and the second multiplexer are each configured to output the scan clock signal as the first control signal and the second control signal.

Clause 6: The apparatus of clause 1, wherein: the first bitcell includes a first latch having an enable input and the second bitcell includes a second latch having an enable input, and an output of the first multiplexer is coupled to the enable input of the first latch and an output of the second multiplexer is coupled to the enable input of the second latch.

Clause 7: The apparatus of clause 1, wherein: the first bitcell and the second bitcell form a portion of a scan chain when the scan clock signal is toggled; and the wordline signal includes an inverted wordline signal configured to enable writing of the first bit of the first weight value to the first bitcell during a write operation.

Clause 8: The apparatus of clause 1, wherein the scan clock signal is physically and logically separated from the wordline signal and the weight update signal.

Clause 9: The apparatus of clause 1, wherein the apparatus includes a plurality of first bitcells and a plurality of second bitcells arranged in at least one column, and outputs of the plurality of first bitcells and inputs of the plurality of second bitcells are interconnected to form a scan path traversing the at least one column.

Clause 10: The apparatus of clause 1, further including a third multiplexer, the third multiplexer being configured to select between a bitline signal carrying a data bit of the first weight value and a serial scan input signal responsive to a mode signal.

Clause 11: A system including: a processor; and a memory coupled to the processor and configured to store an array of weight values and perform a tensor operation using the array of weight values, the memory including: a first cell configured to store a first bit of a first weight value; a second cell configured to store a second bit of a second weight value different from the first weight value, the first and second cells being configured so an output of the first bitcell is an input of the second bitcell; a first multiplexer configured to output a first control signal to the first bitcell according to at least one of a wordline signal and a scan clock signal; and a second multiplexer configured to output a second control signal to the second bitcell according to at least one of the scan clock signal and a weight update signal.

Clause 12: The system of clause 11, wherein the first multiplexer and the second multiplexer are coupled to a mode signal and are configured to enable formation of a scan chain between the first cell and the second cell.

Clause 13: The system of clause 12, wherein the first multiplexer and the second multiplexer are configured to select between inputs responsive to the mode signal.

Clause 14: The system of clause 12, wherein the mode signal is configured to indicate a functional mode or a scan mode.

Clause 15: The system of clause 12, wherein, when the mode signal indicates the functional mode, the first multiplexer is configured to output the wordline signal as the first control signal and the second multiplexer is configured to output the weight update signal as the second control signal.

Clause 16: The system of clause 12, wherein, when the mode signal indicates the scan mode, the first multiplexer and the second multiplexer are each configured to output the scan clock signal as the first control signal and the second control signal, respectively.

Clause 17: The system of clause 11, wherein: the first cell includes a first latch having an enable input and the second cell includes a second latch having an enable input; and an output of the first multiplexer is coupled to the enable input of the first latch and an output of the second multiplexer is coupled to the enable input of the second latch.

Clause 18: The system of clause 11, wherein the first cell and the second cell form a portion of a scan chain when the scan clock signal is toggled.

Clause 19: The system of clause 11, wherein the scan clock signal is separated from the wordline signal and the weight update signal.

Clause 20: A method of operating a computing device, the method including: storing, in a first cell, a first bit of a first weight value and, in a second cell, a second bit of a second weight value different from the first weight value, the first cell and the second cell being configured such that an output of the first cell is an input of the second cell; receiving a mode signal indicative of one of a functional mode and a scan mode; in response to the mode signal indicating the functional mode, controlling a first multiplexer to provide a wordline signal as a first control signal to the first cell and controlling a second multiplexer to provide a weight update signal as a second control signal to the second cell, and updating at least one of the first bit and the second bit based on the wordline signal and the weight update signal; in response to the mode signal indicating the scan mode, controlling the first multiplexer and the second multiplexer to provide a scan clock signal as the first control signal and the second control signal, respectively, to the first cell and the second cell; and performing a tensor operation using data stored in the computing device while selectively operating the computing device in the functional mode

What is claimed is:

1. An apparatus comprising:
a compute-in-memory (CIM) macro configured to store an array of weight values and perform a vector matrix multiplication (VMM) operation using the array of weight values, wherein the CIM macro comprises:
a column cell comprising a first set of bitcells configured to store a first weight value and a second set of bitcells configured to store a second weight value that is different from the first weight value; and
a first set of wordlines and a second set of wordlines configured to address the first set of bitcells and the second set of bitcells, respectively,
wherein the CIM macro is further configured to perform, in parallel, a write operation to the first set of bitcells and the VMM operation in the second set of bitcells based on a weight select signal.

2. The apparatus according to claim 1, wherein a bitcell of the first set of bitcells shares a bitline with a corresponding bitcell of the second set of bitcells.

3. The apparatus according to claim 1, wherein the column cell further comprises a weight output multiplexer configured to select a first output from a first bitcell of the first set of bitcells or a second output from a second bitcell of the second set of bitcells and provide an output for the VMM operation.

4. The apparatus according to claim 3, wherein the weight output multiplexer is controlled by an inverted weight select signal.

5. The apparatus according to claim 3, wherein the column cell further comprises a first weight select multiplexer controlled by a scan enable signal and configured to select a bitline signal or a scan in signal for the first bitcell.

6. The apparatus according to claim 5, wherein the column cell further comprises a second weight select multiplexer controlled by the scan enable signal and configured to select the bitline signal or the first output from the first bitcell.

7. The apparatus according to claim 1, wherein the first set of bitcells comprises a first latch and the second set of bitcells comprises a second latch.

8. The apparatus according to claim 1, wherein the CIM macro further comprises a weight address decoder configured to generate a first set of wordline signals for the first set of wordlines and a second set of wordline signals for the second set of wordlines based on a weight address signal and the weight select signal.

9. The apparatus according to claim 1, wherein the write operation is performed in the first set of bitcells when the weight select signal is in a low phase, and performed in the second set of bitcells when the weight select signal is in a high phase.

10. The apparatus according to claim 1, wherein the CIM macro is further configured to adjust a setup time of the weight select signal such that the write operation and the VMM operation are performed within a same clock cycle.

11. A method for performing a write operation in a compute-in-memory (CIM) macro comprising a column cell having a first set of bitcells connected to a first set of wordlines and a second set of bitcells connected to a second set of wordlines, the method comprising:
generating, by a weight address decoder, a first set of wordline signals for the first set of wordlines and a second set of wordline signals for the second set of wordlines based on a weight select signal;
providing a weight value to a set of bitlines shared by the first set of bitcells and the second set of bitcells; and
providing an inverted weight select signal to a set of weight output multiplexers, wherein the set of weight output multiplexers is configured to select first outputs of the first set of bitcells or second outputs of the second set of bitcells.

12. The method according to claim 11, further comprising:
generating, by an inverter, the inverted weight select signal based on the weight select signal.

13. The method according to claim 11, further comprising:
controlling a set of first weight select multiplexers with a scan enable signal to output the weight value or a scan in signal to the first set of bitcells.

14. The method according to claim 13, further comprising:
controlling a set of second weight select multiplexers with the scan enable signal to output the weight value or the first outputs of the first set of bitcells to the second set of bitcells.

15. The method according to claim 11, wherein the first set of bitcells comprises a first latch and the second set of bitcells comprises a second latch.

16. The method according to claim 11, wherein the generating of the first wordline signal and the second wordline signal comprises decoding a weight address signal by the weight address decoder.

17. The method according to claim 11, further comprising:
writing the weight value to the first set of bitcells when the weight select signal is in a low phase; and
writing the weight value to the second set of bitcells when the weight select signal is in a high phase.

18. The method according to claim 17, further comprising:
selecting, by the set of weight output multiplexers, the first outputs of the first set of bitcells when the weight select signal is in a high phase; and
selecting, by the set of weight output multiplexers, the second outputs of the second set of bitcells when the weight select signal is in a low phase.

19. The method according to claim 11, further comprising:
outputting the selection of the set of weight output multiplexers for a vector matrix multiplication (VMM) operation performed concurrently in the CIM macro; and
adjusting a setup time of the weight select signal such that the write operation and the VMM operation are performed within a same clock cycle.

20. A system comprising:
a computing device configured to store an array of weight values and perform a vector matrix multiplication (VMM) operation using the array of weight values, the computing device comprising:

a column cell comprising a first set of bitcells config-
ured to store a first weight value and a second set of
bitcells configured to store a second weight value;

a first set of wordlines and a second set of wordlines 5
configured to address the first set of bitcells and the
second set of bitcells, respectively, wherein the computing device is configured to perform
parallel write operations to the first set of bitcells and
the VMM operation in the second set of bitcells 10
based on a weight select signal.

\* \* \* \* \*